(12) United States Patent
Rozbicki et al.

(10) Patent No.: US 12,353,109 B2
(45) Date of Patent: *Jul. 8, 2025

(54) ELECTROCHROMIC CATHODE MATERIALS

(71) Applicant: View, Inc., Milpitas, CA (US)

(72) Inventors: Robert T. Rozbicki, Saratoga, CA (US); Sridhar Karthik Kailasam, Fremont, CA (US)

(73) Assignee: View Operating Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/452,387

(22) Filed: Oct. 26, 2021

(65) Prior Publication Data

US 2022/0066274 A1 Mar. 3, 2022
US 2023/0148443 A9 May 11, 2023

Related U.S. Application Data

(60) Continuation of application No. 16/384,822, filed on Apr. 15, 2019, now Pat. No. 11,187,954, which is a
(Continued)

(51) Int. Cl.
*G02F 1/15* (2019.01)
*C09K 9/00* (2006.01)
(Continued)

(52) U.S. Cl.
CPC .............. *G02F 1/1506* (2013.01); *C09K 9/00* (2013.01); *C23C 14/08* (2013.01); *C23C 14/083* (2013.01);
(Continued)

(58) Field of Classification Search
CPC ........ C09K 9/02; B60R 1/088; H04N 9/3137; H04N 9/22; G02F 1/155; G02F 1/1523;
(Continued)

(56) References Cited

U.S. PATENT DOCUMENTS 3,228,794 A 1/1966 Irving
3,238,918 A 3/1966 Radke et al.
(Continued)

FOREIGN PATENT DOCUMENTS

AU 2014210572 B2 1/2017
AU 2019229399 B2 12/2020
(Continued)

OTHER PUBLICATIONS

Arvizu, Electrochromic W1-x-yTix MoyO3 Thin Films Made by Sputter Deposition: Large Optical Modulation, Good Cycling Durability, and Approximate Color Neutrality, 2017, Chemistry of Materials, 29, pp. 2246-2253 (Year: 2017).*
(Continued)

*Primary Examiner* — Dawayne Pinkney
(74) *Attorney, Agent, or Firm* — Cha & Reiter, LLC

(57) ABSTRACT

Various embodiments herein relate to electrochromic devices and electrochromic device precursors, as well as methods and apparatus for fabricating such electrochromic devices and electrochromic device precursors. In certain embodiments, the electrochromic device or precursor may include one or more particular materials such as a particular electrochromic material and/or a particular counter electrode material. In various implementations, the electrochromic material includes tungsten titanium molybdenum oxide. In these or other implementation, the counter electrode material may include nickel tungsten oxide, nickel tungsten tantalum oxide, nickel tungsten niobium oxide, nickel tungsten tin oxide, or another material.

17 Claims, 9 Drawing Sheets

Related U.S. Application Data continuation-in-part of application No. 16/205,084, filed on Nov. 29, 2018, now Pat. No. 10,996,533, which is a division of application No. 15/441,130, filed on Feb. 23, 2017, now Pat. No. 10,185,197, which is a division of application No. 14/683,541, filed on Apr. 10, 2015, now Pat. No. 9,671,664, which is a continuation of application No. 13/462,725, filed on May 2, 2012, now Pat. No. 9,261,751, which is a continuation-in-part of application No. 12/772,055, filed on Apr. 30, 2010, now Pat. No. 8,300,298, and a continuation-in-part of application No. 12/814,277, filed on Jun. 11, 2010, now Pat. No. 8,764,950, and a continuation-in-part of application No. 12/814,279, filed on Jun. 11, 2010, now Pat. No. 8,764,951, said application No. 16/384,822 is a continuation-in-part of application No. 16/168,587, filed on Oct. 23, 2018, now Pat. No. 10,690,987, which is a continuation of application No. 15/527,194, filed as application No. PCT/US2015/061995 on Nov. 20, 2015, now Pat. No. 10,156,762, said application No. 15/527,194 is a continuation-in-part of application No. 15/214,340, filed on Jul. 19, 2016, now Pat. No. 9,904,138, which is a continuation of application No. 13/610,716, filed on Sep. 11, 2012, now Pat. No. 9,429,809, which is a continuation of application No. 12/645,111, filed on Dec. 22, 2009, now Pat. No. 9,664,974, said application No. 16/384,822 is a continuation-in-part of application No. 15/507,734, filed as application No. PCT/US2015/047891 on Sep. 1, 2015, now Pat. No. 10,345,671, said application No. 16/384,822 is a continuation-in-part of application No. 16/250,738, filed on Jan. 17, 2019, now Pat. No. 10,585,321, which is a continuation of application No. 15/526,969, filed as application No. PCT/US2015/061668 on Nov. 19, 2015, now Pat. No. 10,228,601.

(60) Provisional application No. 62/662,034, filed on Apr. 24, 2018, provisional application No. 62/085,096, filed on Nov. 26, 2014, provisional application No. 62/046,864, filed on Sep. 5, 2014, provisional application No. 62/085,098, filed on Nov. 26, 2014, provisional application No. 62/192,443, filed on Jul. 14, 2015.

(51) Int. Cl.

| | | |
|---|---|---|
| *C23C 14/08* | (2006.01) | |
| *C23C 14/14* | (2006.01) | |
| *C23C 14/34* | (2006.01) | |
| *C23C 14/56* | (2006.01) | |
| *G02F 1/01* | (2006.01) | |
| *G02F 1/1506* | (2019.01) | |
| *G02F 1/1523* | (2019.01) | |
| *G02F 1/155* | (2006.01) | |
| *G02F 1/157* | (2006.01) | |
| *G09G 3/19* | (2006.01) | |
| *G02F 1/1514* | (2019.01) | |

(52) U.S. Cl.
CPC ............ *C23C 14/085* (2013.01); *C23C 14/14* (2013.01); *C23C 14/34* (2013.01); *C23C 14/3464* (2013.01); *C23C 14/568* (2013.01); *G02F 1/1525* (2013.01); *G02F 1/155* (2013.01); *C03C 2217/91* (2013.01); *G02F 2001/15145* (2019.01); *G02F 2001/1555* (2013.01)

(58) Field of Classification Search
CPC .... G02F 1/1525; G02F 1/1521; G02F 1/1533; G02F 1/03; G02F 1/0316; G02F 3/16; G02F 1/163
USPC ................ 359/265–275, 277, 245–247, 242; 345/49, 105, 107; 248/817; 438/929
See application file for complete search history.

(56) References Cited

U.S. PATENT DOCUMENTS

| | | |
|---|---|---|
| 3,294,670 A | 12/1966 | Charschan et al. |
| 3,314,395 A | 4/1967 | Hemmer |
| 3,840,286 A | 10/1974 | Kiss |
| 3,971,624 A | 7/1976 | Bruesch et al. |
| 4,009,935 A | 3/1977 | Faughnan et al. |
| 4,053,209 A | 10/1977 | Hara et al. |
| 4,193,670 A | 3/1980 | Giglia et al. |
| 4,264,150 A | 4/1981 | Yano et al. |
| 4,293,194 A | 10/1981 | Takahashi |
| 4,297,006 A | 10/1981 | Bissar |
| 4,365,870 A | 12/1982 | Morita et al. |
| 4,396,253 A | 8/1983 | Kuwagaki et al. |
| 4,482,216 A | 11/1984 | Hashimoto et al. |
| 4,523,811 A | 6/1985 | Ota |
| 4,561,729 A | 12/1985 | Heinz et al. |
| 4,571,664 A | 2/1986 | Hyland |
| 4,832,463 A | 5/1989 | Goldner et al. |
| 4,851,095 A | 7/1989 | Scobey et al. |
| 4,902,109 A | 2/1990 | Kawate et al. |
| 4,923,289 A | 5/1990 | Demiryont |
| 4,938,571 A | 7/1990 | Cogan et al. |
| 5,019,420 A | 5/1991 | Rauh |
| 5,124,832 A | 6/1992 | Greenberg et al. |
| 5,130,841 A | 7/1992 | Demiryont |
| 5,138,481 A | 8/1992 | Demiryont |
| 5,142,406 A | 8/1992 | Lampert et al. |
| 5,168,003 A | 12/1992 | Proscia |
| 5,209,980 A | 5/1993 | Spindler |
| 5,216,536 A | 6/1993 | Agrawal et al. |
| 5,358,811 A | 10/1994 | Yamazaki et al. |
| 5,657,150 A | 8/1997 | Kallman et al. |
| 5,659,417 A | 8/1997 | Van Dine et al. |
| 5,666,771 A | 9/1997 | Macquart et al. |
| 5,668,663 A | 9/1997 | Varaprasad et al. |
| 5,699,192 A | 12/1997 | Van Dine et al. |
| 5,724,175 A | 3/1998 | Hichwa et al. |
| 5,724,177 A | 3/1998 | Ellis, Jr. et al. |
| 5,754,329 A | 5/1998 | Coleman |
| 5,757,537 A | 5/1998 | Ellis, Jr. et al. |
| 5,814,195 A | 9/1998 | Lehan et al. |
| 5,831,760 A | 11/1998 | Hashimoto et al. |
| 5,847,858 A | 12/1998 | Krings et al. |
| 5,859,723 A | 1/1999 | Jodicke et al. |
| 5,910,854 A | 6/1999 | Varaprasad et al. |
| 6,020,987 A | 2/2000 | Baumann et al. |
| 6,178,034 B1 | 1/2001 | Allemand et al. |
| 6,185,034 B1 | 2/2001 | Nakamura et al. |
| 6,211,995 B1 | 4/2001 | Azens et al. |
| 6,266,177 B1 | 7/2001 | Allemand et al. |
| 6,277,523 B1 | 8/2001 | Giron |
| 6,337,758 B1 | 1/2002 | Beteille et al. |
| 6,515,787 B1 | 2/2003 | Westfall et al. |
| 6,529,308 B2 | 3/2003 | Beteille et al. |
| 6,559,411 B2 | 5/2003 | Borgeson et al. |
| 6,791,737 B2 | 9/2004 | Giron |
| 6,791,738 B2 | 9/2004 | Reynolds et al. |
| 6,822,778 B2 | 11/2004 | Westfall et al. |
| 6,856,444 B2 | 2/2005 | Ingalls et al. |
| 6,859,297 B2 | 2/2005 | Lee et al. |
| 6,919,530 B2 | 7/2005 | Borgeson et al. |
| 6,940,628 B2 | 9/2005 | Giron |
| 7,099,062 B2 | 8/2006 | Azens et al. |
| 7,193,763 B2 | 3/2007 | Beteille et al. |
| 7,230,748 B2 | 6/2007 | Giron et al. |
| 7,265,891 B1 | 9/2007 | Demiryont |
| 7,277,215 B2 | 10/2007 | Greer |

(56) References Cited

U.S. PATENT DOCUMENTS

| | | |
|---|---|---|
| 7,372,610 B2 | 5/2008 | Burdis et al. |
| 7,531,101 B2 | 5/2009 | Beteille |
| 7,564,611 B2 | 7/2009 | Jang et al. |
| 7,593,154 B2 | 9/2009 | Burdis et al. |
| 7,604,717 B2 | 10/2009 | Beteille et al. |
| 7,646,526 B1 | 1/2010 | Wang et al. |
| 7,679,810 B2 | 3/2010 | Fuss et al. |
| 7,704,555 B2 | 4/2010 | Demiryont |
| 7,830,585 B2 | 11/2010 | Widjaja et al. |
| 7,869,114 B2 | 1/2011 | Valentin et al. |
| 7,894,120 B2 | 2/2011 | Valentin et al. |
| 7,961,375 B2 | 6/2011 | Phillips |
| 8,004,744 B2 | 8/2011 | Burdis et al. |
| 8,031,389 B2 | 10/2011 | Wang et al. |
| 8,168,265 B2 | 5/2012 | Kwak et al. |
| 8,228,592 B2 | 7/2012 | Wang et al. |
| 8,300,298 B2 | 10/2012 | Wang et al. |
| 8,432,603 B2 | 4/2013 | Wang et al. |
| 8,582,193 B2 | 11/2013 | Wang et al. |
| 8,638,487 B2 | 1/2014 | Veerasamy |
| 8,687,261 B2 | 4/2014 | Gillaspie et al. |
| 8,749,868 B2 | 6/2014 | Wang et al. |
| 8,758,575 B2 | 6/2014 | Wang et al. |
| 8,764,950 B2 | 7/2014 | Wang et al. |
| 8,764,951 B2 | 7/2014 | Wang et al. |
| 8,773,747 B2 * | 7/2014 | Ferreira .................. C09K 9/02 359/269 |
| 8,995,041 B2 | 3/2015 | Weir et al. |
| 9,007,674 B2 | 4/2015 | Kailasam et al. |
| 9,116,409 B1 | 8/2015 | Sun et al. |
| 9,140,951 B2 | 9/2015 | Wang et al. |
| 9,164,346 B2 | 10/2015 | Wang et al. |
| 9,170,466 B2 | 10/2015 | Marcel et al. |
| 9,261,751 B2 | 2/2016 | Pradhan et al. |
| 9,334,557 B2 | 5/2016 | Neudecker et al. |
| 9,429,809 B2 | 8/2016 | Kailasam et al. |
| 9,454,053 B2 | 9/2016 | Strong et al. |
| 9,477,129 B2 | 10/2016 | Kozlowski et al. |
| 9,581,875 B2 | 2/2017 | Burdis et al. |
| 9,664,974 B2 * | 5/2017 | Kozlowski ............ G02F 1/1525 |
| 9,671,664 B2 | 6/2017 | Pradhan et al. |
| 9,720,298 B2 | 8/2017 | Wang et al. |
| 9,759,975 B2 | 9/2017 | Wang et al. |
| 9,904,138 B2 | 2/2018 | Kailasam et al. |
| 10,054,833 B2 | 8/2018 | Kailasam et al. |
| 10,088,729 B2 | 10/2018 | Wang et al. |
| 10,152,762 B2 | 12/2018 | Wu et al. |
| 10,156,762 B2 | 12/2018 | Gillaspie et al. |
| 10,162,240 B2 | 12/2018 | Rozbicki |
| 10,185,197 B2 | 1/2019 | Pradhan et al. |
| 10,228,601 B2 | 3/2019 | Gillaspie et al. |
| 10,254,615 B2 | 4/2019 | Kailasam et al. |
| 10,261,381 B2 | 4/2019 | Pradhan et al. |
| 10,288,969 B2 | 5/2019 | Kailasam et al. |
| 10,345,671 B2 | 7/2019 | Gillaspie et al. |
| 10,585,321 B2 | 3/2020 | Gillaspie et al. |
| 10,591,765 B2 | 3/2020 | Nakano et al. |
| 10,591,795 B2 | 3/2020 | Gillaspie et al. |
| 10,591,797 B2 | 3/2020 | Wang et al. |
| 10,599,001 B2 | 3/2020 | Wang et al. |
| 10,663,830 B2 | 5/2020 | Pradhan et al. |
| 10,684,523 B2 | 6/2020 | Gillaspie et al. |
| 10,690,987 B2 | 6/2020 | Gillaspie et al. |
| 10,852,613 B2 | 12/2020 | Pradhan et al. |
| 10,877,348 B2 | 12/2020 | Kang et al. |
| 10,996,533 B2 | 5/2021 | Pradhan et al. |
| 11,187,954 B2 | 11/2021 | Rozbicki et al. |
| 11,189,954 B2 | 11/2021 | Kwon et al. |
| 11,327,382 B2 | 5/2022 | Gillaspie et al. |
| 11,370,699 B2 | 6/2022 | Gillaspie et al. |
| 11,409,177 B2 | 8/2022 | Gillaspie et al. |
| 11,422,426 B2 | 8/2022 | Gillaspie et al. |
| 11,440,838 B2 | 9/2022 | Pradhan et al. |
| 11,525,181 B2 | 12/2022 | Wang et al. |
| 11,592,722 B2 | 2/2023 | Wang et al. |
| 11,635,665 B2 | 4/2023 | Pradhan et al. |
| 11,891,327 B2 | 2/2024 | Pradhan et al. |
| 11,898,233 B2 | 2/2024 | Wang et al. |
| 11,947,232 B2 | 4/2024 | Kailasam et al. |
| 11,960,188 B2 | 4/2024 | Gillaspie et al. |
| 11,966,140 B2 | 4/2024 | Gillaspie et al. |
| 12,043,890 B2 | 7/2024 | Wang et al. |
| 12,209,048 B2 | 1/2025 | Gillaspie et al. |
| 2002/0015214 A1 | 2/2002 | Nishikitani et al. |
| 2002/0041443 A1 | 4/2002 | Varaprasad et al. |
| 2003/0010957 A1 | 1/2003 | Haering et al. |
| 2003/0031928 A1 | 2/2003 | Beteille et al. |
| 2003/0156313 A1 | 8/2003 | Serra et al. |
| 2003/0218941 A1 | 11/2003 | Terao et al. |
| 2004/0021921 A1 | 2/2004 | Richardson |
| 2004/0051083 A1 | 3/2004 | McDonald et al. |
| 2004/0150867 A1 | 8/2004 | Lee et al. |
| 2005/0002081 A1 | 1/2005 | Beteille et al. |
| 2005/0007645 A1 | 1/2005 | Tonar et al. |
| 2005/0147825 A1 | 7/2005 | Arnaud et al. |
| 2005/0259310 A1 | 11/2005 | Giri et al. |
| 2006/0105103 A1 | 5/2006 | Hartig |
| 2006/0209383 A1 | 9/2006 | Burdis et al. |
| 2007/0008603 A1 | 1/2007 | Sotzing et al. |
| 2007/0008605 A1 | 1/2007 | Garg et al. |
| 2007/0097481 A1 | 5/2007 | Burdis et al. |
| 2007/0097483 A1 | 5/2007 | Park |
| 2007/0292606 A1 | 12/2007 | Demiryont |
| 2008/0213477 A1 | 9/2008 | Zindel et al. |
| 2008/0304130 A1 | 12/2008 | Nguyen |
| 2008/0304131 A1 | 12/2008 | Nguyen |
| 2009/0057137 A1 | 3/2009 | Pitts et al. |
| 2009/0285978 A1 | 11/2009 | Burdis et al. |
| 2009/0304912 A1 | 12/2009 | Kwak et al. |
| 2009/0323156 A1 | 12/2009 | Shin et al. |
| 2009/0323158 A1 | 12/2009 | Wang et al. |
| 2010/0007937 A1 | 1/2010 | Widjaja et al. |
| 2010/0079844 A1 | 4/2010 | Kurman et al. |
| 2010/0103496 A1 | 4/2010 | Schwendeman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2011/0013254 A1 | 1/2011 | Widjaja et al. |
| 2011/0043885 A1 | 2/2011 | Lamine et al. |
| 2011/0043886 A1 | 2/2011 | Jeon et al. |
| 2011/0051220 A1 | 3/2011 | Lee |
| 2011/0051221 A1 | 3/2011 | Veerasamy |
| 2011/0136019 A1 | 6/2011 | Amiruddin et al. |
| 2011/0151283 A1 | 6/2011 | Gillaspie et al. |
| 2011/0211247 A1 | 9/2011 | Kozlowski et al. |
| 2011/0249314 A1 * | 10/2011 | Wang ...................... G02F 1/153 359/265 |
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0200908 A1 | 8/2012 | Bergh et al. |
| 2012/0218621 A1 | 8/2012 | Kwak et al. |
| 2012/0266945 A1 | 10/2012 | Letocart et al. |
| 2012/0275008 A1 | 11/2012 | Pradhan et al. |
| 2012/0276734 A1 | 11/2012 | Van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0201545 A1 | 8/2013 | Frey et al. |
| 2013/0242369 A1 | 9/2013 | Fukushima et al. |
| 2013/0270105 A1 | 10/2013 | Wang et al. |
| 2013/0286459 A1 | 10/2013 | Burdis et al. |
| 2014/0022621 A1 | 1/2014 | Kailasam et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |

(56) References Cited

U.S. PATENT DOCUMENTS

| | | |
|---|---|---|
| 2014/0205746 A1 | 7/2014 | Choi et al. |
| 2014/0205748 A1 | 7/2014 | Choi et al. |
| 2014/0313561 A1 | 10/2014 | Wang et al. |
| 2014/0329006 A1 | 11/2014 | Bhatnagar et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0299933 A1 | 10/2017 | Kailasam et al. |
| 2017/0329200 A1 | 11/2017 | Wang et al. |
| 2017/0357135 A1 | 12/2017 | Gillaspie et al. |
| 2017/0371221 A1 | 12/2017 | Gillaspie et al. |
| 2018/0052374 A1 | 2/2018 | Wang et al. |
| 2018/0173071 A1 | 6/2018 | Mathew et al. |
| 2018/0203320 A1 | 7/2018 | Kailasam et al. |
| 2018/0231858 A1 | 8/2018 | Kailasam et al. |
| 2019/0064623 A1 | 2/2019 | Gillaspie et al. |
| 2019/0107763 A1 | 4/2019 | Gillaspie et al. |
| 2019/0113819 A1 | 4/2019 | Pradhan et al. |
| 2019/0171078 A1 | 6/2019 | Pradhan et al. |
| 2019/0171079 A1 | 6/2019 | Gillaspie et al. |
| 2019/0187531 A1 | 6/2019 | Pradhan et al. |
| 2019/0302561 A1 | 10/2019 | Rozbicki et al. |
| 2020/0050072 A1 | 2/2020 | Kozlowski et al. |
| 2020/0096830 A1 | 3/2020 | Sarrach et al. |
| 2020/0124933 A1 | 4/2020 | Kozlowski et al. |
| 2020/0133088 A1 | 4/2020 | Gillaspie et al. |
| 2020/0166817 A1 | 5/2020 | Wang et al. |
| 2020/0174332 A1 | 6/2020 | Gillaspie et al. |
| 2020/0174335 A1 | 6/2020 | Wang et al. |
| 2020/0257178 A1 | 8/2020 | Pradhan et al. |
| 2020/0272014 A1 | 8/2020 | Gillaspie et al. |
| 2020/0278588 A1 | 9/2020 | Gillaspie et al. |
| 2021/0055618 A1 | 2/2021 | Pradhan et al. |
| 2021/0191215 A1 | 6/2021 | Pradhan et al. |
| 2021/0247654 A1 | 8/2021 | Mogensen et al. |
| 2021/0269706 A1 | 9/2021 | Meshcheryakov et al. |
| 2021/0373401 A1 | 12/2021 | Wang et al. |
| 2022/0055943 A1 | 2/2022 | Kozlowski et al. |
| 2022/0204398 A1 | 6/2022 | Gillaspie et al. |
| 2022/0260885 A1 | 8/2022 | Gillaspie et al. |
| 2022/0308416 A1 | 9/2022 | Rozbicki et al. |
| 2022/0334442 A1 | 10/2022 | Gillaspie et al. |
| 2022/0350217 A1 | 11/2022 | Gillaspie et al. |
| 2022/0388900 A1 | 12/2022 | Pradhan et al. |
| 2023/0008603 A1 | 1/2023 | Gillaspie et al. |
| 2023/0074776 A1 | 3/2023 | Wang et al. |
| 2023/0099188 A1 | 3/2023 | Kozlowski et al. |
| 2023/0144179 A1 | 5/2023 | Wang et al. |
| 2023/0205032 A1 | 6/2023 | Pradhan et al. |
| 2023/0296953 A1 | 9/2023 | Rozbicki et al. |
| 2024/0231168 A1 | 7/2024 | Gillaspie et al. |
| 2024/0263294 A1 | 8/2024 | Wang et al. |
| 2024/0264504 A1 | 8/2024 | Gillaspie et al. |

FOREIGN PATENT DOCUMENTS

| | | |
|---|---|---|
| AU | 2015353823 B2 | 2/2021 |
| CN | 1207182 A | 2/1999 |
| CN | 1245540 A | 2/2000 |
| CN | 1350048 A | 5/2002 |
| CN | 1476548 A | 2/2004 |
| CN | 1492274 A | 4/2004 |
| CN | 1541420 A | 10/2004 |
| CN | 1688923 A | 10/2005 |
| CN | 1710481 A | 12/2005 |
| CN | 1738885 A | 2/2006 |
| CN | 1739057 A | 2/2006 |
| CN | 1928685 A | 3/2007 |
| CN | 101188886 A | 5/2008 |
| CN | 101310217 A | 11/2008 |
| CN | 101322069 A | 12/2008 |
| CN | 100462830 C | 2/2009 |
| CN | 101377599 A | 3/2009 |
| CN | 101419374 A | 4/2009 |
| CN | 101634790 A | 1/2010 |
| CN | 101833932 A | 9/2010 |
| CN | 101930142 A | 12/2010 |
| CN | 102099736 A | 6/2011 |
| CN | 102230172 A | 11/2011 |
| CN | 102376379 A | 3/2012 |
| CN | 102388340 A | 3/2012 |
| CN | 102388341 A | 3/2012 |
| CN | 102414610 A | 4/2012 |
| CN | 102455560 A | 5/2012 |
| CN | 102478739 A | 5/2012 |
| CN | 102540612 A | 7/2012 |
| CN | 102576818 A | 7/2012 |
| CN | 102666778 A | 9/2012 |
| CN | 102934009 A | 2/2013 |
| CN | 102998870 A | 3/2013 |
| CN | 103080825 A | 5/2013 |
| CN | 103135306 A | 6/2013 |
| CN | 103168269 A | 6/2013 |
| CN | 103339560 A | 10/2013 |
| CN | 103838050 A | 6/2014 |
| CN | 103930954 A | 7/2014 |
| CN | 104040417 A | 9/2014 |
| CN | 104321497 A | 1/2015 |
| CN | 104364707 A | 2/2015 |
| CN | 104730794 A | 6/2015 |
| CN | 104730796 A | 6/2015 |
| CN | 106773436 A | 5/2017 |
| CN | 106796378 A | 5/2017 |
| CN | 107111197 A | 8/2017 |
| CN | 206503500 U | 9/2017 |
| DE | 19816352 A1 | 12/1999 |
| EP | 0497616 A2 | 8/1992 |
| EP | 0497616 B1 | 7/1999 |
| EP | 1918412 A1 | 5/2008 |
| JP | S48345547 A | 5/1973 |
| JP | S5050892 A | 5/1975 |
| JP | S55124440 U | 9/1980 |
| JP | S5781242 A | 5/1982 |
| JP | S5833223 A | 2/1983 |
| JP | S58139128 A | 8/1983 |
| JP | S58163921 A | 9/1983 |
| JP | S5940625 A | 3/1984 |
| JP | S6066238 A | 4/1985 |
| JP | S6078423 A | 5/1985 |
| JP | S6078424 A | 5/1985 |
| JP | S60202429 A | 10/1985 |
| JP | H03500096 A | 1/1991 |
| JP | H04211227 A | 8/1992 |
| JP | H05182512 A | 7/1993 |
| JP | H09152634 A | 6/1997 |
| JP | H10501847 A | 2/1998 |
| JP | H1193827 A | 4/1999 |
| JP | 2004205628 A | 7/2004 |
| JP | 2004309926 A | 11/2004 |
| JP | 2005091788 A | 4/2005 |
| JP | 2006235632 A | 9/2006 |
| JP | 2007108750 A | 4/2007 |
| JP | 2008026605 A | 2/2008 |
| JP | 2008102273 A | 5/2008 |
| JP | 2008197679 A | 8/2008 |
| JP | 2008216744 A | 9/2008 |
| JP | 2009009145 A | 1/2009 |
| JP | 2010509720 A | 3/2010 |
| JP | 2012078774 A | 4/2012 |
| JP | 2012523018 A | 9/2012 |
| JP | 2012523019 A | 9/2012 |
| JP | 2013525860 A | 6/2013 |
| JP | 2014052510 A | 3/2014 |
| JP | 2015128055 A | 7/2015 |
| JP | 5868726 B2 | 2/2016 |
| JP | 2016062696 A | 4/2016 |

(56) References Cited

FOREIGN PATENT DOCUMENTS

| | | |
|---|---|---|
| JP | 5955414 b2 | 7/2016 |
| JP | 2017538965 A | 12/2017 |
| KR | 20060092362 A | 8/2006 |
| KR | 100824302 B1 | 4/2008 |
| KR | 20080051280 A | 6/2008 |
| KR | 20110100457 A | 9/2011 |
| KR | 20130112693 A | 10/2013 |
| KR | 20140068026 A | 6/2014 |
| KR | 101535100 B1 | 7/2015 |
| KR | 20170112183 A | 10/2017 |
| KR | 102010733 B1 | 8/2019 |
| KR | 102010755 B1 | 8/2019 |
| RU | 2117972 C1 | 8/1998 |
| TW | 490391 B | 6/2002 |
| TW | 200417280 A | 9/2004 |
| TW | M338359 U | 8/2008 |
| TW | 200839402 A | 10/2008 |
| TW | 201003270 A | 1/2010 |
| TW | 201211664 A | 3/2012 |
| TW | 201222119 A | 6/2012 |
| TW | 201435464 A | 9/2014 |
| TW | 201439371 A | 10/2014 |
| WO | WO-9519588 A2 | 7/1995 |
| WO | WO-9847613 A1 | 10/1998 |
| WO | WO-0201287 A1 | 1/2002 |
| WO | WO-03001290 A1 | 1/2003 |
| WO | WO-03017387 A1 | 2/2003 |
| WO | WO-2004087985 A2 | 10/2004 |
| WO | WO-2008017777 A2 | 2/2008 |
| WO | WO-2008055824 A1 | 5/2008 |
| WO | WO-2008154517 A2 | 12/2008 |
| WO | WO-2009000547 A2 | 12/2008 |
| WO | WO-2009029111 A1 | 3/2009 |
| WO | WO-2009108184 A1 | 9/2009 |
| WO | WO-2009115424 A1 | 9/2009 |
| WO | WO-2009148861 A2 | 12/2009 |
| WO | WO-2010120537 A2 | 10/2010 |
| WO | WO-2010147494 A1 | 12/2010 |
| WO | WO-2011137080 A1 | 11/2011 |
| WO | WO-2011137104 A1 | 11/2011 |
| WO | WO-2012138281 A1 | 10/2012 |
| WO | WO-2013054367 A1 | 4/2013 |
| WO | WO-2013074702 A1 | 5/2013 |
| WO | WO-2014025876 A2 | 2/2014 |
| WO | WO-2014025900 A1 | 2/2014 |
| WO | WO-2014113795 A1 | 7/2014 |
| WO | WO-2014113796 A1 | 7/2014 |
| WO | WO-2014113801 A1 | 7/2014 |
| WO | WO-2014201287 A1 | 12/2014 |
| WO | WO-2015168166 A1 | 11/2015 |
| WO | WO-2016039157 A1 | 3/2016 |
| WO | WO-2017011272 A1 | 1/2017 |
| WO | WO-2019208364 A1 | 10/2019 |
| WO | WO-2020247831 A1 | 12/2020 |

OTHER PUBLICATIONS

Arvizu, M.A. et al., "Electrochromic W1-x-yTixMoyO3 thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: http://pubs.acs.org DOI: 10.1021/acs.chemmater.6b05198.
Australian Examination Report dated Apr. 19, 2016 in AU Application No. 2014210572.
Australian Examination Report dated Dec. 17, 2018 in AU Application No. 2017202249.
Australian Examination Report dated Jan. 6, 2014 in AU Application No. 2011245431.
Australian Examination Report dated Jun. 7, 2018 in AU Application No. 2017202249.
Australian Examination Report dated Mar. 18, 2019 in AU Application No. 2017202249.
Australian Examination Report dated May 15, 2020 in AU Application No. 2019229399.
Australian Examination Report dated Sep. 17, 2020 in AU Application No. 2019229399.
Australian Office Action dated Dec. 8, 2020 in AU Application No. 2016294343.
Australian Office Action dated Feb. 19, 2021 in AU Application No. 2016294343.
Australian Office Action dated Oct. 28, 2020 in AU Application No. 2015353823.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.
Brazilian Office Action dated Sep. 24, 2019 in BR Application No. 1120120278916.
Burdis, et al., "Technology Advancements to Lower Costs of Electrochromic Window Glazings", SAGE Electronics, Inc., DE-PS26-06NT42764, Final Report, Apr. 2, 2010.
CA Office Action dated Nov. 10, 2021, in Application No. CA2968832.
Chinese Allowance with Search Report dated May 8, 2021 in CN Application No. 201610832436.6—No Translation.
Chinese Decision of Rejection dated Jun. 2, 2021 in CN Application No. 201580072326.8.
Chinese Notice of Allowance with Search Report dated Mar. 17, 2021 in CN Application No. 201680047325.2.
Chinese Office Action dated Apr. 1, 2020 in CN Application No. CN201610832436.6.
Chinese Office Action dated Apr. 7, 2021 in CN Application No. 201810154035.9.
Chinese Office Action dated Aug. 24, 2020 in CN Application No. 201810154035.9.
Chinese Office Action dated Dec. 21, 2020 in CN Application No. 201680047325.2.
Chinese Office Action dated Dec. 26, 2018 in CN Application No. 201580032579.2.
Chinese Office Action dated Dec. 27, 2018 in CN Application No. 201580029451.0.
Chinese Office Action dated Dec. 3, 2020 in CN Application No. CN201610832436.6.
Chinese Office Action dated Feb. 10, 2021 in CN Application No. 201580072326.8.
Chinese Office Action dated Feb. 19, 2021 in CN Application No. 201580069923.5.
Chinese Office Action dated Jan. 2, 2020 in CN Application No. 201580069923.5.
Chinese Office Action dated Jan. 2, 2020 in CN Application No. 201580072326.8.
Chinese Office Action dated Jan. 22, 2020 in CN Application No. 201580053092.2.
Chinese Office Action dated Jul. 17, 2019 in CN Application No. 201580029451.0.
Chinese Office Action dated Jul. 2, 2019 in CN Application No. 201580032579.2.
Chinese Office Action dated Jun. 2, 2020 in CN Application No. 201680047325.2.
Chinese Office Action dated Mar. 17, 2021 in CN Application No. 201680047325.2.
Chinese Office Action dated Mar. 5, 2020 in CN Application No. 201580029451.0.
Chinese Office Action dated Mar. 5, 2020 in CN Application No. 201580032579.2.
Chinese Office Action dated Nov. 4, 2020 in CN Application No. 201580029451.0.
Chinese Office Action dated Sep. 27, 2020 in CN Application No. 201580069923.5.
Chinese Office Action dated Sep. 27, 2020 in CN Application No. 201580072326.8.
Chinese Office Action dated Aug. 28, 2018 in CN Application No. CN201610412630.9.
Chinese Office Action dated Aug. 31, 2015 in CN Application No. CN201180027892.9.

(56) References Cited

OTHER PUBLICATIONS

Chinese Office Action dated Jan. 8, 2015 in CN Application No. CN201180027892.9.
Chinese Office Action dated Jun. 15, 2017 in CN Application No. 201380031908.2.
Chinese Office Action dated Mar. 22, 2019 in CN Application No. CN201610412630.9.
Chinese Office Action dated Mar. 31, 2016 in CN Application No. CN201180027892.9.
Chinese Office Action dated Sep. 28, 2016 in CN Application No. 201380031908.2.
Chinese Reexamination dated May 21, 2021 in CN Application No. 201580032579.2.
CN Office Action dated Aug. 3, 2021, in CN Application No. 201810154035.9.
CN Office Action dated Aug. 30, 2021, in CN Application No. 201580032579.2 with English translation.
EP Summons to Attend Oral Proceedings dated Apr. 28, 2020 in EP Application No. 13785049.1.
European Extended Search Report dated Aug. 2, 2021 in EP Application No. 3872563.
European Office Action dated Feb. 10, 2017 in EP Application No. 11775488.7.
European Office Action dated Mar. 12, 2020 in EP Application No. 15862207.6.
European Office Action dated Mar. 13, 2020 in EP Application No. 15863517.7.
European Office Action dated May 11, 2021 in EP Application No. 20153706.5.
European Office Action dated May 3, 2021 in EP Application No. 16824923.3.
European Office Action dated May 7, 2019 in EP Application No. 13785049.1.
European Office Action dated Oct. 10, 2019 in EP Application No. 15785891.1.
European Office Action dated Oct. 16, 2017 in EP Application No. 11775488.7.
European Office Action dated Oct. 23, 2018 in EP Application No. 15785437.3.
European Search Report dated May 13, 2014 in EP Application No. 11775488.7.
European Search Report (Extended) dated Apr. 17, 2020 in EP Application No. 20156430.9.
European Search Report (Extended) dated Apr. 6, 2016 in EP Application No. 13785049.1.
European Search Report (Extended) dated Dec. 1, 2017 in EP Application No. 15785891.1.
European Search Report (Extended) dated Dec. 14, 2018 in EP Application No. 16824923.3.
European Search Report (Extended) dated Jan. 29, 2018 in EP Application No. 15837472.8.
European Search Report (Extended) dated Mar. 30, 2020 in EP Application No. 20153706.5.
European Search Report (Extended) dated May 2, 2018 in EP Application No. 15862207.6.
European Search Report (Extended) dated May 24, 2018 in EP Application No. 15863517.7.
European Search Report (Extended) dated May 26, 2020 in EP Application No. 19206961.5.
European Search Report (Extended) dated Nov. 28, 2017 in EP Application No. 15785437.3.
European Search Report (Partial Supplementary) dated Jan. 8, 2016 in EP Application No. 13785049.1.
Extended European Search Report dated Aug. 2, 2021 for EP Application No. 21169812.1.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
Hersh, H.N., "Mechanism of Electrochromism in WO3," Applied Physics Letters, vol. 27, No. 12, Dec. 15, 1975, pp. 646-648.
Hutchins, M.G. et al, "The electrochromic behavior of tin-nickel oxide," Solar Energy Materials and Solar Cells, vol. 54, 1998, pp. 75-84.
IN Examination Report dated Oct. 12, 2021, in application No. IN201838043541.
IN First Examination report dated on Aug. 26, 2021, in application No. IN201717044876.
Indian Hearing Notice dated Oct. 20, 2020 in IN Application No. 3663/KOLNP/2012.
Indian Office Action dated Jun. 19, 2018 in IN Application No. 3663/KOLNP/2012.
Indian Office Action dated Jun. 30, 2021 in IN Application No. 201737018863.
International Preliminary Report on Patentability dated Dec. 16, 2021, in application No. PCT/US2020/036440.
International Preliminary Report on Patentability dated Jan. 25, 2018 in PCT/US16/41375.
International Preliminary Report on Patentability dated Jun. 8, 2017 in PCT/US15/61668.
International Preliminary Report on Patentability dated Jun. 8, 2017 in PCT/US15/61995.
International Preliminary Report on Patentability dated Mar. 16, 2017 in PCT/US15/47891.
International Preliminary Report on Patentability dated Nov. 13, 2014 in PCT/US2013/038481.
International Preliminary Report on Patentability, dated Nov. 15, 2012 in PCT/US2011/033822.
International Preliminary Report on Patentability dated Nov. 15, 2012 in PCT/US2011/033906.
International Preliminary Report on Patentability dated Nov. 17, 2016 in PCT/US15/028899.
International Preliminary Report on Patentability dated Nov. 17, 2016 in PCT/US15/28067.
International Preliminary Report on Patentability dated Nov. 5, 2020 in PCT/US19/027931.
International Preliminary Report on Patentability dated Oct. 4, 2018 in PCT/US17/24120.
International Search Report and Written Opinion, dated Aug. 14, 2013 in PCT/US2013/038481.
International Search Report and Written Opinion dated Aug. 26, 2015 in PCT/US15/28067.
International Search Report and Written Opinion dated Feb. 29, 2016 in PCT/US15/61668.
International Search Report and Written Opinion dated Jul. 16, 2015 in PCT/US15/028899.
International Search Report and Written Opinion, dated Jul. 7, 2011, issued in PCT/US2011/033822.
International Search Report and Written Opinion dated Jul. 9, 2019 in PCT/US19/027931.
International Search Report and Written Opinion dated Mar. 18, 2016 in PCT/US15/47891.
International Search Report and Written Opinion dated Mar. 7, 2016 in PCT/US15/61995.
International Search Report and Written Opinion dated Oct. 18, 2016 in PCT/US16/41375.
International Search Report and Written Opinion, dated Sep. 14, 2011, issued in PCT/US2011/033906.
International Search Report and Written Opinion dated Sep. 21, 2020 in PCT/US2020/036440.
International Search Report and Written Opinion (ISA/KR) dated Jul. 7, 2017 in PCT/US17/24120.
Japanese Decision to Grant dated Mar. 16, 2021 in JP Application No. 2020-067107.
Japanese Office Action dated Apr. 21, 2021 in JP Application No. 2017-527761.
Japanese Office Action dated Mar. 5, 2019 in JP Application No. JP2018-028971.
Japanese Office Action dated May 7, 2020 in JP Application No. 2017-564044.
Japanese Office Action dated Sep. 23, 2020 in JP Application No. 2017-527761.

(56) References Cited

OTHER PUBLICATIONS

Japanese Office Action dated Sep. 24, 2019 in JP Application No. 2017-527761.
Japanese Office Action dated Jan. 6, 2015 in JP Application No. JP2013-508130.
Japanese Office Action dated Mar. 8, 2016 in JP Application No. JP2015-118553.
Japanese Office Action dated Nov. 21, 2017 in JP Application No. JP2016-215029.
JP Office Action dated Aug. 3, 2021, in Application No. JP2017527761.
JP Office Action dated Dec. 7, 2021, in Application No. JP20200207808.
Kondrachova, L. et al., "Cathodic Electrodeposition of Mixed Molybdenum Tungsten Oxides From Peroxo-polymolybdotungstate Solutions", Langmuir 2006, vol. 22, No. 25, Aug. 31, 2006, pp. 10490-10498.
Korean Notice of Allowance & Search Reported dated May 26, 2021 in KR Application No. 10-2021-7006423.
Korean Office Action dated Sep. 28, 2020 in KR Application No. 10-2019-7024032.
Korean Office Action dated Feb. 28, 2017 in KR Application No. 10-2012-7031407.
Korean Office Action dated Feb. 8, 2018 in KR Application No. 10-2018-7002491.
Korean Office Action dated Mar. 24, 2021 in KR Application No. 10-2021-7006423.
Korean Office Action dated Oct. 30, 2018 in KR Application No. 10-2018-7030647.
KR Office Action dated Nov. 25, 2021, in Application No. KR1020177017239 with English translation.
Mexican Office Action dated Jun. 6, 2013 in MX Application No. MX/a/2012/012573.
Pennisi, A. et al., "Electrochromic Properties of Tungsten-molybdenum Oxide Electrodes", Solar Energy Materials and Solar Cells, vol. 28, No. 3, Dec. 1, 1992, pp. 233-247, XP000328508.
Preliminary Amendment filed Aug. 3, 2018 in U.S. Appl. No. 15/916,142.
Preliminary Amendment filed Feb. 27, 2020 for U.S. Appl. No. 16/785,547.
Preliminary Amendment filed Jul. 13, 2020 for U.S. Appl. No. 15/931,359.
Preliminary Amendment filed Jul. 29, 2020 for U.S. Appl. No. 16/879,255.
Preliminary Amendment filed Jul. 6, 2020 for U.S. Appl. No. 16/859,856.
Russian Office Action dated Apr. 11, 2019 in RU Application No. 2017120233.
Russian Office Action dated Feb. 25, 2015 in RU Application No. 2012151304.
Russian Office Action dated Mar. 12, 2019 in RU Application No. 2015148673.
Russian Search Report dated Nov. 1, 2019 in RU Application No. 2018105193.
Singapore Examination Report dated Nov. 5, 2013 in SG Application No. 201208018-0.
Taiwanese Allowance with Search Report dated Mar. 12, 2021 in TW Application No. 109123760—No Translation.
Taiwanese Decision of Rejection dated Jul. 7, 2020 in TW Application No. 104139219.
Taiwanese Decision of Rejection dated Nov. 29, 2016 in TW Application No. 104144317.
Taiwanese Decision of Rejection dated Feb. 24, 2017 in TW Application No. 100115201.
Taiwanese Office Action dated Aug. 26, 2019 in TW Application No. 108106923.
Taiwanese Office Action dated Dec. 7, 2018 in TW Application No. 106128807.
Taiwanese Office Action dated Feb. 18, 2020 in TW Application No. 105122100.
Taiwanese Office Action dated Mar. 12, 2021 in TW Application No. 108135570.
Taiwanese Office Action dated Mar. 25, 2019 in TW Application No. 106128807.
Taiwanese Office Action dated Oct. 12, 2018 in TW Application No. 104144317.
Taiwanese Office Action dated Oct. 15, 2020 in TW Application No. 105122100.
Taiwanese Office Action dated Sep. 20, 2019 in TW Application No. 104139219, with summary translation.
Taiwanese Office Action dated Jul. 22, 2015 in TW Application No. 100115190.
Taiwanese Office Action dated Jun. 1, 2016 in TW Application No. 104144317.
Taiwanese Office Action dated May 26, 2016 in TW Application No. 100115201.
Taiwanese Search Report dated Oct. 11, 2018 in TW Application No. 106118525.
TW Office Action dated Nov. 24, 2021 in Application No. TW110121767 with English translation.
U.S. Final Office Action dated Dec. 14, 2020 in U.S. Appl. No. 15/916,142.
U.S. Final Office Action dated Jan. 31, 2020 in U.S. Appl. No. 15/916,142.
U.S. Final Office Action dated Jan. 6, 2020 in U.S. Appl. No. 16/088,024.
U.S. Final Office Action dated Jul. 23, 2015 in U.S. Appl. No. 13/462,725.
U.S. Final Office Action dated Jun. 27, 2013 in U.S. Appl. No. 12/814,277.
U.S. Final Office Action dated Jun. 27, 2013 in U.S. Appl. No. 12/814,279.
U.S. Non-Final Office action dated Oct. 4, 2021, in U.S. Appl. No. 16/721,655.
U.S. Non-Final Office action dated Oct. 4, 2021, in U.S. Appl. No. 16/859,856.
U.S. Non-Final Office Action dated Oct. 15, 2021 in U.S. Appl. No. 15/931,359.
U.S. Notice of Allowability (corrected) dated Jan. 8, 2020 in U.S. Appl. No. 16/250,738.
U.S. Notice of Allowance (corrected) dated Feb. 27, 2017 in U.S. Appl. No. 14/683,541.
U.S. Notice of Allowance (Corrected) dated Nov. 28, 2018 for U.S. Appl. No. 15/526,969.
U.S. Notice of Allowance dated Apr. 12, 2017 in U.S. Appl. No. 15/004,794.
U.S. Notice of Allowance dated Aug. 19, 2020 U.S. Appl. No. 16/088,024.
U.S. Notice of Allowance dated Aug. 4, 2015 in U.S. Appl. No. 14/209,993.
U.S. Notice of Allowance dated Aug. 9, 2017 in U.S. Appl. No. 15/004,794.
U.S. Notice of Allowance dated Dec. 10, 2020 in U.S. Appl. No. 16/205,084.
U.S. Notice of Allowance dated Dec. 19, 2019 in U.S. Appl. No. 15/612,928.
U.S. Notice of Allowance dated Dec. 24, 2021 in U.S. Appl. No. 16/785,547.
U.S. Notice of Allowance dated Dec. 3, 2019 in U.S. Appl. No. 15/795,843.
U.S. Notice of Allowance dated Dec. 4, 2017 for U.S. Appl. No. 15/587,114.
U.S. Notice of Allowance dated Feb. 12, 2020 in U.S. Appl. No. 16/168,587.
U.S. Notice of Allowance dated Feb. 14, 2014 for U.S. Appl. No. 13/627,798.
U.S. Notice of Allowance dated Feb. 5, 2020 in U.S. Appl. No. 16/204,540.
U.S. Notice of Allowance dated Jan. 11, 2017 in U.S. Appl. No. 14/841,511.
U.S. Notice of Allowance dated Jan. 21, 2014 in U.S. Appl. No. 13/610,684.
U.S. Notice of Allowance dated Jan. 22, 2015 in U.S. Appl. No. 14/052,455.

(56) References Cited

OTHER PUBLICATIONS

U.S. Notice of Allowance dated Jan. 23, 2020 for U.S. Appl. No. 16/284,876.
U.S. Notice of Allowance dated Jan. 27, 2017 in U.S. Appl. No. 14/683,541.
U.S. Notice of Allowance dated Jan. 3, 2019 for U.S. Appl. No. 15/340,853.
U.S. Notice of Allowance dated Jul. 10, 2013 in U.S. Appl. No. 12/772,075.
U.S. Notice of Allowance dated Jul. 17, 2019 in U.S. Appl. No. 15/795,843.
U.S. Notice of Allowance dated Jul. 22, 2021 in U.S. Appl. No. 16/384,822.
U.S. Notice of Allowance dated Jul. 26, 2019 in U.S. Appl. No. 15/612,928.
U.S. Notice of Allowance dated Mar. 11, 2019 for U.S. Appl. No. 15/507,734.
U.S. Notice of Allowance dated Mar. 12, 2014 in U.S. Appl. No. 12/814,277.
U.S. Notice of Allowance dated Mar. 17, 2014 in U.S. Appl. No. 12/814,279.
U.S. Notice of Allowance dated Mar. 26, 2018 for U.S. Appl. No. 15/587,114.
U.S. Notice of Allowance dated May 11, 2015 in U.S. Appl. No. 14/052,455.
U.S. Notice of Allowance dated May 22, 2018 in U.S. Appl. No. 15/457,609.
U.S. Notice of Allowance dated May 28, 2015 in U.S. Appl. No. 14/209,993.
U.S. Notice of Allowance dated May 31, 2012 issued in U.S. Appl. No. 13/166,537.
U.S. Notice of Allowance dated Nov. 21, 2019 for U.S. Appl. No. 15/204,868.
U.S. Notice of Allowance dated Nov. 25, 2015 in U.S. Appl. No. 13/462,725.
U.S. Notice of Allowance dated Nov. 28, 2018 for U.S. Appl. No. 15/953,327.
U.S. Notice of Allowance dated Nov. 6, 2019 in U.S. Appl. No. 16/250,738.
U.S. Notice of Allowance dated Oct. 18, 2018 for U.S. Appl. No. 15/526,969.
U.S. Notice of Allowance dated Oct. 31, 2018 in U.S. Appl. No. 15/441,130.
U.S. Notice of Allowance, dated Sep. 18, 2012, issued in U.S. Appl. No. 12/772,055.
U.S. Notice of Allowance dated Sep. 24, 2018 for U.S. Appl. No. 15/527,194.
U.S. Notice of Allowance dated Sep. 25, 2018 for U.S. Appl. No. 15/507,734.
U.S. Office Action, dated Apr. 26, 2012, issued in U.S. Appl. No. 12/772,055.
U.S. Office Action dated Apr. 5, 2018 in U.S. Appl. No. 15/441,130.
U.S. Office Action dated Aug. 12, 2016 in U.S. Appl. No. 14/683,541.
U.S. Office Action dated Aug. 12, 2019 in U.S. Appl. No. 15/916,142.
U.S. Office Action dated Aug. 16, 2012 issued in U.S. Appl. No. 12/772,075.
U.S. Office Action dated Aug. 2, 2021 in U.S. Appl. No. 16/785,547.
U.S. Office Action dated Aug. 6, 2014 in U.S. Appl. No. 14/052,455.
U.S. Office Action dated Dec. 26, 2012 in U.S. Appl. No. 12/772,075.
U.S. Office Action dated Dec. 30, 2016 in U.S. Appl. No. 15/004,794.
U.S. Office Action dated Dec. 31, 2018 in U.S. Appl. No. 15/795,843.
U.S. Office Action dated Feb. 16, 2012 issued in U.S. Appl. No. 13/166,537.
U.S. Office Action dated Feb. 25, 2019 for U.S. Appl. No. 15/204,868.
U.S. Office Action dated Jan. 14, 2015 in U.S. Appl. No. 13/462,725.
U.S. Office Action dated Jan. 20, 2012 issued in U.S. Appl. No. 12/772,075.
U.S. Office Action dated Jan. 23, 2019 in U.S. Appl. No. 15/612,928.
U.S. Office Action dated Jul. 10, 2018 for U.S. Appl. No. 15/953,327.
U.S. Office Action dated Jul. 10, 2019 in U.S. Appl. No. 16/250,738.
U.S. Office Action dated Jul. 23, 2021 in U.S. Appl. No. 15/916,142.
U.S. Office Action dated Jul. 25, 2019 for U.S. Appl. No. 16/168,587.
U.S. Office Action dated Jul. 25, 2019 in U.S. Appl. No. 16/088,024.
U.S. Office Action dated Jul. 25, 2019 in U.S. Appl. No. 16/204,540.
U.S. Office Action dated Jul. 25, 2019 in U.S. Appl. No. 16/284,876.
U.S. Office Action dated Jul. 28, 2016 in U.S. Appl. No. 14/841,511.
U.S. Office Action dated Jun. 16, 2020 in U.S. Appl. No. 15/916,142.
U.S. Office Action dated Jun. 25, 2013 in U.S. Appl. No. 13/610,684.
U.S. Office Action dated Jun. 27, 2018 in U.S. Appl. No. 15/612,928.
U.S. Office Action dated May 15, 2018 for U.S. Appl. No. 15/507,734.
U.S. Office Action dated May 15, 2018 for U.S. Appl. No. 15/527,194.
U.S. Office Action dated May 25, 2018 for U.S. Appl. No. 15/526,969.
U.S. Office Action dated Nov. 20, 2012 in U.S. Appl. No. 12/814,277.
U.S. Office Action dated Nov. 20, 2012 in U.S. Appl. No. 12/814,279.
U.S. Office Action dated Oct. 25, 2011 issued in U.S. Appl. No. 13/166,537.
U.S. Office Action dated Sep. 11, 2017 for U.S. Appl. No. 15/587,114.
U.S. Office Action dated Sep. 20, 2018 for U.S. Appl. No. 15/340,853.
U.S. Appl. No. 17/445,245, Inventors Wang et al., filed Aug. 17, 2021.
Velux SageGlass Flyer, 2007, 4 pages.
Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
Yoshimura, et al., "Electrochromism in a Thin-Film Device Using Li2WO4 as an Li-Electrolyte", Japanese Journal of Applied Physics, vol. 22, No. 1, Jan. 1983, pp. 152-156.
AU Examination report dated Aug. 17, 2022, in Application No. AU2020294239.
AU Examination report dated Feb. 21, 2022, in Application No. AU2020294239.
AU Examination report dated Jul. 5, 2022, in Application No. AU2020294239.
AU Office Action dated Jun. 23, 2022 in Application No. AU20210202495.
CA Office Action dated Jun. 9, 2022, in Application No. CA2992423.
EP Office Action dated Feb. 11, 2022, in Application No. EP15863517.7.
EP Office Action dated Mar. 16, 2022, in Application No. EP15862207.6.
EP Summons to attend Oral Proceedings dated Oct. 18, 2021 in Application No. 15785891.1.
Extended European search report dated Oct. 31, 2022, in Application No. EP22190639.9.
IN Office Action dated Aug. 26, 2022, in Application No. IN202037048424.
JP Office Action dated Mar. 1, 2022, in Application No. JP2021-013861.
JP Office Action dated Sep. 13, 2022, in Application No. JP2021-013861.
KR Office Action dated Dec. 15, 2022, in Application No. KR10-2018-7002665 with English translation.
KR Office Action dated Jan. 14, 2022, in Application No. KR1020217042357 with English translation.
Lee, S. et al., Electrochromic coloration efficiency of a-$WO_{3-y}$ thin films as a function of oxygen deficiency, Applied Physics Letters, Sep. 13, 1999, vol. 75, No. 11, pp. 1541-1543.
Lee, S. et al., "Electrochromic mechanism in a-$WO_{3-y}$ thin films", Applied Physics Letters, Jan. 11, 1999, vol. 74, No. 2, pp. 242-244.
Ozin, G.A. et al., "Smart Zeolites: New Forms of Tungsten and Molybdenum Oxides" Accounts of Chemical Research, 1992, vol. 25, No. 12, pp. 553-560.
TW Office Action dated Aug. 29, 2022, in Application No. TW110134875 with English translation.
TW Office Action dated Mar. 29, 2022, in Application No. TW110125561 with English translation.
TW Office Action dated Mar. 29, 2022, in Application No. TW110134875 with English translation.
TW Office Action dated Nov. 24, 2021, in Application No. TW105122100 with English translation.
U.S. Corrected Notice of Allowance dated Jan. 5, 2023 in U.S. Appl. No. 16/782,543.

(56) References Cited

OTHER PUBLICATIONS

U.S. Corrected Notice of Allowance dated Nov. 15, 2022 in U.S. Appl. No. 16/774,621.
U.S. Corrected Notice of Allowance dated Sep. 21, 2022 in U.S. Appl. No. 16/774,621.
U.S. Non-Final office Action dated Sep. 8, 2022 in U.S. Appl. No. 15/916,142.
U.S. Notice of Allowance dated Jul. 11, 2022 in U.S. Appl. No. 16/774,621.
U.S. Corrected Notice of Allowability dated Jan. 25, 2022, in U.S. Appl. No. 16/785,547.
U.S. Corrected Notice of Allowance dated Dec. 23, 2022 in U.S. Appl. No. 16/949,463.
U.S. Corrected Notice of Allowance dated May 11, 2022 in U.S. Appl. No. 16/879,255.
U.S. Final Office Action dated Dec. 23, 2022 in U.S. Appl. No. 16/660,660.
U.S. Final Office Action dated Dec. 27, 2022 in U.S. Appl. No. 16/719,700.
U.S. Final Office Action dated Mar. 7, 2022, in U.S. Appl. No. 15/916,142.
U.S. Non Final Office Action dated Jan. 13, 2022 in U.S. Appl. No. 16/879,255.
U.S. Non-Final office Action dated Jul. 22, 2022 in U.S. Appl. No. 16/782,543.
U.S Non-Final Office Action dated Jul. 28, 2022, in U.S. Appl. No. 16/949,463.
U.S Non-Final Office Action dated Jun. 10, 2022, in U.S. Appl. No. 16/660,660.
U.S. Notice of Allowance dated Sep. 6, 2022 in U.S. Appl. No. 16/774,621.
U.S. Notice of Allowance dated Apr. 11, 2022 in U.S. Appl. No. 16/785,547.
U.S. Notice of Allowance dated Apr. 15, 2022 in U.S. Appl. No. 16/879,255.
U.S. Notice of Allowance dated Apr. 5, 2022, in U.S. Appl. No. 15/931,359.
U.S. Notice of Allowance dated Dec. 2, 2022 in U.S. Appl. No. 16/782,543.
U.S. Notice of Allowance dated Dec. 5, 2022 in U.S. Appl. No. 16/949,463.
U.S. Notice of Allowance dated Feb. 23, 2022, in U.S. Appl. No. 16/721,655.
U.S. Notice of Allowance dated Jan. 26, 2022 in U.S. Appl. No. 16/859,856.
U.S. Notice of Allowance dated May 13, 2022 in U.S. Appl. No. 16/859,856.
U.S. Office Action dated Mar. 16, 2022, in U.S. Appl. No. 16/719,700.
U.S. Appl. No. 18/050,918, inventors Wang et al., filed Oct. 28, 2022.
U.S. Appl. No. 18/055,825, inventors Kozlowski et al., filed Nov. 15, 2022.
U.S. Appl. No. 18/153,090, Wang et al., filed Jan. 11, 2023.
U.S. Restriction Requirement dated Apr. 27, 2022 in U.S. Appl. No. 16/782,543.
U.S. Restriction Requirement dated Feb. 17, 2022 in U.S. Appl. No. 16/774,621.
Wikipedia webpage "Doping (semiconductors)" (Year: 2008).
Wikipedia webpage "Non-stoichiometric compound" (Year: 2008).
JP Office Action dated Jan. 4, 2023, in Application No. JP2020-559396 with English translation.
U.S. Notice of Allowance dated Jan. 30, 2023 in U.S. Appl. No. 16/782,543.
U.S. Restriction Requirement dated Feb. 17, 2023 in U.S. Appl. No. 17/517,510.
AU Office Action dated Oct. 19, 2022, in application No. AU2021236496.
CA Office Action dated Jul. 14, 2023, in Application No. CA2968832.
Chinese Allowance with Search Report dated May 8, 2021 in CN Application No. 201610832436.6 with English translation.
Chinese Notice of Allowance with Search Report dated Jul. 15, 2021 in CN Application No. 201680047325.2 with English translation.
CN Office Action dated Apr. 3, 2023, in application No. 20158069923.5 with English translation.
CN Office Action dated Aug. 15, 2023, in Application No. CN202110747487.X with English translation.
CN Office Action dated Aug. 23, 2023, in application no. CN202080050069.9 with English translation.
CN Office Action dated Dec. 1,2022 in Application No. CN201580069923.5 with English translation.
CN Office Action dated Jul. 31, 2023, in application No. CN202210140306.1 with English translation.
CN Office Action dated Jun. 9, 2023, in CN Application No. 201810154035.9 with English Translation.
CN Office Action dated Sep. 1,2023, in Application No. CN202110652522.X with English translation.
CN Office Action dated Sep. 20, 2023, in Application No. CN202111168365.1 with English translation.
CN Office Action dated Sep. 25, 2023, in Application No. CN202011285041.1 with English translation.
CN Office Action dated Sep. 27, 2023, in application No. CN201980038535.9 with English translation.
CN Office Action dated Sep. 27, 2023, in application No. CN202111411891.6 with English translation.
EP Extended European Search Report dated Aug. 31,2023, in Application No. EP23158636.3.
EP Extended European Search Report dated Dec. 19, 2022 in Application No. EP22187492.8.
EP Extended European Search report dated Feb. 3, 2023 in Application No. EP22204822.5.
EP Extended European Search report dated Oct. 20, 2023 in EP Application No. 23193972.9.
EP Search report dated Mar. 15, 2022, in Application No. EP21206721.9.
IN Office Action dated Aug. 4, 2022, in Application No. IN202238017115.
JP Office Action dated Apr. 4, 2023 in Application No. JP2021-013861 with English translation.
JP Office Action dated Aug. 22, 2023, in Application No. JP2022-112947 with English translation.
JP Office Action dated Dec. 7, 2021, in Application No. JP20200207808 with English translation.
JP Office Action dated Feb. 7, 2023 in Application No. JP2022-112947 with English translation.
JP Office Action dated Jun. 27, 2023, in Application No. JP2020-559396 with English translation.
JP Office Action dated Mar. 1, 2022, in Application No. JP2021-013861 with English translation.
JP Office Action dated Sep. 13, 2022, in Application No. JP2021-013861 with English translation.
KR Office Action dated Jul. 31, 2023, in Application No. KR10-2018-7002665 with English translation.
KR Office Action dated Nov. 14, 2022, in Application No. KR10-2022-7036165 with English Translation.
TW Office Action dated Aug. 2, 2023, in application No. TW20220119773 with English translation.
TW Office Action dated Aug. 4, 2023, in application No. TW111125592 with English translation.
TW Office Action dated Aug. 4, 2023, in application No. TW111145963 with English translation.
TW Office Action dated Aug. 7, 2023 in Application No. TW108114133 with English translation.
TW Office Action dated Jul. 28, 2023 in Application No. TW111105695 with English translation.
TW Office Action dated Mar. 21,2023, in Application No. TW108114133 with English translation.
U.S Advisory Action dated Apr. 5, 2023 in U.S. Appl. No. 16/719,700.
U.S Advisory Action dated Mar. 3, 2023 in U.S. Appl. No. 16/660,660.
U.S. Corrected Notice of Allowance dated Oct. 12, 2023, in U.S. Appl. No. 17/445,245.
U.S. Corrected Notice of Allowance dated Sep. 7, 2023, in U.S. Appl. No. 15/916,142.

(56) References Cited

OTHER PUBLICATIONS

U.S. Final Office Action dated Jul. 17, 2023, in U.S. Appl. No. 16/660,660.
U.S. Final Office Action dated Mar. 10, 2023 in U.S. Appl. No. 15/916,142.
U.S. Final Office Action dated Nov. 13, 2023 in U.S. Appl. No. 16/719,700.
U.S. Final Office Action dated Oct. 2, 2023, in U.S. Appl. No. 17/517,510
U.S. Non-Final Office Action dated Apr. 4, 2023 in U.S. Appl. No. 16/660,660.
U.S. Non-Final Office Action dated Dec. 1, 2023 in U.S. Appl. No. 16/660,660.
U.S. Non-Final Office Action dated Jul. 25, 2023, in U.S. Appl. No. 17/656,367
U.S. Non-Final Office Action dated Jul. 25, 2023, in U.S. Appl. No. 17/812,734.
U.S. Non-Final Office Action dated Jul. 31, 2023, in U.S. Appl. No. 17/810,656.
U.S. Non-Final Office Action dated May 2, 2023, in U.S. Appl. No. 17/517,510.
U.S. Non-Final Office Action dated May 19, 2023 in U.S. Appl. No. 16/719,700.
U.S. Non-Final Office Action dated May 25, 2023 in U.S. Appl. No. 17/445,245.
U.S. Non-Final Office Action dated Sep. 6, 2023, in U.S. Appl. No. 17/249,641.
U.S. Non-Final Office Action dated Sep. 26, 2023, in U.S. Appl. No. 17/804,515.
U.S. Notice of Allowance dated Aug. 23, 2023 in U.S. Appl. No. 15/916,142.
U.S. Notice of Allowance dated Dec. 14, 2023 in U.S. Appl. No. 17/816,364.
U.S. Notice of Allowance dated Sep. 20, 2023, in U.S. Appl. No. 17/816,364.
U.S. Notice of Allowance dated Sep. 27, 2023, in U.S. Appl. No. 17/445,245.
U.S. Appl. No. 18/323,307, inventors Robert Tad Rozbicki et al., filed on May 24, 2023.
U.S Restriction requirement dated Nov. 6, 2023 in U.S. Appl. No. 18/050,918.
Avendano E., et al., "Electrochromism in Nickel Oxide Films Containing Mg, Al, Si, V, Zr, Nb, Ag, or Ta," Solar Energy Materials & Solar Cells, 2004, Vol. 84, pp. 337-350.
CA Office Action dated Feb. 14, 2024 in CA Application No. 3098324.
CA Office Action dated Feb. 22, 2024 in CA Application No. 3145184.
CA Office Action dated Jan. 26, 2024 in CA Application No. 2992423.
CN Office Action dated Feb. 27, 2024 in CN Application No. 202210140306.1, with English Translation.
CN Office Action dated Jan. 30, 2024 in CN Application No. 202080050069.9, with English Translation.
JP Office Action dated Mar. 12, 2024, in Application No. JP2022-112947 with English Translation.
KR Office Action dated Feb. 28, 2024 in KR Application No. 10-2022-7044037, with English Translation.
Makimura Y., et al., "Cobalt and Tantalum Additions for Enhanced Electrochromic Performances of Nickel-based Oxide Thin Films Grown by Pulsed Laser Deposition," Applied Surface Science, 2006, vol. 252, pp. 4593-4598.
TW Office Action dated Dec. 22, 2023 in TW Application No. 108114133, with English Translation.
U.S. Advisory Action dated Jan. 26, 2024 in U.S. Appl. No. 16/719,700.
U.S. Corrected Notice of Allowance dated Jan. 10, 2024 in U.S. Appl. No. 17/445,245.
U.S. Non-Final Office Action dated Feb. 27, 2024 in U.S. Appl. No. 16/719,700.
U.S. Non-Final Office Action dated Jan. 8, 2024 in U.S. Appl. No. 17/517,510.
U.S. Non-Final Office Action dated Jan. 10, 2024 in U.S. Appl. No. 18/179,320.
U.S. Non-Final Office Action dated Jan. 29, 2024 in U.S. Appl. No. 18/323,307.
U.S. Notice of Allowance dated Dec. 20, 2023 in U.S. Appl. No. 17/656,367.
U.S. Notice of Allowance dated Dec. 20, 2023 in U.S. Appl. No. 17/810,656.
U.S. Notice of Allowance dated Jan. 26, 2024 in U.S. Appl. No. 15/916,142.
U.S. Notice of Allowance dated Mar. 8, 2024 in U.S. Appl. No. 18/050,918.
U.S. Notice of Allowance dated Mar. 28, 2024 in U.S. Appl. No. 18/050,918.
U.S. Appl. No. 18/611,458, inventors Gillaspie D, et al., filed on Mar. 20, 2024.
U.S. Appl. No. 18/611,467, inventors Gillaspie D, et al., filed on Mar. 20, 2024.
U.S. Restriction Requirement dated Feb. 13, 2024 in U.S. Appl. No. 17/696,783.
U.S. Restriction Requirement dated Mar. 28, 2024 in U.S. Appl. No. 18/153,090.
Wikipedia: "Dopant," Wikipedia Webpage, 2008, 2 pages, [Retrieved on Feb. 21, 2024], Retrieved from [https://en.wikipedia.org/w/index.php?title=Dopant&oldid=260133883].
CN Office Action dated Apr. 12, 2024 in CN Application No. 202080050069.9, with EnglishTranslation.
CN Office Action dated Aug. 16, 2024 in CN Application No. 202111168365.1 with English translation.
CN Office Action dated Mar. 28, 2024 in CN Application No. 202111168365.1, With English Translation.
CN Office Action dated Mar. 31,2024 in CN Application No. 201980038535.9, with English Translation.
EP Extended European Search report dated Aug. 12, 2024 in EP Application No. 24163767.7.
U.S. Corrected Notice of Allowance dated Jun. 25, 2024 in U.S. Appl. No. 18/050,918.
U.S. Final Office Action dated Apr. 22, 2024 in U.S. Appl. No. 17/517,510.
U.S. Final Office Action dated May 1,2024 in U.S. Appl. No. 16/660,660.
U.S. Non-Final Office Action dated Aug. 14, 2024 in U.S. Appl. No. 17/596,266.
U.S. Non-Final Office Action dated Jun. 5, 2024 in U.S. Appl. No. 17/696,783.
U.S. Notice of Allowance dated Apr. 11,2024 in U.S. Appl. No. 17/804,515.
U.S. Notice of Allowance dated Jul. 8, 2024 in U.S. Appl. No. 17/804,515.
U.S. Notice of Allowance dated May 16, 2024 in U.S. Appl. No. 18/050,918.
CA Office Action dated Oct. 29, 2024 in CA Application No. 2992423.
CN Office Action dated Sep. 6, 2024 in CN Application No. 201980038535.9 with English translation.
Extended European Search Report dated Jan. 7, 2025, (Applicant first notified on Jan. 6, 2025) for Application No. 24203705.9
KR Office Action dated Nov. 28, 2024 in KR Application No. 10-2024-7017402, with English Translation.
Taiwanese Allowance with Search Report dated Mar. 12, 2021 in TW Application No. 109123760, with English translation.
U.S. Final Office Action dated Sep. 5, 2024 in U.S. Appl. No. 16/719,700.
U.S. Final Office Action dated Sep. 6, 2024 in U.S. Appl. No. 18/323,307.
U.S. Non-Final Office Action dated Sep. 30, 2024 in U.S. Appl. No. 18/611,467.
U.S. Notice of Allowance dated Nov. 13, 2024 in U.S. Appl. No. 17/517,510.
U.S. Notice of Allowance dated Oct. 23, 2024 in U.S. Appl. No. 17/517,510.

(56) References Cited

OTHER PUBLICATIONS

U.S. Appl. No. 19/025,816, inventors Kozlowski M et al., filed on Jan. 16, 2025.
EP Office Action dated Jan. 22, 2025 in EP Application No. 22187492.8.
Mattox D.M., "The Foundations of Vacuum Coating Technology," Springer, 2003, 157 Pages.
Mattox D.M., "Vacuum Deposition Processes," PF Finishing, January 1999, pp. 1-8.
Simmons J.G. and Maissel L.I., "Multiple Cathode Sputtering System", Review of Scientific Instruments, Jun. 1961, vol. 32(6), pp. 642-645.
U.S. Final Office Action dated Mar. 5, 2025 in U.S. Appl. No. 17/696,783.
U.S. Non-Final Office Action dated Jan. 23, 2025 in U.S. Appl. No.16/719,700.
U.S. Non-Final Office Action dated Mar. 5, 2025 in U.S. Appl. No. 18/611,458.
U.S. Notice of Allowance dated Mar. 19, 2025 in U.S. Appl. No. 18/323,307.
"Vacuum Deposition", Wikipedia, Dec. 2008, 2 Pages.

\* cited by examiner

Direction of substrate travel

ELECTROCHROMIC CATHODE MATERIALS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material is tungsten oxide ($WO_3$). Tungsten oxide is a cathodic electrochromic material in which a coloration transition, transparent to blue, occurs by electrochemical reduction.

Electrochromic materials may be incorporated into, for example, windows for home, commercial and other uses. The color, transmittance, absorbance, and/or reflectance of such windows may be changed by inducing a change in the electrochromic material, that is, electrochromic windows are windows that can be darkened or lightened electronically. A small voltage applied to an electrochromic device of the window will cause them to darken; reversing the voltage causes them to lighten. This capability allows control of the amount of light that passes through the windows, and presents an opportunity for electrochromic windows to be used as energy-saving devices.

While electrochromism was discovered in the 1960s, electrochromic devices, and particularly electrochromic windows, still unfortunately suffer various problems and have not begun to realize their full commercial potential despite many recent advances in electrochromic technology, apparatus and related methods of making and/or using electrochromic devices.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain embodiments herein relate to electrochromic devices and electrochromic device precursors, as well as methods and apparatus for forming such electrochromic devices and electrochromic device precursors. In various embodiments, the electrochromic device or electrochromic device precursor includes an electrochromic layer that includes an electrochromic material that includes tungsten, titanium, molybdenum, and oxygen. This material is generally referred to as tungsten titanium molybdenum oxide In certain cases, the tungsten titanium molybdenum oxide electrochromic material may be paired with a particular counter electrode material, for example to provide desirable color qualities when the device is in a tinted state.

In one aspect of the disclosed embodiments, an electrochromic device or an electrochromic device precursor is provided, including: a first electrically conductive layer having a thickness between about 10-500 nm; an electrochromic layer including an electrochromic material including tungsten titanium molybdenum oxide having the composition $W_{1-x-y}Ti_xMo_yO_z$, where x is between about 0.05-0.25, y is between about 0.01-0.15, and z is between about 2.5-4.5, the electrochromic layer having a thickness between about 200-700 nm; a counter electrode layer including a counter electrode material including nickel tungsten oxide, the counter electrode layer having a thickness between about 100-400 nm; and a second electrically conductive layer having a thickness between about 100-400 nm, where the electrochromic layer and the counter electrode layer are positioned between the first electrically conductive layer and the second electrically conductive layer, and where the electrochromic device is all solid state and inorganic.

In some embodiments, the electrochromic layer may be crystalline (e.g., nanocrystalline, microcrystalline, or a combination thereof). In some embodiments, the electrochromic layer may be amorphous. In these or other embodiments, the counter electrode material may be crystalline (e.g., nanocrystalline, microcrystalline, or a combination thereof). In some embodiments, the counter electrode layer may be amorphous. In certain implementations, the counter electrode material includes nickel tungsten tantalum oxide. In certain implementations, the counter electrode material includes nickel tungsten niobium oxide. In certain implementations, the counter electrode material includes nickel tungsten tin oxide.

One or more of the layers of the electrochromic device or electrochromic device precursor may be formed through sputtering. In some cases, the electrochromic layer, the counter electrode layer, and the second electrically conductive layer are all formed through sputtering.

In various implementations, the electrochromic device or electrochromic device precursor does not include a homogenous layer of ion conducting, electronically insulating material between the electrochromic layer and the counter electrode layer. In some cases, the electrochromic material is in physical contact with the counter electrode material. In these or other cases, at least one of the electrochromic layer and the counter electrode layer may include two or more layers or portions, one of the layers or portions being superstoichiometric with respect to oxygen. In one implementation, either (a) the electrochromic layer includes the two or more layers, the layer that is superstoichiometric with respect to oxygen being in contact with the counter electrode layer, or (b) the counter electrode layer includes the two or more layers, the layer that is superstoichiometric with respect to oxygen being in contact with the electrochromic layer. In another implementation, either (a) the electrochromic layer includes the two or more portions, the two or more portions together forming the electrochromic layer as a graded layer, the portion of the electrochromic layer that is superstoichiometric with respect to oxygen being in contact with the counter electrode layer, or (b) the counter electrode layer includes the two or more portions, the two or more portions together forming the counter electrode layer as a graded layer, the portion of the counter electrode layer that is superstoichiometric with respect to oxygen being in contact with the electrochromic layer. In some embodiments, the electrochromic device or electrochromic device precursor further includes a material that is ion conducting and substantially electronically insulating that is formed in situ at an interface between the electrochromic layer and the counter electrode layer.

In certain implementations, the electrochromic device or electrochromic device precursor further includes an ion conducting layer including a material selected from the group consisting of: lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and combinations thereof. In some such cases, the ion conducting layer may have a thickness between about 5-100 nm. In some embodiments, the ion conducting layer includes a material selected from the group consisting of: lithium silicate, lithium aluminum silicate, lithium zirconium silicate, lithium borosilicate, lithium phosphosilicate, lithium phosphorus oxynitride (LiPON), lithium silicon carbon oxynitride (LiSiCON), and combinations thereof.

In a further aspect of the disclosed embodiments, a method of fabricating an electrochromic device or an electrochromic device precursor is provided, the method including: receiving a substrate with a first electrically conductive layer thereon; forming an electrochromic layer including an electrochromic material including tungsten titanium molybdenum oxide having the composition $W_{1-x-y}Ti_xMo_yO_z$, where x is between about 0.05-0.25, y is between about 0.01-0.15, and z is between about 2.5-4.5; forming a counter electrode layer including a counter electrode material including nickel tungsten oxide; and forming a second electrically conductive layer, where the electrochromic layer and the counter electrode layer are positioned between the first electrically conductive layer and the second electrically conductive layer, and where the electrochromic device is all solid state and inorganic.

In some embodiments, the electrochromic layer may be crystalline (e.g., nanocrystalline, microcrystalline, or a combination thereof). In some embodiments, the electrochromic layer may be amorphous. In these or other embodiments, the counter electrode layer may be crystalline (e.g., nanocrystalline, microcrystalline, or a combination thereof). In some embodiments, the counter electrode layer is amorphous. In certain implementations, the counter electrode material includes nickel tungsten tantalum oxide. In certain implementations, the counter electrode material includes nickel tungsten niobium oxide. In some implementations, the counter electrode material includes nickel tungsten tin oxide.

One or more of the layers may be formed through sputtering. For example, in some cases the electrochromic layer, the counter electrode layer, and the second electrically conductive layer are all formed through sputtering.

In some cases, the electrochromic device or electrochromic device precursor does not include a homogeneous layer of ion conducting, electronically insulating material between the electrochromic layer and the counter electrode layer. In some such cases, the electrochromic material may be in physical contact with the counter electrode material. In these or other cases, at least one of the electrochromic layer and the counter electrode layer may include two or more layers or portions, one of the layers or portions being superstoichiometric with respect to oxygen. For instance, in one example either: (a) the electrochromic layer includes the two or more layers, the layer that is superstoichiometric with respect to oxygen being in contact with the counter electrode layer, or (b) the counter electrode layer includes the two or more layers, the layer that is superstoichiometric with respect to oxygen being in contact with the electrochromic layer. In another example, either: (a) the electrochromic layer includes the two or more portions, the portion of the electrochromic layer that is superstoichiometric with respect to oxygen being in contact with the counter electrode layer, or (b) the counter electrode layer includes the two or more portions, the portion of the counter electrode layer that is superstoichiometric with respect to oxygen being in contact with the electrochromic layer.

In some embodiments the method may further include forming in situ an ion conducting layer including a material that is ionically conductive and substantially electronically insulating, the ion conducting layer being positioned at an interface between the electrochromic layer and the counter electrode layer. In some embodiments, the method may further include forming an ion conducting layer including a material selected from the group consisting of: lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and combinations thereof, wherein the ion conducting layer is formed before forming at least one of the electrochromic layer and counter electrode layer. In these or other cases, the ion conducting layer may have a thickness between about 5-100 nm. In certain cases, the ion conducting layer may include a material selected from the group consisting of: lithium silicate, lithium aluminum silicate, lithium zirconium silicate, lithium borosilicate, lithium phosphosilicate, lithium phosphorus oxynitride (LiPON), lithium silicon carbon oxynitride (LiSiCON), and combinations thereof.

In certain implementations, the electrochromic layer may be formed by sputtering using one or more metal-containing targets and a first sputter gas including between about 40-80% $O_2$ and between about 20-60% Ar, where the substrate is heated, at least intermittently, to between about 150-450° C. during formation of the electrochromic layer, the electrochromic layer having a thickness between about 200-700 nm, and the counter electrode layer is formed by sputtering using one or more metal-containing targets and a second sputter gas including between about 30-100% $O_2$ and between about 0-30% Ar, the counter electrode layer having a thickness between about 100-400 nm. The method may include, after forming the counter electrode layer: heating the substrate in an inert atmosphere at a temperature between about 150-450° C. for a duration between about 10-30 minutes; after heating the substrate in the inert atmosphere, heating the substrate in an oxygen atmosphere at a temperature between about 150-450° C. for a duration between about 1-15 minutes; and after heating the substrate in the oxygen atmosphere, heating the substrate in air at a temperature between about 250-350° C. for a duration between about 20-40 minutes. In various embodiments, the substrate may be maintained in a vertical orientation during formation of the electrochromic layer, the counter electrode layer, and the second electrically conductive layer.

These and other features will be described below with reference to the associated drawings.

DETAILED DESCRIPTION

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific details, it will be understood that it is not intended to limit the disclosed embodiments.

Various embodiments herein relate to electrochromic devices, electrochromic device precursors, and methods and apparatus for forming such electrochromic devices and electrochromic device precursors. In many embodiments, the electrochromic device includes an electrochromic material having a particular composition including at least tungsten, titanium, molybdenum, and oxygen. The amount of oxygen in the material will vary according to the stoichiometry of the metals in the composition, but may be defined more specifically as described below.

I. Overview of Electrochromic Devices

Figure 1:
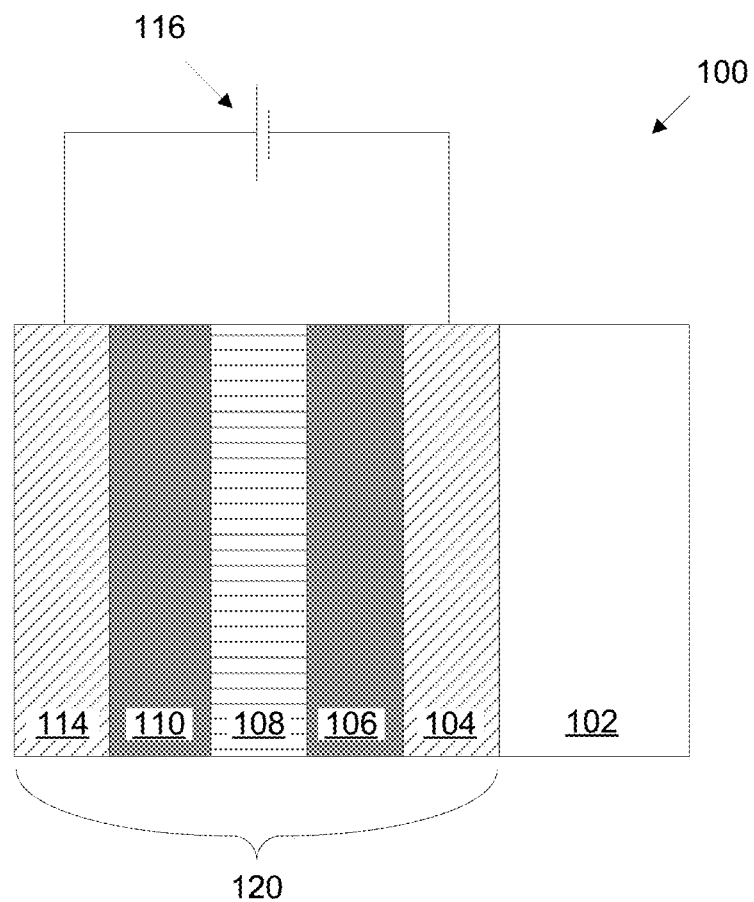
FIG. 1 depicts a view of an electrochromic device according to certain implementations.

A schematic cross-section of an electrochromic device 100 in accordance with some embodiments is shown in FIG. 1. The electrochromic device includes a substrate 102, a conductive layer (CL) 104, an electrochromic layer (EC) 106, an ion conducting layer (IC) 108, a counter electrode layer (CE) 110, and a conductive layer (CL) 114. Elements 104, 106, 108, 110, and 114 are collectively referred to as an electrochromic stack 120. In some cases, the ion conductor layer 108 may be omitted, as discussed further below. A voltage source 116 operable to apply an electric potential across the electrochromic stack 120 effects the transition of the electrochromic device from, e.g., a bleached state to a colored state. In other embodiments, the order of layers is reversed with respect to the substrate. That is, the layers are in the following order: substrate, conductive layer, counter electrode layer, ion conducting layer, electrochromic material layer, conductive layer.

Electrochromic layer 106 is cathodically coloring, while the counter electrode layer 110 may be anodically coloring or optically passive (sometimes referred to as an "ion storage layer" because ions reside there when the device is not tinted). For example, while tungsten oxide cathodically colors to an intense blue shade, nickel oxide anodically colors to a brown hue. When colored in tandem, a more neutral blue color is created. Still, improvements are needed. The inventors have discovered that certain material changes to tungsten oxide cathodic materials, when colored in tandem with certain nickel oxide based anodic materials, make for a more aesthetically pleasing hue for electrochromic windows.

It should be understood that the reference to a transition between a bleached state and colored state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further the term "bleached" refers to an optically neutral state, e.g., uncolored, transparent or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In certain embodiments, the electrochromic device reversibly cycles between a bleached state and a colored state. In the bleached state, a potential is applied to the electrochromic stack 120 such that available ions in the stack that can cause the electrochromic material 106 to be in the colored state reside primarily in the counter electrode 110. When the potential on the electrochromic stack is reversed, the ions are transported across the ion conducting layer 108 to the electrochromic material 106 and cause the material to enter the colored state.

In certain embodiments, all of the materials making up electrochromic stack 120 are inorganic, solid (i.e., in the solid state), or both inorganic and solid. Because organic materials tend to degrade over time, inorganic materials offer the advantage of a reliable electrochromic stack that can function for extended periods of time. Materials in the solid state also offer the advantage of not having containment and leakage issues, as materials in the liquid state often do. Each of the layers in the electrochromic device is discussed in detail, below. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Referring again to FIG. 1, voltage source 116 is typically a low voltage electrical source (on the order of between about 1V and about 20V, depending upon the electrochromic device used) and may be configured to operate in conjunction with radiant and other environmental sensors. Voltage source 116 may also be configured to interface with an energy management system, such as a computer system that controls the electrochromic device according to factors such as the time of year, time of day, and measured environmental conditions. Such an energy management system, in conjunction with large area electrochromic devices (i.e., an electrochromic window), can dramatically lower the energy consumption of a building.

A. Substrate

Any material having suitable optical, electrical, thermal, and mechanical properties may be used as substrate 102 in FIG. 1. Such substrates include, for example, glass, plastic, and mirror materials.

The substrate may be of any thickness, as long as it has suitable mechanical properties to support the electrochromic stack 120. While the substrate 102 may be of any thickness or transparent material, in some embodiments, it is glass or plastic and is between about 0.01 mm and about 10 mm thick. In certain embodiments the substrate is glass that is between about 3 mm to 9 mm thick, and may be tempered. In other embodiments, the glass may be very thin, between about 0.01 mm and 1 mm thick, or between about 0.1 mm and 1 mm thick, and be sodium-free or have very low sodium or other alkali content, e.g., substrates such as Corning, Incorporated's (of Corning, N.Y.) Gorilla®, Willow®, EagleXG®, or other similar glass substrates from commercial sources, such as those from Asahi Glass Corporation (AGC, of Tokyo, Japan).

In some embodiments of the invention, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches. Architectural glass is typically at least about 2 mm thick.

B. Conductive Layers

Returning to FIG. 1, on top of substrate 102 is conductive layer 104. In certain embodiments, one or both of the conductive layers 104 and 114 is inorganic and/or solid state. Conductive layers 104 and 114 may be made from a number of different materials, including conductive oxides, thin metallic coatings, conductive metal nitrides, and composite conductors of metal oxides and metals. Typically, conductive layers 104 and 114 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like. Since oxides are often used for these layers, they are sometimes referred to as "transparent conductive oxide" (TCO) layers. Thin metallic coatings that are substantially transparent may also be used. Examples of metals used for such thin metallic coatings include transition metals including gold, platinum, silver, aluminum, nickel alloy, and the like. Thin metallic coatings based on silver, well known in the glazing industry, are also used. Examples of conductive nitrides include titanium nitrides, tantalum nitrides, titanium oxynitrides, and tantalum oxynitrides. The conductive layers 104 and 114 may also be composite conductors. Such composite conductors may be fabricated by placing highly conductive ceramic and metal wires or conductive layer patterns on one of the faces of the substrate and then over-coating with transparent conductive materials such as doped tin oxides or indium tin oxide. Ideally, such wires should be thin enough as to be invisible to the naked eye (e.g., about 100 μm or thinner). Other composite conductors include metal oxide-metal-metal oxide sandwiched materials, such as indium tin oxide-metal-indium tin oxide layers, sometimes generically referred to as "IMI's," where the metal is e.g., silver, gold, copper, aluminum or alloys thereof.

In some embodiments, commercially available substrates such as glass substrates contain a transparent conductive layer coating. Such products may be used for both substrate 102 and conductive layer 104. Examples of such glasses include conductive layer coated glasses sold under the trademark TEC Glass™ by Pilkington, of Toledo, Ohio and SUNGATE™ 300 and SUNGATE™ 500 by PPG Industries of Pittsburgh, Pa. TEC Glass™ is a glass coated with a fluorinated tin oxide conductive layer.

In some embodiments of the invention, the same conductive layer is used for both conductive layers (i.e., conductive layers 104 and 114). In some embodiments, different conductive materials are used for each conductive layer 104 and 114. For example, in some embodiments, TEC Glass™ is used for substrate 102 (float glass) and conductive layer 104 (fluorinated tin oxide) and indium tin oxide is used for conductive layer 114. As noted above, in some embodiments employing TEC Glass™ there is a sodium diffusion barrier between the glass substrate 102 and TEC conductive layer 104.

The function of the conductive layers is to spread an electric potential provided by voltage source 116 over surfaces of the electrochromic stack 120 to interior regions of the stack, with very little ohmic potential drop. The electric potential is transferred to the conductive layers though electrical connections to the conductive layers. In some embodiments, bus bars, one in contact with conductive layer 104 and one in contact with conductive layer 114, provide the electric connection between the voltage source 116 and the conductive layers 104 and 114. The conductive layers 104 and 114 may also be connected to the voltage source 116 with other conventional means.

In some embodiments, the thickness of conductive layers 104 and 114 is between about 5 nm and about 10,000 nm. In some embodiments, the thickness of conductive layers 104 and 114 are between about 10 nm and about 1,000 nm. In other embodiments, the thickness of conductive layers 104 and 114 are between about 10 nm and about 500 nm. In some embodiments where TEC Glass™ is used for substrate 102 and conductive layer 104, the conductive layer is about 400 nm thick. In some embodiments where indium tin oxide is used for conductive layer 114, the conductive layer is about 100 nm to 400 nm thick (280 nm in one embodiment). More generally, thicker layers of the conductive material may be employed so long as they provide the necessary electrical properties (e.g., conductivity) and optical properties (e.g., transmittance). Generally, the conductive layers 104 and 114 are as thin as possible to increase transparency and to reduce cost. In some embodiment, conductive layers are substantially crystalline. In some embodiment, conductive layers are crystalline with a high fraction of large equiaxed grains.

The sheet resistance ($R_s$) of the conductive layers is also important because of the relatively large area spanned by the layers in large electrochromic windows. In some embodiments, the sheet resistance of conductive layers 104 and 114 is about 5 to 30 Ohms per square. In some embodiments, the sheet resistance of conductive layers 104 and 114 is about 15 Ohms per square. In general, it is desirable that the sheet resistance of each of the two conductive layers be about the same. In one embodiment, the two layers each have a sheet resistance of about 10-15 Ohms per square. In one embodiment, the two layers each have a sheet resistance of less than 10 Ohms per square or less than 5 Ohms per square or less than 3 Ohms per square.

C. Electrochromic Layer

Returning to FIG. 1, overlaying conductive layer 104 is electrochromic layer 106. In embodiments of the invention, electrochromic layer 106 is inorganic and/or solid, in typical embodiments inorganic and solid. A number of different materials can be used for the electrochromic layer 106. In conventional electrochromic devices, the electrochromic layer may contain e.g., tungsten oxide. The inventors have found that electrochromic devices that use tungsten titanium molybdenum oxides in the electrochromic layer, as described herein, possess improved properties over conventional devices. Electrochromic metal oxides may further include protons, lithium, sodium, potassium or other ions to function. An electrochromic layer 106 as described herein is capable of receiving such ions transferred from counter electrode layer 110.

Tungsten oxide has long been used as an electrochromic material. Over time, various materials have been added to tungsten oxide to adjust its properties. In various embodiments herein, the electrochromic layer 106 includes an electrochromic material that includes tungsten, titanium, molybdenum, and oxygen. This material may be referred to as tungsten titanium molybdenum oxide. Tungsten titanium molybdenum oxide exhibits both a high degree of durability and improved color properties over conventional devices, particularly when used in combination with certain nickel oxide based counter electrode materials, such as nickel oxide that contains one or more of tungsten oxide, tantalum oxide, niobium oxide, tin oxide and mixtures thereof.

The inclusion of titanium in the electrochromic material increases the stability/durability of the electrochromic layer, meaning that the resulting electrochromic device is less likely to break down over time with repeated insertion/extraction of ions and electrons. The inclusion of molybdenum in the electrochromic material changes the color properties of the electrochromic layer, resulting in an electrochromic device that is more color neutral. Tungsten oxide, for example, has an intense blue appearance that can be undesirable. This blue color is made more neutral with the inclusion of molybdenum. These two modifications (e.g., including both titanium and molybdenum in a tungsten-oxide based material) can be combined to produce tungsten titanium molybdenum oxide, a material that exhibits both a high degree of durability and desirable color characteristics.

The tungsten titanium molybdenum oxide materials used in electrochromic devices described herein may be represented by the formula: $W_{1-x-y}Ti_xMo_yO_z$, where the total amount of the three metals in the material is represented in relative atomic percentage where x is the atomic percentage of titanium, y is the atomic percent of molybdenum and 1-x-y represents the atomic percentage of tungsten. For example, a compound represented by $W_{0.80}Ti_{0.10}Mo_{0.10}O_z$, has a metal content that is 80% (atomic) tungsten, and 10% (atomic) each of titanium and molybdenum. Thus the total metal content, 100%, in this example is 80% W, 10% Ti and 10% Mo.

Of course, the actual material contains oxygen as well as the three metals. For the material, z represents the stoichiometry of the oxygen in the compound relative to, collectively, all three metals. In certain embodiments, z is between about 2.5 to 3.5. The value of z can have a strong effect on the properties of the material. Such properties may include whether or not the material exhibits electrochromism and whether or not the material can function as a precursor to an ion conducting material. That is, just as electrochromic tungsten oxide, represented by $WO_z$, may have an oxygen content where z is 3 or less, typically between about 2.5 and 3, and superstoichiometric tungsten oxide (which is superstoichiometric with respect to oxygen and may act as a precursor to an ion conducting material), represented by $WO_z$, has an oxygen content where z is greater than 3, for example between 3.1 and 4; the tungsten titanium and molybdenum in the compounds described herein, collectively, may have the same associated amounts of oxygen. For example, the material may have 3 or less oxygen atoms per metal atom for tungsten titanium molybdenum oxide that exhibits electrochromism, or more than 3 oxygen atoms per metal atom for tungsten titanium molybdenum oxide that is superstoichiometric with respect to oxygen (and which may act as a precursor to an ion conducting material). Thus, when z is 3 or less, representing a stoichiometric or substoichiometric oxygen level for the combined three metals in the material, the material is cathodically coloring. Notably, the electrochromic tungsten titanium molybdenum oxide is more color neutral than e.g., electrochromic tungsten oxide, which has an intense and deep blue color when tinted (e.g., via insertion of positive ions such as protons or lithium ions, and electrons). In certain embodiments, when z is 3 or greater, the material is superstoichiometrically oxygenated, e.g., when used in methods of manufacture to fabricate electrochromic devices (and may be stable as such in an electrochromic device precursor used in the aforementioned methods of manufacture) as described in more detail herein.

For tungsten titanium molybdenum oxide, $W_{1-x-y}Ti_xMo_yO_z$, the subscripts x, y, and z fall within particular ranges in certain embodiments. For instance, in some embodiments x may be at least about 0.05, or at least about 0.10, or at least about 0.15. In these or other cases, x may be about 0.25 or less, or about 0.20 or less, or about 0.15 or less. In these or other embodiments, y may be at least about 0.01, at least about 0.02, at least about 0.05, at least about 0.10, or at least about 0.15. In these or other embodiments, y may be about 0.25 or less, for example about 0.20 or less, about 0.15 or less, about 0.1 or less, or about 0.08 or less. In these or other embodiments, z may be at least about 2.5, for example at least about 2.7, or at least about 2.9, or at least about 3.0, or at least about 3.5, or at least about 4.0. In these or other cases, z may be about 4.5 or less, for example about 4.0 or less, or about 3.5 or less, or about 3.3 or less, or about 3.1 or less, or about 3.0 or less, or about 2.9 or less. In some implementations, x may be between about 0.05 and 0.25, or between about 0.05 and 0.15, or between about 0.10 and 0.15. In these or other implementations, y may be between about 0.01 and 0.15, or between about 0.02 and 0.10, or between about 0.02 and 0.08. In these or other implementations, z may be between about 2.5-4.5, or between about 2.5-3.0, or between about 2.5-2.9, or between about 3.0-3.5, or between about 3.5-4.5.

In various implementations, the electrochromic layer may include two or more materials (e.g., deposited as a bilayer, graded layer, or other combination of layers) having different compositions, one or both of which may include tungsten titanium molybdenum oxide. In various embodiments where the electrochromic layer includes two or more materials, one of the materials may provide electrochromic properties, and the other material may act as a precursor for a material that is ion conducting and substantially electronically insulating.

In certain embodiments, tungsten titanium molybdenum oxide is deposited in at least two different compositions having different amounts of oxygen. In one example, the tungsten titanium molybdenum electrochromic layer is deposited as a bilayer where in a first layer of the bilayer, z is between about 2.5 and about 3.0, and in a second layer of the bilayer, z is greater than 3. In another embodiment, the tungsten titanium molybdenum electrochromic layer is deposited as a single graded layer fabricated such that the value of z varies as a function of the depth of the layer. For example, tungsten titanium molybdenum oxide is sputtered onto a substrate at a first oxygen gas concentration in an initial portion of the deposition, then the oxygen gas concentration is increased as additional tungsten titanium molybdenum oxide material is deposited. Such varying oxygen concentration between multiple layers or in a graded layer can be used to fabricate ion conductor material in situ, e.g. after a counter electrode material is deposited and at the interface between the tungsten titanium molybdenum material and the counter electrode material, as is described in more detail below. This fabrication scheme assumes that the electrochromic layer is formed prior to the counter electrode layer. In cases where the counter electrode layer is formed prior to the electrochromic layer, the first and second layers of the electrochromic layer may be swapped (e.g., such that the electrochromic material that acts as a precursor for the material that is ion conducting and substantially electronically insulating is deposited prior to the electrochromic material that exhibits electrochromism).

In certain cases, the electrochromic layer is deposited in at least two different compositions that have different metals or combinations of metals therein. In one example, the electrochromic layer is deposited as a bilayer, where a first layer of the bilayer includes at least one metal that is not present in the second layer of the bilayer. In these or other embodiments, the second layer of the bilayer may include at least one metal that is not present in the first layer of the bilayer.

In one example, the first layer of the bilayer is tungsten titanium molybdenum oxide (e.g., $W_{1-x-y}Ti_xMo_yO_z$, where z is about 3 or less), and the second layer of the bilayer is tungsten oxide (e.g., $WO_z$, where z is greater than 3). In another example, the first layer of the bilayer is tungsten titanium molybdenum oxide (e.g., $W_{1-x-y}Ti_xMo_yO_z$, where z is about 3 or less), and the second layer of the bilayer is tungsten titanium oxide (e.g., $W_{1-x}Ti_xO_z$, where x is between about 0.05 and 0.20, or between about 0.05 and 0.15; and z is greater than 3). In another example, the first layer of the bilayer is tungsten titanium molybdenum oxide (e.g., $W_{1-x-y}Ti_xMo_yO_z$, where z is about 3 or less), and the second layer of the bilayer is tungsten molybdenum oxide (e.g., $W_{1-x}Mo_xO_z$, where x is between about 0.05 and 0.10, or between about 0.05 and 0.08; and z is greater than 3). In certain other examples, the first and second layers of the bilayer may be switched, e.g., such that the second layer of the bilayer is $W_{1-x-y}Ti_xMo_yO_z$ (where z is greater than 3), and the first layer of the bilayer is $WO_z$, $W_{1-x}Ti_xO_z$, or $W_{1-x}Mo_xO_z$ (where x and y are as described above with respect to $W_{1-x}Ti_xO_z$, or $W_{1-x}Mo_xO_z$, and where z is about 3 or less). For the $W_{1-x-y}Ti_xMo_yO_z$ materials discussed in this paragraph, the values of x and y may be within the ranges described elsewhere herein.

In embodiments that use a bilayer electrode as described above, each layer of the bilayer may have a distinct morphology. In some embodiments, each of the first and second layers of the bilayer has a morphology comprising a microcrystalline phase, a nanocrystalline phase, or an amorphous phase, where each of the first and second layers' morphology is distinct. For example, the first layer of the bilayer is tungsten titanium molybdenum oxide (e.g., $W_{1-x-y}Ti_xMo_yO_z$, where z is about 3 or less) that is amorphous, and the second layer of the bilayer is tungsten oxide (e.g., $WO_z$, where z is greater than 3) that is nanocrystalline. Different morphologies for the layers may be chosen for specific purposes or result from the specific process conditions and/or materials used for each layer.

The counter electrode layer, discussed further below, may similarly be deposited as a bilayer or graded layer that includes two or more materials that may have different compositions with respect to oxygen content, metal content, etc.

In a number of embodiments, the tungsten titanium molybdenum oxide may have a titanium content of at least about 3% (atomic), or at least about 5% (atomic), or at least about 8% (atomic). In these or other cases, the tungsten titanium molybdenum oxide may have a titanium content of about 20% (atomic) or less, for example about 15% (atomic) or less, or about 12% (atomic) or less. In these or other cases, the tungsten titanium molybdenum oxide may have a molybdenum content of at least about 1% (atomic), at least about 2% (atomic), at least about 3% (atomic), or at least about 4% (atomic). In these or other cases, the tungsten titanium molybdenum oxide may have a molybdenum content of about 8% (atomic) or less, for example about 6% (atomic) or less, or about 5% (atomic) or less. In a particular example, the tungsten titanium molybdenum oxide is between about 8-12% (atomic) titanium, and between about 2-8% (atomic) molybdenum.

In certain embodiments, the tungsten titanium molybdenum oxide electrochromic material is crystalline, nanocrystalline, or amorphous. In some embodiments, the electrochromic material is substantially nanocrystalline, with grain sizes, on average, from about 5 nm to 50 nm (or from about 5 nm to 20 nm), as characterized by transmission electron microscopy (TEM). The electrochromic material morphology may also be characterized as nanocrystalline using x-ray diffraction (XRD); XRD. For example, nanocrystalline electrochromic material may be characterized by the following XRD features: a crystal size of about 10 to 100 nm (e.g., about 55 nm. Further, nanocrystalline electrochromic material may exhibit limited long range order, e.g., on the order of several (about 5 to 20) electrochromic material unit cells. In some embodiments, the tungsten titanium molybdenum oxide electrochromic material may be amorphous. A number of factors may affect the morphology of the electrochromic material, including, for example, the composition of the material and the conditions used to deposit and treat the material. In some embodiments, the electrochromic material is not subjected to heating above a particular temperature (e.g., any processing involving heating the substrate during or after deposition of the electrochromic material may be kept below about 300° C., below about 250° C., below about 200° C., below about 150° C., below about 100° C., below about 75° C., or below about 50° C.). Without wishing to be bound by theory or mechanism of action, this lack of heating may contribute to an amorphous morphology for the tungsten titanium molybdenum oxide. In some other embodiments, heating the substrate may cause the tungsten titanium molybdenum oxide's morphology to become crystalline/ nanocrystalline. While not wishing to be bound by theory, it is believed that the titanium content in the tungsten titanium molybdenum oxide inhibits crystallization, but under the processing conditions described herein, e.g., higher temperatures and combination of heating under inert atmosphere followed by heating in air, a more crystalline morphology can be formed.

In embodiments where the electrochromic layer is deposited to include two or more different materials, the different materials may each independently include microcrystalline, nanocrystalline, and/or amorphous phases. In one example, a first layer or lower portion of the electrochromic layer is microcrystalline or nanocrystalline and a second layer or upper portion of the electrochromic layer is amorphous. In another example, the first layer or lower portion of the electrochromic layer is amorphous and a second layer or upper portion of the electrochromic layer is microcrystalline or nanocrystalline. In another example, both the first layer/lower portion and the second layer/upper portion of the electrochromic layer are microcrystalline or nanocrystalline. In another example, both the first layer/lower portion and the second layer/upper portion of the electrochromic layer are amorphous.

The thickness of the electrochromic layer 106 depends on the electrochromic material selected for the electrochromic layer. In some embodiments, the electrochromic layer 106 is about 50 nm to 2,000 nm, or about 200 nm to 700 nm. In some embodiments, the electrochromic layer is about 300 nm to about 500 nm.

Generally, in electrochromic materials, the colorization (or change in any optical property—e.g., absorbance, reflectance, and transmittance) of the electrochromic material is caused by reversible ion insertion into the material (e.g., intercalation) and a corresponding injection of a charge balancing electron. Typically some fraction of the ion responsible for the optical transition is irreversibly bound up in the electrochromic material. As explained below some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions (D), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena.

D. Counter Electrode Layer

Referring again to FIG. 1, in electrochromic stack 120, ion conducting layer 108 overlays electrochromic layer 106. On top of ion conducting layer 108 is counter electrode layer 110. In some embodiments, counter electrode layer 110 is inorganic and/or solid. The counter electrode layer may comprise one or more of a number of different materials that are capable of serving as reservoirs of ions when the electrochromic device is in the bleached state. During an electrochromic transition initiated by, e.g., application of an appropriate electric potential, the counter electrode layer transfers some or all of the ions it holds to the electrochromic layer, changing the electrochromic layer to the colored state. Concurrently, for example in the case of nickel oxide based materials that are electrochromically active, the counter electrode layer colors with the loss of ions.

In some embodiments, suitable materials for the counter electrode include nickel oxide (NiO), nickel tungsten oxide (NiWO), nickel vanadium oxide, nickel chromium oxide, nickel aluminum oxide, nickel manganese oxide, nickel magnesium oxide, chromium oxide ($Cr_2O_3$), manganese oxide ($MnO_2$), Prussian blue, cerium titanium oxide ($CeO_2$—$TiO_2$), cerium zirconium oxide ($CeO_2$—$ZrO_2$), vanadium oxide ($V_2O_5$), and mixtures of oxides (e.g., a mixture of $Ni_2O_3$ and $WO_3$). Doped formulations of the oxides may also be used, with dopants including, e.g., tantalum and tungsten. Particular examples of counter electrode materials include nickel tungsten tantalum oxide, nickel tungsten niobium oxide, and nickel tungsten tin oxide. Because counter electrode layer 110 contains the ions used to produce the electrochromic phenomenon in the electrochromic material when the electrochromic material is in the bleached state, the counter electrode preferably has high transmittance and a neutral color when it holds significant quantities of these ions.

In some embodiments, nickel-tungsten oxide (NiWO) is used as a counter electrode material in the counter electrode layer. In certain embodiments, the amount of nickel present in the nickel-tungsten oxide can be up to about 90% by weight of the nickel-tungsten oxide. In a specific embodiment, the mass ratio of nickel to tungsten in the nickel-tungsten oxide is between about 4:6 and 6:4 (e.g., about 1:1). In one embodiment, the NiWO is between about 15% (atomic) Ni and about 60% Ni; between about 10% W and about 40% W; and between about 30% O and about 75% O. In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O.

In some embodiments, nickel tungsten tantalum oxide (NiWTaO) is used as a counter electrode material in the counter electrode layer. The nickel tungsten tantalum oxide may have various compositions when used as a counter electrode material. In certain embodiments, particular balances may be made between the various components of the NiWTaO. For instance, an atomic ratio of Ni:(W+Ta) in the material may fall between about 1.5:1 and 3:1, for example between about 1.5:1 and 2.5:1, or between about 2:1 and 2.5:1. In a particular example the atomic ratio of Ni:(W+Ta) is between about 2:1 and 3:1. The atomic ratio of Ni:(W+Ta) relates to the ratio of (i) nickel atoms in the material to (ii) the sum of the number of tungsten and tantalum atoms in the material. The nickel tungsten tantalum oxide material may also have a particular atomic ratio of W:Ta. In certain embodiments, the atomic ratio of W:Ta is between about 0.1:1 and 6:1, for example between about 0.2:1 and 5:1, or between about 1:1 and 3:1, or between about 1.5:1 and 2.5:1, or between about 1.5:1 and 2:1. In some cases the atomic ratio of W:Ta is between about 0.2:1 and 1:1, or between about 1:1 and 2:1, or between about 2:1 and 3:1, or between about 3:1 and 4:1, or between about 4:1 and 5:1. In some implementations, particular atomic ratios of Ni:(W+Ta) and W:Ta are used. All combinations of disclosed Ni:(W+Ta) compositions and disclosed W:Ta compositions are contemplated, though only certain combinations are explicitly listed herein. For instance, the atomic ratio of Ni:(W+Ta) may be between about 1.5:1 and 3:1, where the atomic ratio of W:Ta is between about 1.5:1 and 3:1. In another example, the atomic ratio of Ni:(W+Ta) may be between about 1.5:1 and 2.5:1, where the atomic ratio of W:Ta is between about 1.5:1 and 2.5:1. In a further example, the atomic ratio of Ni:(W+Ta) may be between about 2:1 and 2.5:1, where the atomic ratio of W:Ta is between about 1.5:1 and 2:1, or between about 0.2:1 and 1:1, or between about 1:1 and 2:1, or between about 4:1 and 5:1.

In some embodiments, nickel tungsten niobium oxide (NiWNbO) is used as a counter electrode material in the counter electrode layer. The nickel tungsten niobium oxide may have various compositions when used as an anodically coloring material. In certain embodiments, particular balances may be made between the various components of the NiWNbO. For instance, an atomic ratio of Ni:(W+Nb) in the material may fall between about 1.5:1 and 3:1, for example between about 1.5:1 and 2.5:1, or between about 2:1 and 2.5:1. In a particular example the atomic ratio of Ni:(W+Nb) is between about 2:1 and 3:1. The atomic ratio of Ni:(W+Nb) relates to the ratio of (i) nickel atoms in the material to (ii) the sum of the number of tungsten and niobium atoms in the material. The nickel tungsten niobium oxide material may also have a particular atomic ratio of W:Nb. In certain embodiments, the atomic ratio of W:Nb is between about 0.1:1 and 6:1, for example between about 0.2:1 and 5:1, or between about 1:1 and 3:1, or between about 1.5:1 and 2.5:1, or between about 1.5:1 and 2:1. In some cases the atomic ratio of W:Nb is between about 0.2:1 and 1:1, or between about 1:1 and 2:1, or between about 2:1 and 3:1, or between about 3:1 and 4:1, or between about 4:1 and 5:1. In some implementations, particular atomic ratios of Ni:(W+Nb) and W:Nb are used. All combinations of disclosed Ni:(W+Nb) compositions and disclosed W:Nb compositions are contemplated, though only certain combinations are explicitly listed herein. For instance, the atomic ratio of Ni:(W+Nb) may be between about 1.5:1 and 3:1, where the atomic ratio of W:Nb is between about 1.5:1 and 3:1. In another example, the atomic ratio of Ni:(W+Nb) may be between about 1.5:1 and 2.5:1, where the atomic ratio of W:Nb is between about 1.5:1 and 2.5:1. In a further example, the atomic ratio of Ni:(W+Nb) may be between about 2:1 and 2.5:1, where the atomic ratio of W:Nb is between about 1.5:1 and 2:1, or between about 0.2:1 and 1:1, or between about 1:1 and 2:1, or between about 4:1 and 5:1.

In some embodiments, nickel tungsten tin oxide (NiWSnO) is used in the counter electrode layer. The nickel tungsten tin oxide may have various compositions when used as an anodically coloring material. In certain embodiments, particular balances may be made between the various components of the NiWSnO. For instance, an atomic ratio of Ni:(W+Sn) in the material may fall between about 1:1 and 4:1, for example between about 1:1 and 3:1, or between about 1.5:1 and 3:1, or between about 1.5:1 and 2.5:1, or between about 2:1 and 2.5:1. In a particular example the atomic ratio of Ni:(W+Sn) is between about 2:1 and 3:1. The atomic ratio of Ni:(W+Sn) relates to the ratio of (i) nickel atoms in the material to (ii) the sum of the number of tungsten and tin atoms in the material. The nickel tungsten tin oxide material may also have a particular atomic ratio of W:Sn. In certain embodiments, the atomic ratio of W:Sn is between about 1:9 and 9:1, for example between about 1:1 and 3:1, or between about 1.5:1 and 2.5:1, or between about 1.5:1 and 2:1. In some implementations, particular atomic ratios of Ni:(W+Sn) and W:Sn are used. For instance, the atomic ratio of Ni:(W+Sn) may be between about 1:1 and 3:1, where the atomic ratio of W:Sn is between about 1:1 and 3:1. In another example, the atomic ratio of Ni:(W+Sn) may be between about 1.5:1 and 2.5:1, where the atomic ratio of W:Sn is between about 1.5:1 and 2.5:1. In a further example, the atomic ratio of Ni:(W+Sn) may be between about 2:1 and 2.5:1, where the atomic ratio of W:Sn is between about 1.5:1 and 2:1.

When charge is removed from a counter electrode 110 made of nickel tungsten oxide (i.e., ions are transported from the counter electrode 110 to the electrochromic layer 106), the counter electrode layer will turn from a transparent state to a brown colored state. Other electrochromically active counter electrode materials may exhibit similar or other colors upon ion removal.

As discussed above with respect to the electrochromic layer, the counter electrode layer may be deposited to include two or more materials (e.g., deposited as a bilayer, graded layer, or other combination of layers) having different compositions. In a number of these embodiments, one of the counter electrode materials may provide electrochromic properties, and the other counter electrode material may act as a precursor for a material that is ion conducting and substantially electronically insulating. Typically, a material that acts as a precursor for a material that is ion conducting and substantially electronically insulating, when present, will be formed in contact with the electrochromic material. In cases where the electrochromic layer is formed prior to the counter electrode layer, the counter electrode material that acts as a precursor to the ion conducting and substantially electronically insulating material may be deposited as a first layer or lower portion of the counter electrode layer. The counter electrode material that exhibits electrochromism may then be provided as the second layer or upper portion of the counter electrode layer. In cases where the counter electrode layer is deposited prior to the electrochromic layer, the first layer or lower portion of the counter electrode may be formed of the counter electrode material that exhibits electrochromism, and the second layer or upper portion of the counter electrode may be formed of the counter electrode material that acts as a precursor for the material that is ion conducting and substantially electronically insulating.

In one example, the counter electrode is deposited to include two materials that have different oxygen contents. For instance, the counter electrode layer may include two different forms of nickel oxide, or two different forms of nickel tungsten oxide, or two different forms of nickel tungsten tantalum oxide, or two different forms of nickel tungsten niobium oxide, or two different forms of nickel tungsten tin oxide, etc., where the two different forms of the counter electrode material have different oxygen concentrations. One form of the counter electrode material may exhibit electrochromism, and may have relatively less oxygen. The other form of the counter electrode material may or may not exhibit electrochromism, may act as a precursor for a material that is ion conducting and substantially electronically insulating, and may have relatively more oxygen. The counter electrode material that has relatively more oxygen and acts as a precursor for the ion conducting and substantially electronically insulating material may be superstoichiometric with respect to oxygen. Details provided herein regarding differences in oxygen content between different layers or portions of the electrochromic or counter electrode layers may apply regardless of whether there are other compositional differences (e.g., different metals) between the two layers or portions in question.

In certain embodiments, the counter electrode may be deposited to include two or more materials that have different metal compositions. For example, a first counter electrode material may include one or more metal that is not present in the second counter electrode material. Likewise, the second counter electrode material may include one or more metal that is not present in the first counter electrode material. Example first counter electrode materials include, but are not limited to, nickel oxide, nickel tungsten oxide, nickel tungsten tantalum oxide, nickel tungsten tin oxide, and nickel tungsten niobium oxide. Example second counter electrode materials likewise include, but are not limited to, nickel oxide, nickel tungsten oxide, nickel tungsten tantalum oxide, nickel tungsten tin oxide, and nickel tungsten niobium oxide. A few example combinations are provided, but are not intended to be limiting. In one example, the first counter electrode material is nickel tungsten oxide and the second counter electrode material is nickel oxide. In another example, the first counter electrode material is nickel tungsten tantalum oxide and the second counter electrode material is nickel tungsten oxide. In another example, the first counter electrode material is nickel tungsten tin oxide and the second counter electrode material is nickel tungsten oxide. In another example, the first counter electrode material is nickel tungsten niobium oxide and the second counter electrode material is nickel tungsten oxide. Any of these examples can be modified to include different first/second counter electrode materials.

The counter electrode morphology may be crystalline, amorphous, or some mixture thereof. Crystalline phases may be nanocrystalline. In some embodiments, the counter electrode material is amorphous or substantially amorphous. Various substantially amorphous counter electrodes have been found to perform better, under some conditions, in comparison to their crystalline counterparts. The amorphous state of the counter electrode oxide material may be obtained through the use of certain processing conditions, described below. While not wishing to be bound to any theory or mechanism, it is believed that certain amorphous counter electrode oxides are produced by relatively low energy atoms in the sputtering process. Low energy atoms are obtained, for example, in a sputtering process with lower target powers, higher chamber pressures (i.e., lower vacuum), and/or larger source to substrate distances. Amorphous films are also more likely to form where there is a relatively higher fraction/concentration of heavy atoms (e.g., W). Under the described process conditions, films with better stability under UV/heat exposure are produced. Substantially amorphous materials may have some crystalline, typically but not necessarily nanocrystalline, material dispersed in the amorphous matrix.

In embodiments where the counter electrode is deposited to include two or more different materials, the different materials may each independently include microcrystalline, nanocrystalline, and/or amorphous phases. In one example, a first layer or lower portion of the counter electrode layer is microcrystalline or nanocrystalline and a second layer or upper portion of the counter electrode layer is amorphous. In another example, the first layer or lower portion of the counter electrode layer is amorphous and a second layer or upper portion of the counter electrode layer is microcrystalline or nanocrystalline. In another example, both the first layer/lower portion and the second layer/upper portion of the counter electrode layer are microcrystalline or nanocrystalline. In another example, both the first layer/lower portion and the second layer/upper portion of the counter electrode layer are amorphous.

In some embodiments, the counter electrode morphology may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm).

In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter.

It has been found that counter electrodes that include an amorphous matrix tend to operate more efficiently compared to counter electrodes that are relatively more crystalline. In certain embodiments, an additive may form a host matrix in which domains of a base anodically coloring material may be found. In various cases, the host matrix is substantially amorphous. In certain embodiments, the only crystalline structures in the counter electrode are formed from a base anodically coloring electrochromic material in, e.g., oxide form. One example of a base anodically coloring electrochromic material in oxide form is nickel tungsten oxide. Additives may contribute to forming an amorphous host matrix that is not substantially crystalline, but which incorporates domains (e.g., nanocrystals in some cases) of the base anodically coloring electrochromic material. Example additives include, but are not limited to, tin, tantalum, and niobium. In other embodiments, the additive and the anodically coloring base material together form a chemical compound with covalent and/or ionic bonding. The compound may be crystalline, amorphous, or a combination thereof. In other embodiments, the anodically coloring base material forms a host matrix in which domains of the additive exist as discrete phases or pockets. For example certain embodiments include an amorphous counter electrode having an amorphous matrix of a first material, with a second material, also amorphous, distributed throughout the first material in pockets, for example, pockets of the diameters described herein for crystalline materials distributed throughout an amorphous matrix.

In some embodiments, the thickness of the counter electrode is about 50 nm about 650 nm. In some embodiments, the thickness of the counter electrode is about 100 nm to about 400 nm, preferably in the range of about 200 nm to 300 nm.

The amount of ions held in the counter electrode layer during the bleached state (and correspondingly in the electrochromic layer during the colored state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the electrochromic layer has a charge capacity of between about 30 and about 150 $mC/cm^2/micron$. In another embodiment, the electrochromic layer has a charge capacity of between about 50 and about 100 $mC/cm^2/micron$. In one embodiment, the counter electrode layer has a charge capacity of between about 75 and about 200 mC/cm²/micron. In another embodiment, the counter electrode layer has a charge capacity of between about 100 and about 150 mC/cm²/micron.

E. Ion Conducting Layer

In various embodiments such as the one shown in FIG. 1, an ion conductor layer 108 is provided between the electrochromic layer 106 and the counter electrode layer 110. In such cases, an ion conductor material is deposited in a conventional sense, e.g., atop the electrochromic layer via e.g., sputtering, evaporation, sol-gel techniques, and the like, followed by deposition of the counter electrode material. In other embodiments, a conventional ion conductor layer may be omitted. In such cases, the electrochromic layer and the counter electrode layer may be deposited in direct contact with one another, and an ion conducting material formed in situ at the interface between these two layers may serve the purpose of a conventional ion conductor layer. Electrochromic device precursors may include the stack of aforementioned layers prior to the in situ formation of the ion conductor material. Each of these embodiments will be discussed in turn.

i. Embodiments Utilizing a Separately Deposited Ion Conducting Layer

As shown in FIG. 1, in between electrochromic layer 106 and counter electrode layer 110, there is an ion conducting layer 108. Ion conducting layer 108 serves as a medium through which ions are transported (in the manner of an electrolyte) when the electrochromic device transforms between the bleached state and the colored state. Preferably, ion conducting layer 108 is highly conductive to the relevant ions for the electrochromic and the counter electrode layers, but has sufficiently low electron conductivity that negligible electron transfer takes place during normal operation. A thin ion conducting layer with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about 10⁸ Siemens/cm or ohm⁻¹cm⁻¹ and about 10⁹ Siemens/cm or ohm⁻¹cm⁻¹ and an electronic resistance of about 10¹¹ ohms-cm.

Examples of suitable materials for the lithium ion conductor layer include lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and other ceramic materials that allow lithium ions to pass through them while having a high electrical resistance (blocking electron movement therethrough). Any material, however, may be used for the ion conducting layer 108 provided it can be fabricated with low defectivity and it allows for the passage of ions between the counter electrode layer 110 to the electrochromic layer 106 while substantially preventing the passage of electrons.

In certain embodiments, the ion conducting layer is crystalline, nanocrystalline, or amorphous. Typically, the ion conducting layer is amorphous. In another embodiment, the ion conducting layer is nanocrystalline. In yet another embodiment, the ion conducting layer is crystalline.

In some embodiments, a silicon-aluminum-oxide (SiAlO) is used for the ion conducting layer 108. In a specific embodiment, a silicon/aluminum target used to fabricate the ion conductor layer via sputtering contains between about 6 and about 20 atomic % aluminum. This defines the ratio of silicon to aluminum in the ion conducting layer. In some embodiments, the silicon-aluminum-oxide ion conducting layer 108 is amorphous.

The thickness of the ion conducting layer 108 may vary depending on the material. In some embodiments, the ion conducting layer 108 is about 5 nm to 100 nm thick, preferably about 10 nm to 60 nm thick. In some embodiments, the ion conducting layer is about 15 nm to 40 nm thick or about 25 nm to 30 nm thick.

Ions transported across the ion conducting layer between the electrochromic layer and the counter electrode layer serve to effect a color change in the electrochromic layer (i.e., change the electrochromic device from the bleached state to the colored state). Depending on the choice of materials for the electrochromic device stack, such ions include lithium ions ($Li^+$) and hydrogen ions ($H^+$) (i.e., protons). As mentioned above, other ions may be employed in certain embodiments. These include deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). ii. Embodiments Omitting a Separately Deposited Ion Conducting Layer In most conventional electrochromic devices, the ion conducting layer is deposited as a distinct material in a distinct deposition step to provide separation between the electrochromic layer and the counter electrode layer. However, in certain embodiments herein, the ion conducting layer may be omitted. In such cases, the electrochromic material of the electrochromic layer may be deposited in direct physical contact with the counter electrode material of the counter electrode layer. An interfacial region between the electrochromic layer and the counter electrode layer may form and serve the function of an ion conductor layer (e.g., allowing passage of ions but not electrons between the electrochromic layer and the counter electrode layer), without the need to ever deposit this layer as a distinct material. This simplifies formation of the electrochromic device, since there is no need to provide a separate deposition step for forming the ion conductor layer.

In such embodiments, one or both of the electrochromic layer and counter electrode layer may be deposited to include a portion that is oxygen-rich compared to the remaining portion of the layer. The oxygen-rich portion may be superstoichiometric with respect to oxygen. Typically, the oxygen-rich portion is in contact with the other type of layer. For instance, an electrochromic stack may include a counter electrode material in contact with an electrochromic material, where the electrochromic material includes an oxygen-rich portion in direct physical contact with the counter electrode material. In another example, an electrochromic stack includes a counter electrode material in contact with an electrochromic material, where the counter electrode material includes an oxygen-rich portion in direct physical contact with the electrochromic material. In a further example, both the electrochromic material and the counter electrode material each include an oxygen-rich portion, where the oxygen-rich portion of the electrochromic material is in direct physical contact with the oxygen-rich portion of the counter electrode material.

The oxygen-rich portions of these materials may be provided as distinct layers. For instance, an electrochromic and/or counter electrode material may include a first layer that is oxygen-rich and a second layer that is not oxygen-rich (or has relatively less oxygen in comparison to the first layer). Unless otherwise specified, as used herein the term "oxygen-rich" refers to a material that is superstoichiometric with respect to oxygen. Further, a material that is "oxygen-rich" in comparison to a second material has a higher degree of superstoichiometric oxygen compared to the second material. In some examples, the electrochromic layer includes two layers of tungsten titanium molybdenum oxide, where a second layer of tungsten titanium molybdenum oxide is oxygen-rich in comparison to the first layer of tungsten titanium molybdenum oxide. The second layer of tungsten titanium molybdenum oxide may be superstoichiometric with respect to oxygen. The second layer of tungsten titanium molybdenum oxide may be in direct physical contact with the counter electrode layer and with the first layer of tungsten titanium molybdenum oxide. The counter electrode layer may be homogeneous, or it may also include an oxygen-rich portion, as noted above.

The oxygen-rich portion of the layers may also be provided in a graded layer. For example, the electrochromic and/or counter electrode material may include a gradient in oxygen concentration, the gradient being in a direction normal to the surface of the layers. In some examples, the electrochromic layer is a graded layer of tungsten titanium molybdenum oxide, having a graded oxygen concentration in a direction normal to the surface of the layer. For instance, the highest oxygen concentration in the graded tungsten titanium molybdenum oxide layer may be proximate the counter electrode layer. The counter electrode layer may be homogeneous, or it may also include an oxygen-rich portion, as noted above.

Embodiments where the ion conductor layer deposition step is omitted and the counter electrode material is deposited in direct contact with the electrochromic material are further discussed in the following U.S. Patents, each of which is herein incorporated by reference in its entirety: U.S. Pat. Nos. 8,300,298, 8,764,950, and 9,261,751.

F. Additional Layers

The electrochromic device 100 may include one or more additional layers (not shown in FIG. 1) such as one or more passive layers. Passive layers used to improve certain optical properties may be included in electrochromic device 100. Passive layers for providing moisture or scratch resistance may also be included in the electrochromic device 100. For example, the conductive layers may be treated with anti-reflective or protective oxide or nitride layers. Other passive layers may serve to hermetically seal the electrochromic device 100. One or more defect-mitigating insulating layers may also be present to minimize the number of defects in the device, as discussed in U.S. patent application Ser. No. 13/763,505, filed Feb. 8, 2013, and titled "DEFECT-MITIGATION LAYERS IN ELECTROCHROMIC DEVICES," which is herein incorporated by reference in its entirety.

II. Methods of Fabricating Electrochromic Devices and Precursors

Formation of electrochromic devices and electrochromic device precursors involves deposition of a number of different layers on a substrate. Each of these layers is discussed above. A number of other steps may also be taken when fabricating an electrochromic device or precursor, as described in FIG. 2A, for example.

As used herein, an electrochromic device precursor is a partially fabricated electrochromic device which is not yet suitable for functioning as a finished electrochromic device. Typically, an electrochromic device precursor includes at least a first conductive layer, an electrochromic layer, a counter electrode layer, and a second conductive layer. Additional layers may be present in some cases. In some embodiments, an electrochromic device precursor has materials within its structure that, although not suitable for function as a finished device, are configured or suited for physical and/or chemical conversion to become a functioning device. Such device precursors may be desirable, e.g., in cases where substrates are coated with the precursor materials, stored or shipped to another facility, for later and/or downstream processing.

For instance, a separate ion conducting layer may not be present in certain embodiments. In cases where the ion conducting layer is omitted, the electrochromic device precursor may lack any layer or region that would serve the purpose of an ion conducting layer (e.g., allowing passage of ions but not electrons between the electrochromic layer and the counter electrode layer). An electrochromic device precursor can be further processed to form an electrochromic device. In cases where the ion conducting layer is omitted, this further processing may form a material that is ionically conductive and substantially electronically insulating in an interfacial region between the electrochromic layer and the counter electrode layer. In various embodiments, this further processing may involve thermal conditioning, as described further below. In certain embodiments, one or both of the electrochromic and counter electrode material are superstoichiometrically oxygenated at the interface of the layers, or otherwise an excess of oxygen or other reactive species is present between the layers. The superstoichiometrically oxygenated material may later be converted to the material that is ionically conductive and substantially electronically insulating. In these or other embodiments, further processing may involve lithiation of one or more layers in the electrochromic device, either through direct lithium deposition or through diffusion. For example, the lithium added reacts or otherwise combines with the oxygen or other reactive species at the interface to form an ion conducting and electronically insulating material at the interface between the electrochromic and counter electrode material layers. In these or other embodiments, this further processing may involve flowing current between electrochromic and counter electrode layers. Any one or more of these further processing steps may be involved in formation of an electrochromic device from an electrochromic device precursor in certain implementations.

Figure 2A:
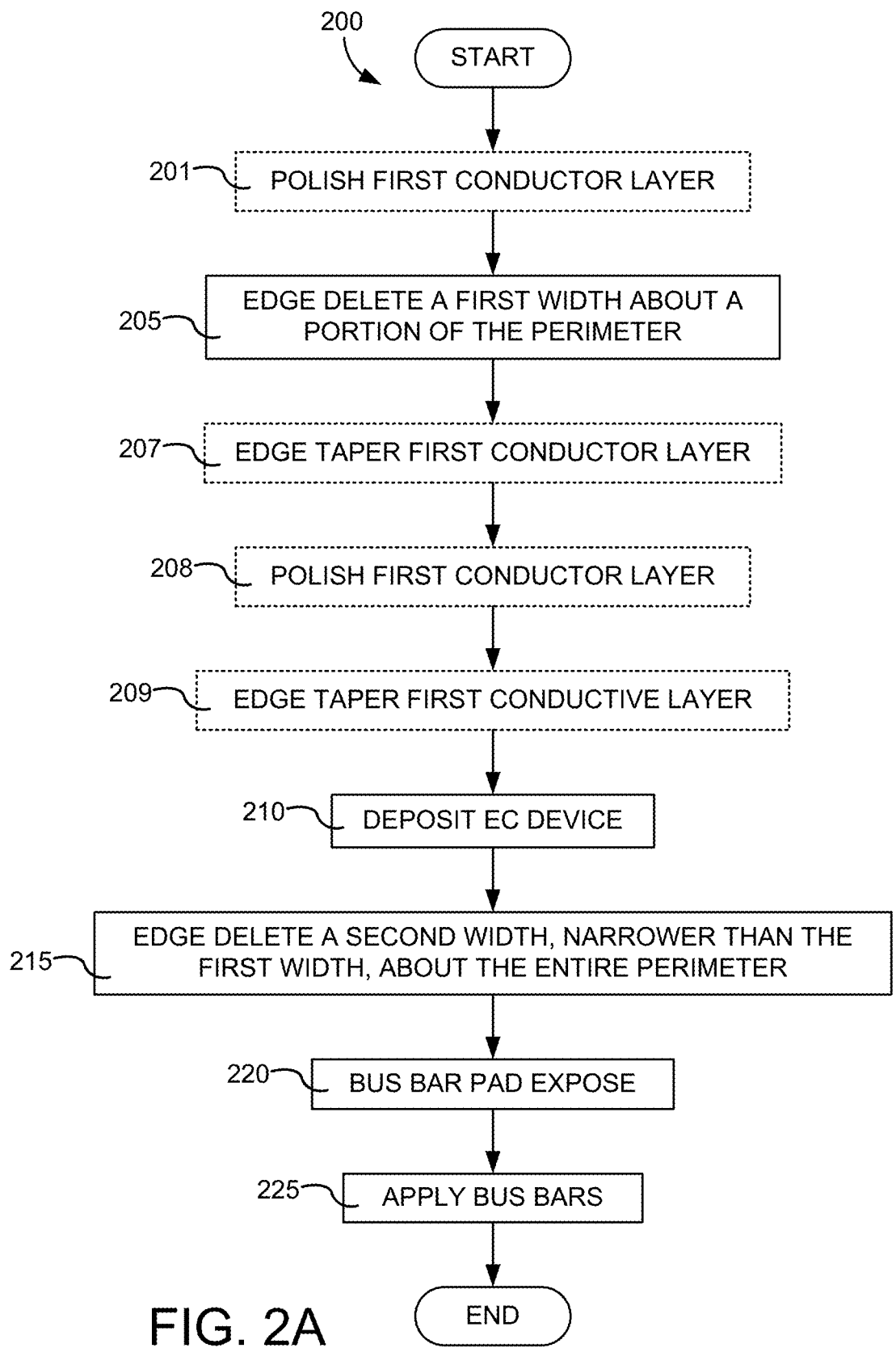
FIG. 2A is a flowchart of a process flow describing aspects of a method of fabricating an electrochromic device, according to embodiments.
Figure 2B:
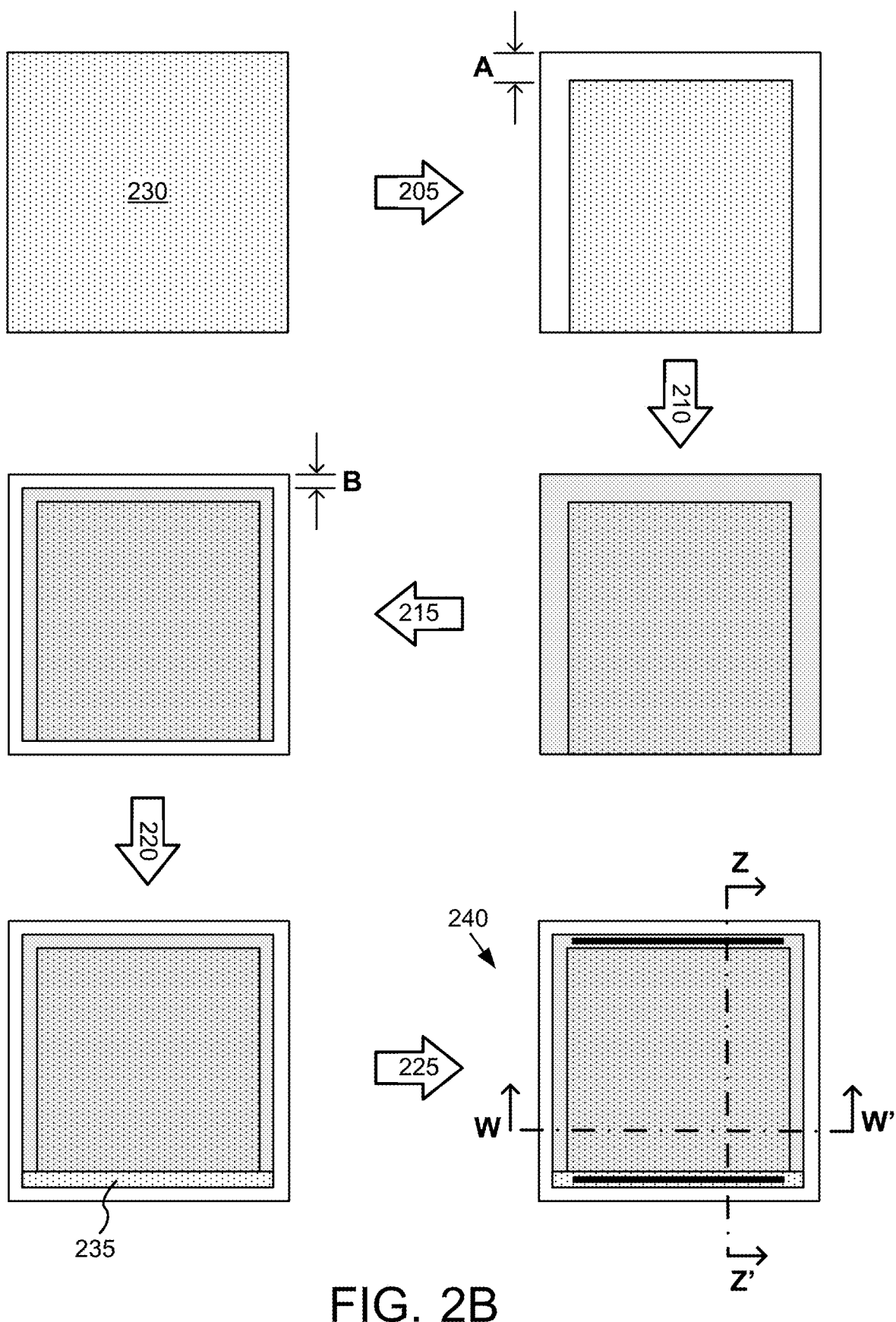
FIG. 2B are top views depicting steps in the process flow described in relation to FIG. 2A.
Figure 2C:
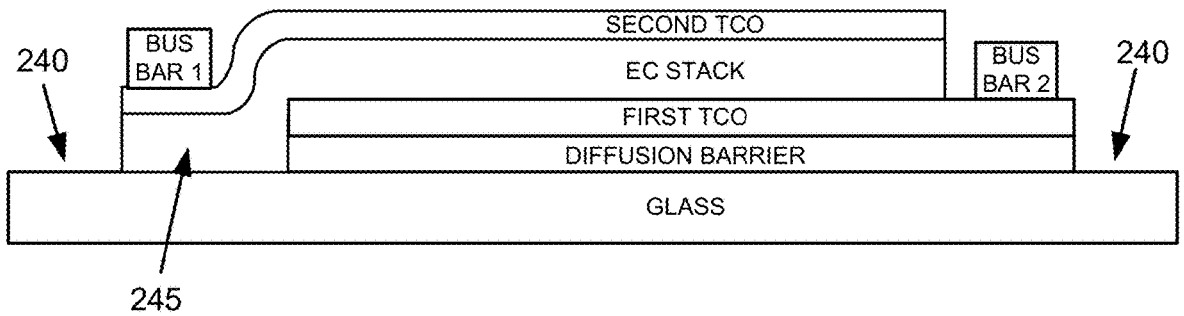
FIG. 2C depicts cross-sections of the electrochromic lite described in relation to FIG. 2B.
Figure 2C:
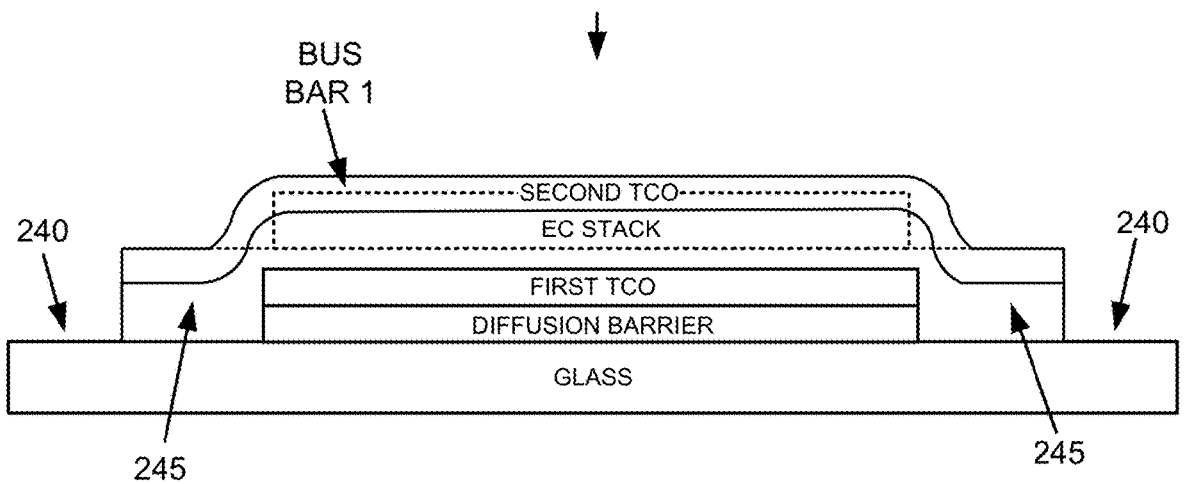

FIG. 2A is a process flow, 200, describing aspects of a method of fabricating an electrochromic device or other optical device having opposing bus bars, each applied to one of the conductive layers of the optical device. The dotted lines denote optional steps in the process flow. An exemplary device, 240, as described in relation to FIGS. 2B-C, is used to illustrate the process flow. FIG. 2B provides top views depicting the fabrication of device 240 including numerical indicators of process flow 200 as described in relation to FIG. 2A. FIG. 2C shows cross-sections of the lite including device 240 described in relation to FIG. 2B. Device 240 is a rectangular device, but process flow 200 applies to any shape of optical device having opposing bus bars, each on one of the conductive layers.

Referring to FIGS. 2A and 2B, after receiving a substrate with a first conductive layer thereon, process flow 200 begins with an optional polishing of the first conductive layer, see 201. Polishing, if performed, may be done prior to an edge deletion, see 205, and/or after an edge deletion in the process flow.

Referring again to FIG. 2A, if polishing 201 is not performed, process 200 begins with edge deleting a first width about a portion of the perimeter of the substrate, see 205. The edge deletion may remove only the first conductive layer or may also remove a diffusion barrier, if present. In one embodiment, the substrate is glass and includes a sodium diffusion barrier and a transparent conducting layer thereon, e.g. a tin-oxide based transparent metal oxide conducting layer. The dotted area in FIG. 2B denotes the first conductive layer. Thus, after edge deletion according to process 205, a width A is removed from three sides of the perimeter of substrate 230. This width is typically, but not necessarily, a uniform width. A second width, B, is described below. Where width A and/or width B are not uniform, then their relative magnitudes with respect to each other are in terms of their average width.

As a result of the removal of the first width A at 205, there is a newly exposed edge of the lower conductive layer. In certain embodiments, at least a portion of this edge of the first conductive layer may be optionally tapered, see 207 and 209. The underlying diffusion barrier layer may also be tapered. Tapering the edge of one or more device layers, prior to fabricating subsequent layers thereon, has unexpected advantages in device structure and performance. The edge tapering process is described in more detail in U.S. Pat. No. 9,454,053, which is herein incorporated by reference in its entirety. Although edge tapering is shown at both 207 and 209 in FIG. 2A, if performed, edge tapering would typically be performed once (e.g., at 207 or 209).

In certain embodiments, the lower conductive layer is optionally polished before or after edge tapering, see 208.

After removal of the first width A, and optional polishing and/or optional edge tapering as described above, the EC device is deposited over the surface of substrate 230, see 210. This EC stack deposition is further described in relation to FIG. 2D. This deposition includes one or more material layers of the optical device and the second conducting layer, e.g. a transparent conducting layer such as indium tin oxide (ITO). The depicted coverage is the entire substrate, but there could be some masking due to a carrier that must hold the glass in place. In one embodiment, the entire area of the remaining portion of the first conductive layer is covered including overlapping the first conductor about the first width A previously removed. This allows for overlapping regions in the final device architecture.

In particular embodiments, electromagnetic radiation is used to perform edge deletion and provide a peripheral region of the substrate, e.g., to remove transparent conductive layer or more layers (up to and including the top conductive layer and any vapor barrier applied thereto), depending upon the process step. In one embodiment, the edge deletion is performed at least to remove material including the transparent conductive layer on the substrate, and optionally also removing a diffusion barrier if present. In certain embodiments, edge deletion is used to remove a surface portion of the substrate, e.g., float glass, and may go to a depth not to exceed the thickness of the compression zone. Edge deletion is performed, e.g., to create a good surface for sealing by at least a portion of the primary seal and the secondary seal of the IGU. For example, a transparent conductive layer can sometimes lose adhesion when the conductive layer spans the entire area of the substrate and thus has an exposed edge, despite the presence of a secondary seal. Also, it is believed that when metal oxide and other functional layers have such exposed edges, they can serve as a pathway for moisture to enter the bulk device and thus compromise the primary and secondary seals.

Edge deletion is described herein as being performed on a substrate that is already cut to size. However, edge deletion can be done before a substrate is cut from a bulk glass sheet in other disclosed embodiments. For example, non-tempered float glass may be cut into individual lites after an EC device is patterned thereon. Methods described herein can be performed on a bulk sheet and then the sheet cut into individual EC lites. In certain embodiments, edge deletion may be carried out in some edge areas prior to cutting the EC lites, and again after they are cut from the bulk sheet. In certain embodiments, all edge deletion is performed prior to excising the lites from the bulk sheet. In embodiments employing "edge deletion" prior to cutting the panes, portions of the coating on the glass sheet can be removed in anticipation of where the cuts (and thus edges) of the newly formed EC lites will be. In other words, there is no actual substrate edge yet, only a defined area where a cut will be made to produce an edge. Thus "edge deletion" is meant to include removing one or more material layers in areas where a substrate edge is anticipated to exist. Methods of fabricating EC lites by cutting from a bulk sheet after fabrication of the EC device thereon are described in U.S. patent application Ser. No. 12/941,882 (now U.S. Pat. No. 8,164,818), filed Nov. 8, 2010, and U.S. patent application Ser. No. 13/456,056, filed Apr. 25, 2012, each titled "Electrochromic Window Fabrication Methods" each of which is hereby incorporated by reference in its entirety. One of ordinary skill in the art would appreciate that if one were to carry out methods described herein on a bulk glass sheet and then cut individual lites therefrom, in certain embodiments masks may have to be used, whereas when performed on a lite of desired end size, masks are optional.

Exemplary electromagnetic radiation includes UV, lasers, and the like. For example, material may be removed with directed and focused energy at one or more of the wavelengths 248 nm, 355 nm (UV), 1030 nm (IR, e.g. disk laser), 1064 nm (e.g. Nd:YAG laser), and 532 nm (e.g. green laser). Laser irradiation is delivered to the substrate using, e.g. optical fiber or open beam path. The ablation can be performed from either the substrate side or the EC film side depending on the choice of the substrate handling equipment and configuration parameters. The energy density required to ablate the film thickness is achieved by passing the laser beam through an optical lens. The lens focuses the laser beam to the desired shape and size. In one embodiment, a "top hat" beam configuration is used, e.g., having a focus area of between about 0.005 $mm^2$ to about 2 $mm^2$. In one embodiment, the focusing level of the beam is used to achieve the required energy density to ablate the EC film stack. In one embodiment, the energy density used in the ablation is between about 2 $J/cm^2$ and about 6 $J/cm^2$.

During a laser edge delete process, a laser spot is scanned over the surface of the EC device, along the periphery. In one embodiment, the laser spot is scanned using a scanning F theta lens. Homogeneous removal of the EC film is achieved, e.g., by overlapping the spots' area during scanning. In one embodiment, the overlap is between about 5% and about 100%, in another embodiment between about 10% and about 90%, in yet another embodiment between about 10% and about 80%. Various scanning patterns may be used, e.g., scanning in straight lines, curved lines, and various patterns may be scanned, e.g., rectangular or other shaped sections are scanned which, collectively, create the peripheral edge deletion area. In one embodiment the scanning lines (or "pens," i.e. lines created by adjacent or overlapping laser spots, e.g. square, round, etc.) are overlapped at the levels described above for spot overlap. That is, the area of the ablated material defined by the path of the line previously scanned is overlapped with later scan lines so that there is overlap. That is, a pattern area ablated by overlapping or adjacent laser spots is overlapped with the area of a subsequent ablation pattern. For embodiments where overlapping is used, spots, lines or patterns, a higher frequency laser, e.g. in the range of between about 11 KHz and about 500 KHz, may be used. In order to minimize heat related damage to the EC device at the exposed edge (a heat affected zone or "HAZ"), shorter pulse duration lasers are used. In one example, the pulse duration is between about 100 fs (femtosecond) and about 100 ns (nanosecond), in another embodiment the pulse duration is between about 1 ps (picosecond) and about 50 ns, in yet another embodiment the pulse duration is between about 20 ps and about 30 ns. Pulse duration of other ranges can be used in other embodiments.

Referring again to FIGS. 2A and 2B, process flow 200 continues with removing a second width, B, narrower than the first width A, about substantially the entire perimeter of the substrate, see 215. This may include removing material down to the glass or to a diffusion barrier, if present. After process flow 200 is complete up to 215, e.g. on a rectangular substrate as depicted in FIG. 2B, there is a perimeter area, with width B, where there is none of the first transparent conductor, the one or more material layers of the device, or the second conducting layer—removing width B has exposed diffusion barrier or substrate. Within this perimeter area is the device stack, including the first transparent conductor surrounded on three sides by overlapping one or more material layers and the second conductive layer. On the remaining side (e.g., the bottom side in FIG. 2B) there is no overlapping portion of the one or more material layers and the second conductive layer. It is proximate this remaining side (e.g., bottom side in FIG. 2B) that the one or more material layers and the second conductive layer are removed in order to expose a portion (bus bar pad expose, or "BPE"), 235, of the first conductive layer, see 220. The BPE 235 need not run the entire length of that side, it need only be long enough to accommodate the bus bar and leave some space between the bus bar and the second conductive layer so as not to short on the second conductive layer. In one embodiment, the BPE 235 spans the length of the first conductive layer on that side.

In various embodiments, a BPE is where a portion of the material layers are removed down to the lower electrode or other conductive layer (e.g. a transparent conducting oxide layer), in order to create a surface for a bus bar to be applied and thus make electrical contact with the electrode. The bus bar applied can be a soldered bus bar, and ink bus bar and the like. A BPE typically has a rectangular area, but this is not necessary; the BPE may be any geometrical shape or an irregular shape. For example, depending upon the need, a BPE may be circular, triangular, oval, trapezoidal, and other polygonal shapes. The shape may be dependent on the configuration of the EC device, the substrate bearing the EC device (e.g. an irregular shaped window), or even, e.g., a more efficient (e.g. in material removal, time, etc.) laser ablation pattern used to create it. In one embodiment, the BPE spans at least about 50% of the length of one side of an EC device. In one embodiment, the BPE spans at least about 80% of the length of one side of an EC device. Typically, but not necessarily, the BPE is wide enough to accommodate the bus bar, but should allow for some space at least between the active EC device stack and the bus bar. In one embodiment, the BPE is substantially rectangular, the length approximating one side of the EC device and the width is between about 5 mm and about 15 mm, in another embodiment between about 5 mm and about 10 mm, and in yet another embodiment between about 7 mm and about 9 mm. As mentioned, a bus bar may be between about 1 mm and about 5 mm wide, typically about 3 mm wide.

As mentioned, the BPE is fabricated wide enough to accommodate the bus bar's width and also leave space between the bus bar and the EC device (as the bus bar is only supposed to touch the lower conductive layer). The bus bar width may exceed that of the BPE (and thus there is bus bar material touching both the lower conductor and glass (and/or diffusion barrier) on area 241), as long as there is space between the bus bar and the EC device (in embodiments where there is an L3 isolation scribe, the bus bar may contact the deactivated portion). In embodiments where the bus bar width is fully accommodated by the BPE, that is, the bus bar is entirely atop the lower conductor, the outer edge, along the length, of the bus bar may be aligned with the outer edge of the BPE, or inset by about 1 mm to about 3 mm. Likewise, the space between the bus bar and the EC device is between about 1 mm and about 3 mm, in another embodiment between about 1 mm and 2 mm, and in another embodiment about 1.5 mm. Formation of BPEs is described in more detail below, with respect to an EC device having a lower electrode that is a TCO. This is for convenience only, the electrode could be any suitable electrode for an optical device, transparent or not.

To make a BPE, an area of the bottom TCO (e.g. first TCO) is cleared of deposited material so that a bus bar can be fabricated on the TCO. In one embodiment, this is achieved by laser processing which selectively removes the deposited film layers while leaving the bottom TCO exposed in a defined area at a defined location. In one embodiment, the absorption characteristics of the bottom electrode and the deposited layers are exploited in order to achieve selectivity during laser ablation, that is, so that the EC materials on the TCO are selectively removed while leaving the TCO material intact. In certain embodiments, an upper portion (depth) of the TCO layer is also removed in order to ensure good electrical contact of the bus bar, e.g., by removing any mixture of TCO and EC materials that might have occurred during deposition. In certain embodiments, when the BPE edges are laser machined so as to minimize damage at these edges, the need for an L3 isolation scribe line to limit leakage currents can be avoided—this eliminates a process step, while achieving the desired device performance results.

In certain embodiments, the electromagnetic radiation used to fabricate a BPE is the same as described above for performing edge deletion. The (laser) radiation is delivered to the substrate using either optical fiber or the open beam path. The ablation can be performed from either glass side or the film side depending on the choice of the electromagnetic radiation wavelength. The energy density required to ablate the film thickness is achieved by passing the laser beam through an optical lens. The lens focuses the laser beam to the desired shape and size, e.g. a "top hat" having the dimensions described above, in one embodiment, having an energy density of between about 0.5 J/cm$^2$ and about 4 J/cm$^2$. In one embodiment, laser scan overlapping for BPE is done as described above for laser edge deletion. In certain embodiments, variable depth ablation is used for BPE fabrication.

In certain embodiments, e.g. due to the selective nature of the absorption in an EC film, the laser processing at the focal plane results in some amount (between about 10 nm and about 100 nm) of residue, e.g. tungsten oxide, remaining on the exposed area of the lower conductor. Since many EC materials are not as conductive as the underlying conductive layer, the bus bar fabricated on this residue does not make full contact with the underlying conductor, resulting in voltage drop across the bus bar to lower conductor interface. The voltage drop impacts coloration of the device as well as impacts the adhesion of the bus bar to the lower conductor. One way to overcome this problem is to increase the amount of energy used for film removal, however, this approach results in forming a trench at the spot overlap, unacceptably depleting the lower conductor. To overcome this problem the laser ablation above the focal plane is performed, i.e. the laser beam is defocused. In one embodiment, the defocusing profile of the laser beam is a modified top hat, or "quasi top hat." By using a defocused laser profile, the fluence delivered to the surface can be increased without damaging the underlying TCO at spot overlap region. This method minimizes the amount of residue left in on the exposed lower conductive layer and thus allows for better contact of the bus bar to the lower conductive layer.

Referring again to FIGS. 2A and 2B, after forming the BPE, bus bars are applied to the device, one on exposed area 235 of the first conductive layer (e.g., first TCO) and one on the opposite side of the device, on the second conductive layer (e.g., second TCO), on a portion of the second conductive layer that is not above the first conductive layer, see 225. This placement of the bus bar 1 on the second conductive layer avoids coloration under the bus bar and the other associated issues with having a functional device under this bus bar. In this example, there are no laser isolation scribes necessary in fabrication of the device—this is a radical departure from conventional fabrication methods, where one or more isolation scribes leave non-functional device portions remaining in the final construct.

FIG. 2B indicates cross-section cuts Z-Z' and W-W' of device 240. The cross-sectional views of device 240 at Z-Z' and W-W' are shown in FIG. 2C. The depicted layers and dimensions are not to scale, but are meant to represent functionally the configuration. In this example, the diffusion barrier was removed when width A and width B were fabricated. Specifically, perimeter area 241 is free of first conductive layer and diffusion barrier; although in one embodiment the diffusion barrier is left intact to the edge of the substrate about the perimeter on one or more sides. In another embodiment, the diffusion barrier is co-extensive with the one or more material layers and the second conductive layer (thus width A is fabricated at a depth to the diffusion barrier, and width B is fabricated to a depth sufficient to remove the diffusion barrier). In this example, there is an overlapping portion, 245, of the one or more material layers about three sides of the functional device. On one of these overlapping portions, on the second TCO, bus bar 1 is fabricated. In one embodiment, a vapor barrier layer is fabricated co-extensive with the second conductive layer. A vapor barrier is typically highly transparent, e.g. aluminum zinc oxide, a tin oxide, silicon dioxide and mixtures thereof, amorphous, crystalline or mixed amorphous-crystalline. In this embodiment, a portion of the vapor barrier is removed in order to expose the second conductive layer for bus bar 1. This exposed portion is analogous to area 235, the BPE for bus bar 2. In certain embodiments, the vapor barrier layer is also electrically conductive, and exposure of the second conductive layer need not be performed, i.e. the bus bar may be fabricated on the vapor barrier layer. For example, the vapor barrier layer may be ITO, e.g. amorphous ITO, and thus be sufficiently electrically conductive for this purpose. The amorphous morphology of the vapor barrier may provide greater hermeticity than a crystalline morphology. In certain instances, the vapor barrier may be deposited using chemical vapor deposition (CVD) or atomic layer deposition (ALD), and may include a metal nitride that is electrically conductive, a silicon nitride, a silicon oxide or mixtures thereof.

Figure 2D:
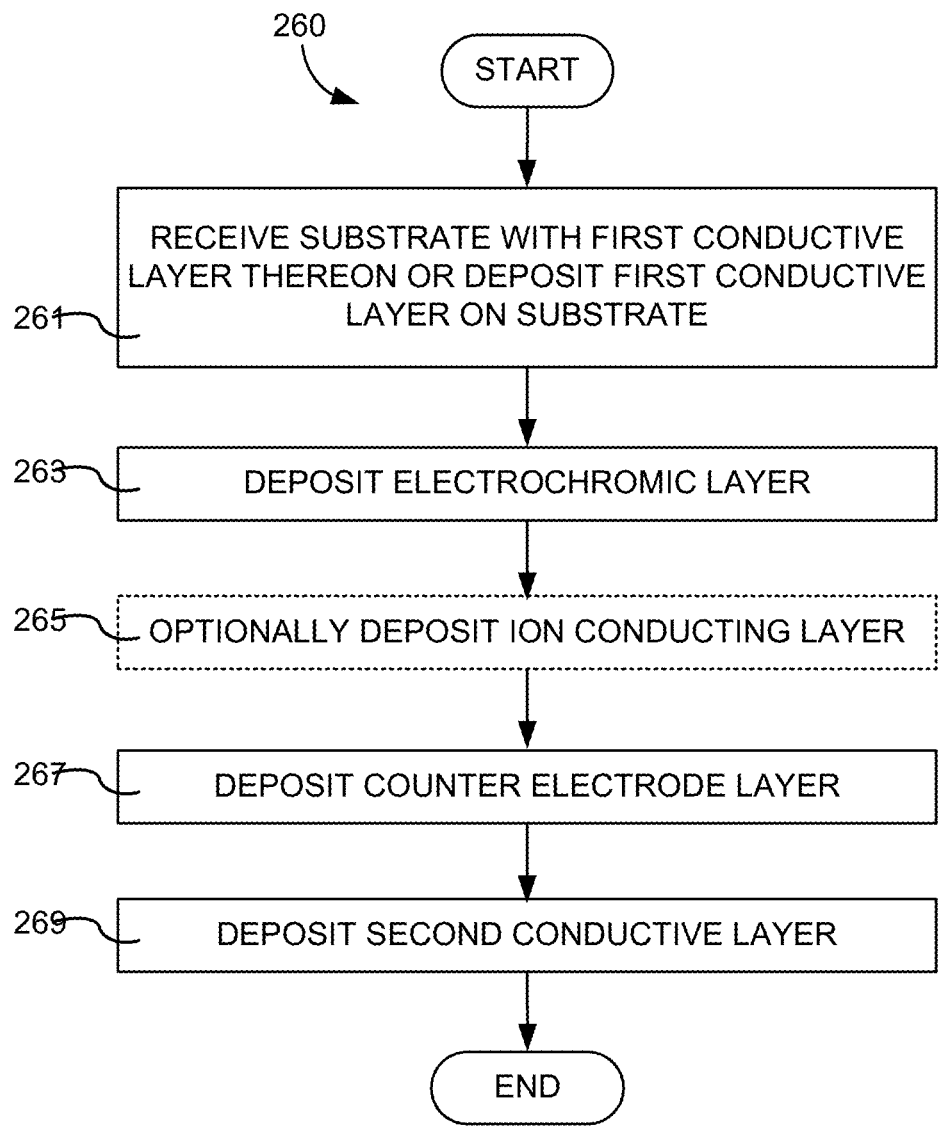
FIG. 2D is a flowchart that describes a method of depositing an electrochromic stack on a substrate.

FIG. 2D provides another flowchart describing a method of fabricating an electrochromic device or precursor according to certain embodiments. The method described in FIG. 2D focuses on the deposition steps. The method 260 begins by either (a) receiving a substrate having a first conductive layer thereon, or (b) depositing the first conductive layer on the substrate, see 261. As mentioned above, in various embodiments the substrate includes the first conductive layer thereon, and there is no need to separately deposit the first conductive layer. In other embodiments, the conductive layer may be deposited prior to deposition of the remaining layers. Deposition of the second conductive layer is discussed further below. In certain embodiments, these details may also apply to the deposition of the first conductive layer.

The method continues with deposition of the electrochromic layer, see 263. In many cases, the electrochromic layer is formed through sputtering. In certain embodiments where the electrochromic layer is homogeneous, the following conditions may be used to deposit the electrochromic layer. The electrochromic layer may be formed by sputtering using one or more metal-containing targets and a sputter gas including between about 40% and about 80% $O_2$ and between about 20% and about 60% Ar. Each target may include one or more metals such as tungsten, titanium, and molybdenum. The substrate upon which the electrochromic layer is deposited may be heated, at least intermittently, to between about 150° C. and about 450° C. (in some cases between about 250° C. and 350° C.) during formation of the electrochromic layer. The electrochromic layer may be deposited to a thickness between about 500 and 600 nm.

In some embodiments where the ion conductor layer is omitted, the electrochromic layer may be deposited as two or more layers or a graded layer. One of the layers or a portion of the graded layer may be oxygen-rich in comparison to the other layer or the remainder of the graded layer. The oxygen-rich portion may be superstoichiometric with respect to oxygen. Typically, the oxygen-rich layer or portion is in contact with the counter electrode layer. In other embodiments, the oxygen rich material at the interface may be supplied in the form of the counter electrode material instead of or in addition to the electrochromic material.

In cases where the electrochromic layer is deposited as two or more layers (one of which is oxygen-rich), the following conditions may be used. In some such cases, the first layer of the electrochromic layer may be between about 350 nm and about 450 nm thick. The first layer may be formed through sputtering using one or more targets and a first sputter gas including between about 40% and about 80% $O_2$ and between about 20% Ar and about 60% Ar. The targets may include one or more metal such as tungsten, titanium, and molybdenum. The second layer may be between about 100 nm and about 200 nm thick. The second layer may be formed through sputtering using one or more targets and a second sputter gas including between about 70% and 100% $O_2$ and between about 0% Ar and about 30% Ar. In this embodiment, heat may be applied, for example by heating substrate, at least intermittently, to between about 150° C. and about 450° C. during deposition of the first electrochromic layer, but not (or substantially not) heating during deposition of the second electrochromic layer. In a more specific embodiment, the first electrochromic layer is about 400 nm thick; the first sputter gas includes between about 50% and about 60% $O_2$ and between about 40% and about 50% Ar; the second electrochromic layer is about 150 nm thick; and the second sputter gas is substantially pure $O_2$. In this embodiment, heat is applied, at least intermittently, to between about 200° C. and about 350° C. during formation of the first electrochromic layer but not (or substantially not) during formation of the second electrochromic layer.

In cases where the electrochromic layer is deposited as a graded layer with a graded oxygen composition, the following conditions may be used to deposit the electrochromic layer. The electrochromic layer may be formed through sputtering using one or more metal-containing targets and a sputter gas, where the sputter gas includes between about 40% and about 80% $O_2$ and between about 20% and about 60% Ar at the start of sputtering the electrochromic layer, and the sputter gas includes between about 70% and 100% $O_2$ and between 0% and about 30% Ar at the end of sputtering the electrochromic layer. The substrate may be heated, at least intermittently, to between about 200° C. and about 350° C. at the beginning of formation of the electrochromic layer, but not heated during deposition of at least a final portion of the electrochromic layer. This description assumes that the electrochromic layer is deposited before the counter electrode layer, as shown in FIG. 2D. In cases where the electrochromic layer is deposited as a graded layer after formation of the counter electrode layer, the details regarding the "initial"/"start" and "final"/"end" portions of the sputtering may be reversed. In either case, the electrochromic material with the higher oxygen concentration may be in contact with the counter electrode layer.

Regardless of the structure of the electrochromic layer, the pressure in the deposition station or chamber during formation of the electrochromic layer may be between about 1 and about 75 mTorr, or between about 5 and about 50 mTorr, or between about 10 and about 20 mTorr. In one embodiment, the power density used to sputter the one or more targets may be between about 2 Watts/cm$^2$ and about 50 Watts/cm$^2$ (determined based on the power applied divided by the surface area of the target); in another embodiment between about 10 Watts/cm$^2$ and about 20 Watts/cm$^2$; and in yet another embodiment between about 15 Watts/cm$^2$ and about 20 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The above conditions may be used in any combination with one another to effect deposition of a high quality electrochromic layer. In one embodiment, the distance between the target (cathode or source) to the substrate surface is between about 35 mm and about 150 mm; in another embodiment between about 45 mm and about 130 mm; and in another embodiment between about 70 mm and about 100 mm. These same distances may apply to other targets used to deposit other layers of the device.

Next, the method continues with the optional deposition of the ion conducting layer, see 263. When present, the ion conducting layer may be provided in a number of different ways. For instance, the ion conductor layer may be formed through sputtering, vapor-based techniques, sol-gel techniques, etc. In many cases, the ion conducting layer is omitted.

Then, the method continues with deposition of the counter electrode layer, see 267. Much like the electrochromic layer, the counter electrode layer may be deposited as a homogenous layer, two or more layers, or a graded layer. In cases where the counter electrode is deposited as two or more layers or a graded layer, one of the layers or a portion of the graded layer may be oxygen-rich in comparison to the other layer or the remaining portion of the graded layer. The oxygen-rich layer or portion may be positioned in direct physical contact with the electrochromic material in the electrochromic layer. In such cases, the deposition conditions may change between depositing the first layer and the second layer, or between depositing the initial portion of the graded layer and the final portion of the graded layer. The oxygen concentrations and substrate temperatures recited above with respect to deposition of an electrochromic layer may also apply to deposition of a counter electrode layer in various embodiments. Generally, the layer or the portion of the graded layer that is oxygen-rich may be formed using a sputter gas having a higher concentration of oxygen and a lower concentration of inert gas compared to the sputter gas used to deposit the other layer or the remaining portion of the graded layer.

In certain implementations, a sputter gas used to form the counter electrode may include between about 30% and about 100% oxygen, in another embodiment between about 80% and about 100% oxygen, in yet another embodiment between about 95% and about 100% oxygen, in another embodiment about 100% oxygen. In one embodiment, the power density used to sputter the CE target is between about 2 Watts/cm$^2$ and about 50 Watts/cm$^2$ (determined based on the power applied divided by the surface area of the target); in another embodiment between about 5 Watts/cm$^2$ and about 20 Watts/cm$^2$; and in yet another embodiment between about 8 Watts/cm$^2$ and about 10 Watts/cm$^2$, in another embodiment about 8 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz. The pressure in the deposition station or chamber, in one embodiment, is between about 1 and about 50 mTorr, in another embodiment between about 20 and about 40 mTorr, in another embodiment between about 25 and about 35 mTorr, in another embodiment about 30 mTorr. In certain embodiments, the counter electrode layer is deposited to a thickness of between about 150 and 350 nm; in yet another embodiment between about 200 and about 250 nm thick.

Next, the method continues with deposition of the second conductive layer, see 269. The recited conditions may be employed to form a thin, low-defect layer of indium tin oxide by sputtering a target containing indium oxide in tin oxide, e.g. with an argon sputter gas with or without oxygen. This is merely one example, and other materials and conditions may be used in other cases. In one embodiment, the thickness of the TCO layer is between about 5 nm and about 10,000 nm, in another embodiment between about 10 nm and about 1,000 nm; in yet another embodiment between about 10 nm and about 500 nm. In one embodiment, the substrate temperature during deposition of the second conducting layer is between about 20° C. and about 300° C., in another embodiment between about 20° C. and about 250° C., and in another embodiment between about 80° C. and about 225° C. In one embodiment, depositing the TCO layer includes sputtering a target including between about 80% (by weight) to about 99% of $In_2O_3$ and between about 1% and about 20% $SnO_2$ using an inert gas, optionally with oxygen. In a more specific embodiment, the target is between about 85% (by weight) to about 97% of $In_2O_3$ and between about 3% and about 15% $SnO_2$. In another embodiment, the target is about 90% of $In_2O_3$ and about 10% $SnO_2$. In one embodiment, the gas composition contains between about 0.1% and about 3% oxygen, in another embodiment between about 0.5% and about 2% oxygen, in yet another embodiment between about 1% and about 1.5% oxygen, in another embodiment about 1.2% oxygen. In one embodiment, the power density used to sputter the TCO target is between about 0.5 Watts/cm$^2$ and about 10 Watts/cm$^2$ (determined based on the power applied divided by the surface area of the target); in another embodiment between about 0.5 Watts/cm$^2$ and about 2 Watts/cm$^2$; and in yet another embodiment between about 0.5 Watts/cm$^2$ and about 1 Watts/cm$^2$, in another embodiment about 0.7 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 50 kHz and about 100 kHz, in yet another embodiment between about 60 kHz and about 90 kHz, in another embodiment about 80 kHz. The pressure in the deposition station or chamber, in one embodiment, is between about 1 and about 10 mTorr, in another embodiment between about 2 and about 5 mTorr, in another embodiment between about 3 and about 4 mTorr, in another embodiment about 3.5 mTorr. In one embodiment, the indium tin oxide layer is between about 20% (atomic) In and about 40% In; between about 2.5% Sn and about 12.5% Sn; and between about 50% O and about 70% O; in another embodiment, between about 25% In and about 35% In; between about 5.5% Sn and about 8.5% Sn; and between about 55% O and about 65% O; and in another embodiment, about 30% In, about 8% Sn; and about 62% O. The above conditions may be used in any combination with one another to effect deposition of a high quality indium tin oxide layer.

When practicing the method of FIG. 2D, one or more of the deposited layers may be lithiated prior to deposition of the next layer. For instance, one or more of the electrochromic layer, the optional ion conducting layer, and the counter electrode layer may be lithiated. In one example, the electrochromic layer is lithiated. In another example, the counter electrode layer is lithiated. In another example, the ion conductor layer is lithiated. In another example, both the electrochromic layer and the counter electrode layer are lithiated. In another example, the electrochromic layer, counter electrode layer, and ion conducting layer are all lithiated. In another example, the electrochromic layer and the ion conductor layer are lithiated. In another example, the counter electrode layer and the ion conducing layer are lithiated. Further, any of these layers may be lithiated during deposition of that layer. In some cases, one portion of a layer may be deposited, then lithiated, and then the remaining portion of that layer may be deposited. In one example, a first portion of the electrochromic layer is deposited, then lithiated, and then a second portion of the electrochromic layer is deposited. In another example, a first portion of the counter electrode layer is deposited, then lithiated, and then a second portion of the counter electrode layer is deposited. These first and second portions of the relevant layer may be deposited according to the same conditions, or different conditions. In some cases, the first and second portions of the relevant layer may have different compositions.

In cases where the ion conducting layer is omitted, lithiation of the electrochromic and/or counter electrode layers may promote formation of an interfacial region between the electrochromic layer and the counter electrode layer, where the interfacial region includes material that is ionically conductive and substantially electronically insulating. For example, in some such embodiments, when the electrochromic and counter electrode materials are abutted and one or both of the materials contain an excess of oxygen (e.g., above stoichiometric levels), the lithium intercalation and subsequent heating allows a chemical change at the interface between the two electrode materials (e.g., between the electrochromic material and the counter electrode material), forming an ionically conductive and electrically insulating material in an interfacial region between the electrochromic layer and the counter electrode layer. For example, the multi-step thermal conditioning as described herein may promote formation of the ionically conductive and electrically insulating material.

The operations shown in FIG. 2D may be used to form an electrochromic device precursor in various embodiments. In order to form an electrochromic device from the electrochromic device precursor, one or more steps may be taken as described above. As mentioned, one technique that may be used to form an electrochromic device from an electrochromic device precursor is multi-step thermal conditioning. The conditioning may involve a series of heating operations including heating the substrate under an inert atmosphere, heating the substrate under oxygen atmosphere, and heating the substrate in air.

In one embodiment, stacks formed as described in FIG. 2D are heated (either before or after depositing the second conductive layer at 269) at between about 150° C. and about 450° C., for between about 10 minutes and about 30 minutes under Ar, and then for between about 1 minute and about 15 minutes under 02. After this processing, the stack is processed further by heating the stack in air at between about 250° C. and about 350° C., for between about 20 minutes and about 40 minutes. In a particular example the stack is processed by heating the stack at about 250° C. for about 15 minutes under inert atmosphere, followed by 5 minutes under 02 atmosphere, then heating the stack in air at about 300° C. for about 30 minutes. Flowing a current between the electrochromic layer and the counter electrode layer as part of an initial activation cycle of the electrochromic device can also be performed.

While FIG. 2D assumes that the electrochromic layer is deposited prior to the counter electrode layer, this is not always the case. In certain implementations, operations 263 and 267 may be reversed such that the counter electrode layer is deposited prior to the electrochromic layer.

III. Apparatus for Fabricating Electrochromic Devices and Precursors

An integrated deposition system may be employed to fabricate electrochromic devices on, for example, architectural glass or other substrates. The electrochromic devices may be used to make insulated glass units (IGUs) which in turn may be used to make electrochromic windows. The term "integrated deposition system" means an apparatus for fabricating electrochromic devices on optically transparent and translucent substrates. The apparatus has multiple stations, each devoted to a particular unit operation such as depositing a particular component (or portion of a component) of an electrochromic device, as well as cleaning, etching, and temperature control of such device or portion thereof. The multiple stations are fully integrated such that a substrate on which an electrochromic device is being fabricated can pass from one station to the next without being exposed to an external environment. Integrated deposition systems operate with a controlled ambient environment inside the system where the process stations are located. A fully integrated system allows for better control of interfacial quality between the layers deposited. Interfacial quality refers to, among other factors, the quality of the adhesion between layers and the lack of contaminants in the interfacial region. The term "controlled ambient environment" means a sealed environment separate from an external environment such as an open atmospheric environment or a clean room. In a controlled ambient environment at least one of pressure and gas composition is controlled independently of the conditions in the external environment. Generally, though not necessarily, a controlled ambient environment has a pressure below atmospheric pressure; e.g., at least a partial vacuum. The conditions in a controlled ambient environment may remain constant during a processing operation or may vary over time. For example, a layer of an electrochromic device may be deposited under vacuum in a controlled ambient environment and at the conclusion of the deposition operation, the environment may be backfilled with purge or reagent gas and the pressure increased to, e.g., atmospheric pressure for processing at another station, and then a vacuum reestablished for the next operation and so forth.

In one embodiment, the system includes a plurality of deposition stations aligned in series and interconnected and operable to pass a substrate from one station to the next without exposing the substrate to an external environment. The plurality of deposition stations comprise (i) a first deposition station containing one or more targets for depositing a cathodically coloring electrochromic layer; (ii) a second optional deposition station containing one or more targets for depositing an ion conducting layer; and (iii) a third deposition station containing one or more targets for depositing a counter electrode layer. The second deposition station may be omitted in certain cases. For instance, the apparatus may not include any target for depositing a separate ion conductor layer. The system also includes a controller containing program instructions for passing the substrate through the plurality of stations in a manner that sequentially deposits on the substrate (i) an electrochromic layer, (ii) an (optional) ion conducting layer, and (iii) a counter electrode layer to form a stack. In cases where the electrochromic layer or counter electrode layer includes two or more layers, the layers may be formed in different stations or in the same station, depending on the desired composition of each layer, among other factors. In one example, a first station may be used to deposit the electrochromic layer, a second station may be used to deposit a first layer of the counter electrode layer, and a third station may be used to deposit a second layer of the counter electrode layer.

In one embodiment, the plurality of deposition stations are operable to pass a substrate from one station to the next without breaking vacuum. In another embodiment, the plurality of deposition stations are configured to deposit the electrochromic layer, the optional ion conducting layer, and the counter electrode layer on an architectural glass substrate. In another embodiment, the integrated deposition system includes a substrate holder and transport mechanism operable to hold the architectural glass substrate in a vertical orientation while in the plurality of deposition stations. In yet another embodiment, the integrated deposition system includes one or more load locks for passing the substrate between an external environment and the integrated deposition system. In another embodiment, the plurality of deposition stations include at least two stations for depositing a layer selected from the group consisting of the electrochromic layer, the ion conducting layer, and the counter electrode layer.

In some embodiments, the integrated deposition system includes one or more lithium deposition stations, each including a lithium containing target. In one embodiment, the integrated deposition system contains two or more lithium deposition stations. In one embodiment, the integrated deposition system has one or more isolation valves for isolating individual process stations from each other during operation. In one embodiment, the one or more lithium deposition stations have isolation valves. In this document, the term "isolation valves" means devices to isolate depositions or other processes being carried out one station from processes at other stations in the integrated deposition system. In one example, isolation valves are physical (solid) isolation valves within the integrated deposition system that engage while the lithium is deposited. Actual physical solid valves may engage to totally or partially isolate (or shield) the lithium deposition from other processes or stations in the integrated deposition system. In another embodiment, the isolation valves may be gas knives or shields, e.g., a partial pressure of argon or other inert gas is passed over areas between the lithium deposition station and other stations to block ion flow to the other stations. In another example, isolation valves may be an evacuated regions between the lithium deposition station and other process stations, so that lithium ions or ions from other stations entering the evacuated region are removed to, e.g., a waste stream rather than contaminating adjoining processes. This is achieved, e.g., via a flow dynamic in the controlled ambient environment via differential pressures in a lithiation station of the integrated deposition system such that the lithium deposition is sufficiently isolated from other processes in the integrated deposition system. Again, isolation valves are not limited to lithium deposition stations.

In some embodiments, the integrated deposition system includes one or more stations for depositing a conductive layer (e.g., a transparent conductive oxide layer, sometimes referred to as TCO). In cases where both the first and second conductive layers are deposited on the substrate, two stations may be provided, each dedicated to depositing one of the conductive layers. In other embodiments, a single station may be used to deposit both conductive layers. In cases where only a single conductive layer is deposited, only a single conductive layer deposition station is needed. For instance, in many cases the substrate is received with the first conductive layer provided thereon, and only the second conductive layer is deposited during fabrication of the electrochromic device.

Figure 3A:
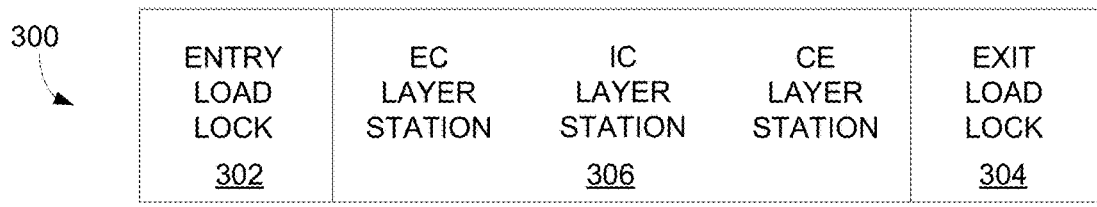
FIG. 3A depicts an integrated deposition system according to certain embodiments.

FIG. 3A depicts in schematic fashion an integrated deposition system 300 in accordance with certain embodiments. In this example, system 300 includes an entry load lock, 302, for introducing the substrate to the system, and an exit load lock, 304, for removal of the substrate from the system. The load locks allow substrates to be introduced and removed from the system without disturbing the controlled ambient environment of the system. Integrated deposition system 300 has a module, 306, with a plurality of deposition stations; an EC layer deposition station, an IC layer deposition station and a CE layer deposition station. In the broadest sense, integrated deposition systems need not have load locks, e.g., module 306 could alone serve as the integrated deposition system. For example, the substrate may be loaded into module 306, the controlled ambient environment established and then the substrate processed through various stations within the system. Individual stations within an integrated deposition systems can contain heaters, coolers, various sputter targets and means to move them, RF and/or DC power sources and power delivery mechanisms, etching tools e.g. plasma etch, gas sources, vacuum sources, glow discharge sources, process parameter monitors and sensors, robotics, power supplies, and the like.

Figure 3B:
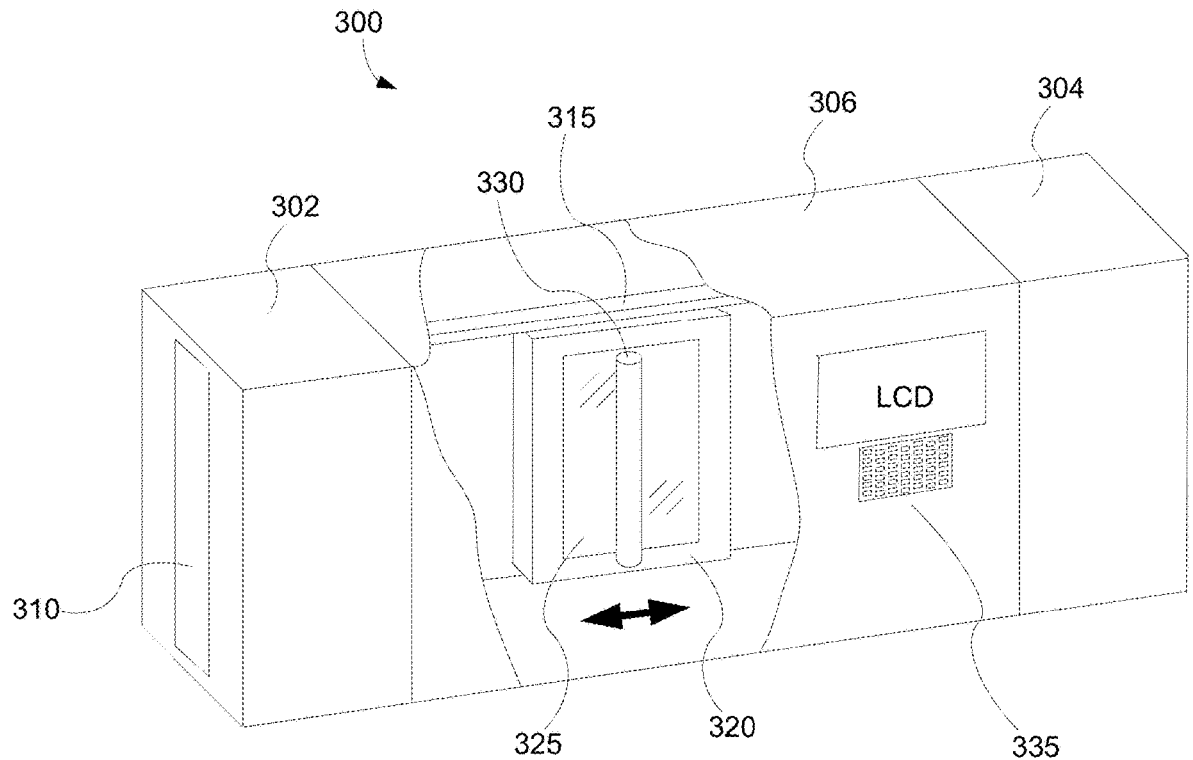
FIG. 3B depicts an integrated deposition system in a perspective view.

FIG. 3B depicts a segment (or simplified version) of integrated deposition system 300 in a perspective view and with more detail including a cutaway view of the interior. In this example, system 300 is modular, where entry load lock 302 and exit load lock 304 are connected to deposition module 306. There is an entry port, 310, for loading, for example, architectural glass substrate 325 (load lock 304 has a corresponding exit port). Substrate 325 is supported by a pallet, 320, which travels along a track, 315. In this example, pallet 320 is supported by track 315 via hanging but pallet 320 could also be supported atop a track located near the bottom of apparatus 300 or a track, e.g. mid-way between top and bottom of apparatus 300. Pallet 320 can translate (as indicated by the double headed arrow) forward and/or backward through system 300. For example during lithium deposition, the substrate may be moved forward and backward in front of a lithium target, 330, making multiple passes in order to achieve a desired lithiation. Pallet 320 and substrate 325 are in a substantially vertical orientation. A substantially vertical orientation is not limiting, but it may help to prevent defects because particulate matter that may be generated, e.g., from agglomeration of atoms from sputtering, will tend to succumb to gravity and therefore not deposit on substrate 325. Also, because architectural glass substrates tend to be large, a vertical orientation of the substrate as it traverses the stations of the integrated deposition system enables coating of thinner glass substrates since there are less concerns over sag that occurs with thicker hot glass.

Target 330, in this case a cylindrical target, is oriented substantially parallel to and in front of the substrate surface where deposition is to take place (for convenience, other sputter means are not depicted here). Substrate 325 can translate past target 330 during deposition and/or target 330 can move in front of substrate 325. The movement path of target 330 is not limited to translation along the path of substrate 325. Target 330 may rotate along an axis through its length, translate along the path of the substrate (forward and/or backward), translate along a path perpendicular to the path of the substrate, move in a circular path in a plane parallel to substrate 325, etc. Target 330 need not be cylindrical, it can be planar or any shape necessary for deposition of the desired layer with the desired properties. Also, there may be more than one target in each deposition station and/or targets may move from station to station depending on the desired process.

Integrated deposition system 300 also has various vacuum pumps, gas inlets, pressure sensors and the like that establish and maintain a controlled ambient environment within the system. These components are not shown, but rather would be appreciated by one of ordinary skill in the art. System 300 is controlled, e.g., via a computer system or other controller, represented in FIG. 3B by an LCD and keyboard, 335. One of ordinary skill in the art would appreciate that embodiments herein may employ various processes involving data stored in or transferred through one or more computer systems. Embodiments also relate to the apparatus, such computers and microcontrollers, for performing these operations. These apparatus and processes may be employed to deposit electrochromic materials of methods herein and apparatus designed to implement them. The control apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

Figure 3C:
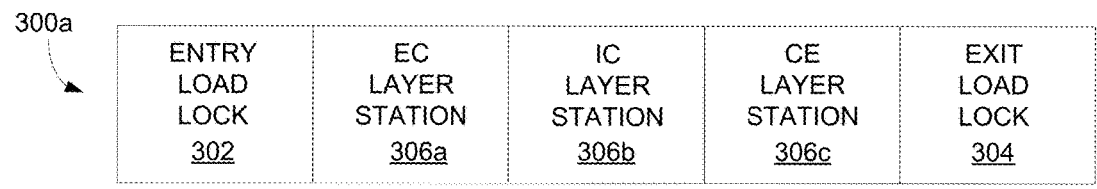
FIG. 3C depicts a modular integrated deposition system.
Figure 3D:
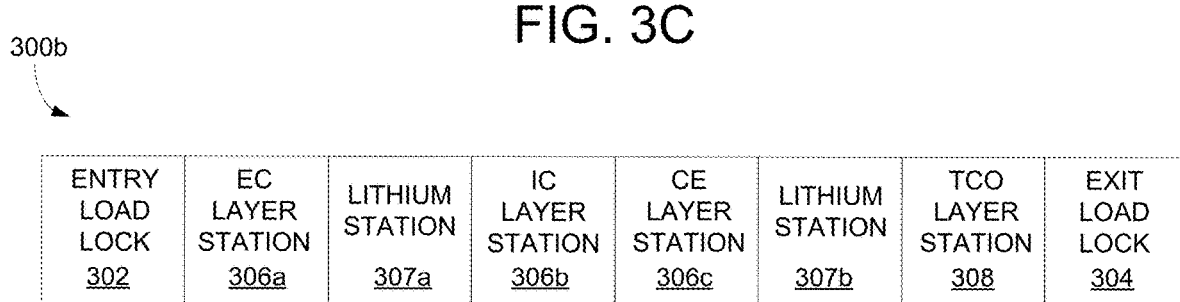
FIG. 3D depicts an integrated deposition system with two lithium deposition stations.
Figure 3E:
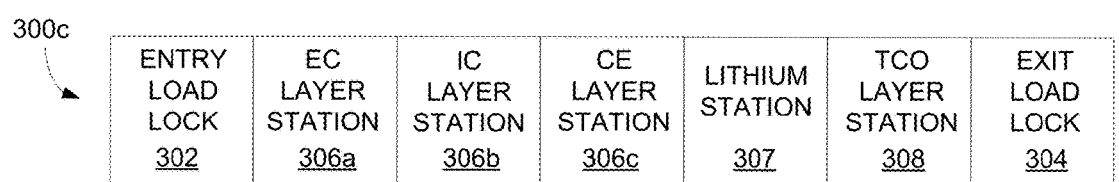
FIG. 3E depicts an integrated deposition system with one lithium deposition station.

As mentioned, the various stations of an integrated deposition system may be modular, but once connected, form a continuous system where a controlled ambient environment is established and maintained in order to process substrates at the various stations within the system. FIG. 3C depicts integrated deposition system 300a, which is like system 300, but in this example each of the stations is modular, specifically, an EC layer station 304a, an IC layer station 304b and a CE layer station 306c. In a similar embodiment, the IC layer station 304b is omitted. Modular form is not necessary, but it is convenient, because depending on the need, an integrated deposition system can be assembled according to custom needs and emerging process advancements. For example, FIG. 3D depicts an integrated deposition system, 300b, with two lithium deposition stations, 307a and 307b. System 300b is, e.g., equipped to carry out methods herein as described above, such as the dual lithiation method. System 300b could also be used to carry out a single lithiation method, for example by only utilizing lithium station 307b during processing of the substrate. But with modular format, e.g., if single lithiation is the desired process, then one of the lithiation stations is redundant and system 300c, as depicted in FIG. 3E can be used. System 300c has only one lithium deposition station, 307.

Systems 300b and 300c also have one or more TCO layer station, 308, for depositing the TCO layer on the EC stack. TCO refers to transparent conductive oxide. With reference to FIG. 1, conductive layers 104 and 114 may be TCO layers. While FIGS. 3D and 3E show only a single TCO layer station 308, it is understood that in cases where the first conductive layer is deposited on the substrate (e.g., rather than the substrate being provided with the first conductive layer thereon), an additional TCO station may be provided, for example between the entry load lock 302 and the EC layer station 306a (or between the entry load lock 302 and the CE layer station 306c in cases where the counter electrode layer is deposited prior to the electrochromic layer). Depending on the process demands, additional stations can be added to the integrated deposition system, e.g., stations for cleaning processes, laser scribes, capping layers, etc.

The sputtering process for forming the layers (e.g., the electrochromic layer or the counter electrode layer) may utilize one or more sputter targets. Where one sputter target is used, the target may include all of the metals that are desired in the deposited layer (e.g., nickel and tungsten for a NiWO layer; nickel, tungsten, and tantalum for a NiWTaO layer; nickel tungsten, and niobium for a NiWNbO layer; nickel, tungsten and tin for a NiWSnO layer; tungsten, titanium, and molybdenum for a WTiMoO layer, etc.). In such cases, the target may be in the form of a metal alloy, intermetallic mixture, a metal oxide material, or a combination thereof. In cases where a metal alloy or intermetallic mixture is employed, the composition of the target reflects the metal ratios described herein, using the variables x and y, without oxygen (z is 0). For example, a metal sputter target may have a composition that is 84% (atomic) tungsten, 10% (atomic) titanium and 6% (atomic) molybdenum (x=0.10 and y=0.06, which corresponds to 93.6% by weight tungsten, 2.9% by weight titanium and 3.5% by weight molybdenum). It is understood that the atomic ratio of the metal target may not translate directly to metal ratio in the sputtered tungsten titanium molybdenum oxide, because the three metals may react with oxygen at different rates, sputter from the target at different rates, and so forth. Where more than one target is used, the targets may have the same composition or different compositions (e.g., with different metals or combinations of metals on each target).

The sputter target may include a grid or other overlapping shapes where different portions of the grid include the different relevant materials (e.g., certain portions of the grid may include elemental metals or alloys of metals that together form the desired composition). For instance, where two targets are used to form a tungsten titanium molybdenum oxide electrochromic layer, each target may include one or more of tungsten, titanium, and molybdenum. In one example the first target includes tungsten and titanium and the second target includes molybdenum. In another example the first target includes tungsten and molybdenum and the second target includes titanium. In another example the first target includes titanium and molybdenum and the second target includes tungsten. In certain embodiments, two targets are used to form a nickel tungsten tantalum oxide counter electrode. In such cases, the first target may include nickel and the second target may include tungsten and tantalum; or the first target may include nickel and tungsten and the second target may include tantalum; or the first target may include nickel and tantalum and the second target may include tungsten. Similar examples are possible with other materials, including but not limited to nickel tungsten tin oxide and nickel tungsten niobium oxide, each of which may be used as a counter electrode material in certain embodiments. In any case where two or more metals are provided together on the same target, the metals may be provided separately (e.g., as elemental metals provided together in a grid or other pattern), as alloys, or a combination thereof.

In some cases, a sputter target may include an alloy of the relevant materials (e.g., two or more of tungsten, titanium, and molybdenum for forming a tungsten titanium molybdenum oxide layer; two or more of nickel, tungsten, and tantalum for forming a nickel tungsten tantalum oxide layer; two or more of nickel, tungsten, and tin for forming a nickel tungsten tin oxide layer; or two or more of nickel, tungsten, and niobium for forming a nickel tungsten niobium oxide layer). Where two or more sputter targets are used, each sputter target may include at least one of the relevant materials (e.g., elemental and/or alloy forms of the relevant metals, any of which can be provided in oxide form). The sputter targets may overlap in some cases. The sputter targets may also rotate in some embodiments. As noted, the electrochromic and counter electrode layers are each typically an oxide material. Oxygen may be provided as a part of the sputter target and/or sputter gas. In certain cases, the sputter targets are substantially pure metals or alloys (e.g., lacking oxygen), and sputtering is done in the presence of oxygen to form the oxide.

In one embodiment, in order to normalize the rate of deposition of the electrochromic or counter electrode layer, multiple targets are used so as to obviate the need for inappropriately high power (or other inappropriate adjustment to desired process conditions) to increase deposition rate.

Figure 4A:
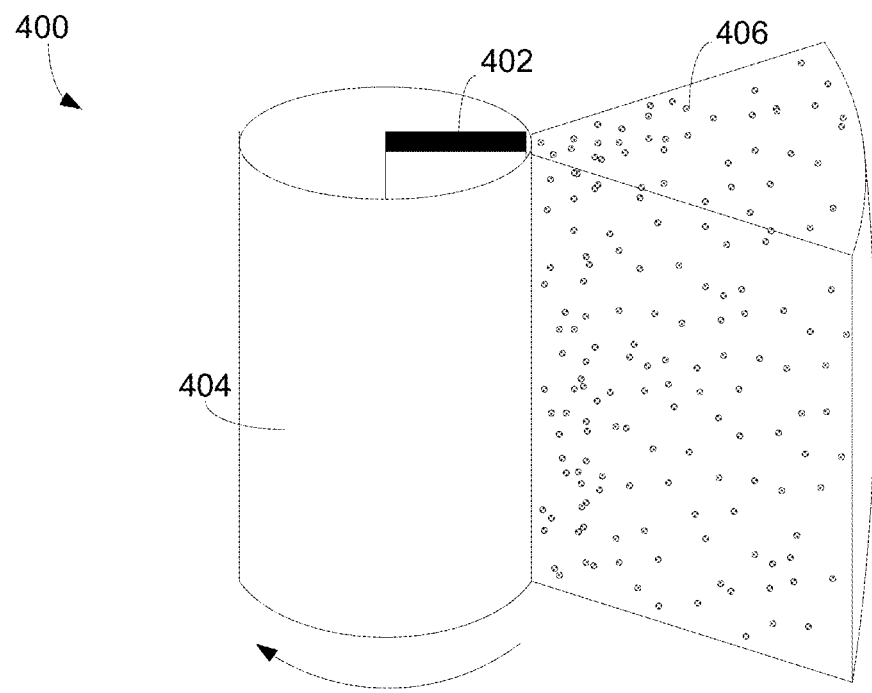
FIG. 4A illustrates a rotating sputter target according to certain embodiments.

As noted, one or more rotating targets may be used in some cases. In various cases, a rotating target may include an interior magnet. FIG. 4A presents a view of a rotating target 400. Inside the rotating target 400 is a magnet 402, which (when the target is supplied with appropriate power) causes material to sputter off of the target surface 404 in a sputter cone 406 (sputter cones are also sometimes referred to as sputter plasmas). The magnet 402 may extend along the length of the sputter target 400. In various embodiments, the magnet 402 may be oriented to extend radially outward such that the resulting sputter cone 406 emanates from the sputter target 400 in a direction normal to the target's surface 404 (the direction being measured along a central axis of the sputter cone 406, which typically corresponds to the average direction of the sputter cone 406). The sputter cone 406 may be v-shaped when viewed from above, and may extend along the height of the target 400 (or the height of the magnet 402 if not the same as the height of the target 400). The magnet 402 inside the rotating target 400 may be fixed (i.e., though the surface 404 of the target 400 rotates, the magnet 402 within the target 400 does not rotate) such that the sputter cone 406 is also fixed. The small circles/dots depicted in the sputter cone 406 represent sputtered material that emanates from the sputter target 400. Rotating targets may be combined with other rotating targets and/or planar targets as desired.

In one example, two rotating targets are used to deposit a tungsten titanium molybdenum oxide electrochromic layer: a first target including tungsten and titanium, and a second target including molybdenum (either or both optionally in oxide form). Other combinations of these metals may be used to produce the same material, as described above. In another example, two rotating targets are used to deposit a nickel tungsten tantalum oxide counter electrode layer: a first target including nickel and tungsten, and a second target including tantalum (either or both optionally in oxide form). Other combinations of these metals may be used to produce the same material, as discussed above. Similarly, these examples can be applied to depositing other desired materials including, but not limited to, nickel tungsten oxide, nickel tungsten niobium oxide, and nickel tungsten tin oxide.

Figure 4B:
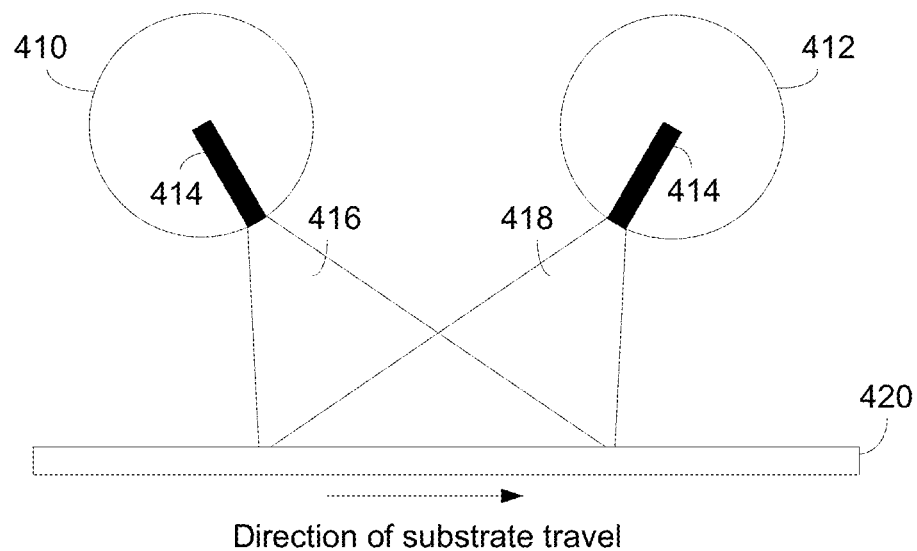
FIG. 4B shows a top-down view of two rotating sputter targets depositing material on a substrate according to certain embodiments.

FIG. 4B presents a top down view of a deposition system for depositing a layer of an electrochromic device in this manner. This example is presented in the context of forming a tungsten titanium molybdenum oxide electrochromic layer using a first target including tungsten and titanium and a second target including molybdenum. However, these techniques may be applied to forming any of the mixed metal oxides described herein, using any combination of targets that provide a desired composition (e.g., a combination of targets that, together, include all of the desired metals for the relevant layer). The first target 410 and the second target 412 each include an interior magnet 414. The magnets 414 are angled toward one another such that the sputter cones 416 and 418 from the first target 410 and second target 412, respectively, overlap. In this way, tungsten and titanium sputtered from the first target 410 mix with the molybdenum sputtered from the second target 412 to form the desired tungsten titanium molybdenum oxide. FIG. 4B also shows a substrate 420 passing in front of the targets 410 and 412. As shown, the sputter cones 416 and 418 closely overlap where they impact the substrate 420. In some embodiments, the sputter cones from various sputter targets may closely overlap with one another (e.g., the non-overlapping area over which only a single sputter cone reaches when depositing on a substrate is less than about 10%, for example less than about 5% of the total area over which either sputter cone reaches). In other embodiments, the sputter cones may diverge from one another to a greater degree such that either or both of the sputter cones has a non-overlapping area that is at least about 10%, for example at least about 20%, or at least about 30%, or at least about 50%, of the total area over which either sputter cone reaches.

In a similar embodiment to the one shown in FIG. 4B, one sputter target is tungsten and molybdenum (separately or as an alloy) and the other target is titanium (either or both targets optionally being in oxide form). Similarly, one sputter target may be tungsten and the other may be a combination (separately or as an alloy) of titanium and molybdenum (either or both target optionally being in oxide form). In a related embodiment, three sputter targets are used to form tungsten titanium molybdenum oxide: a tungsten target, a titanium target, and a nickel target (any of which can optionally be in oxide form). The sputter cones from each of the three targets may overlap by angling the magnets as appropriate. Also, shielding, gratings and/or other additional plasma shaping elements may be used to aid in creating the appropriate plasma mixture to form the desired composition. As mentioned above, these examples can be applied to forming other materials in the electrochromic device, as long as the targets are selected to provide a desired composition.

Table 1 provides various examples of sets of targets that may be used together to form tungsten titanium molybdenum oxide according to certain embodiments. Any of these materials may be provided in oxide form. Where two metals are provided together, they may be provided as elemental metals (e.g., in a grid or other pattern), or they may be provided as an alloy.

TABLE 1

| Composition of First Target | Composition of Second Target | Composition of Third Target |
| --- | --- | --- |
| Tungsten and titanium | Molybdenum | — |
| Tungsten and molybdenum | Titanium | — |
| Tungsten | Molybdenum | Titanium |

Table 2 provides various examples of sets of targets that may be used together to form nickel tungsten tantalum oxide according to certain embodiments. Any of these materials may be provided in oxide form. Where two metals are provided together, they may be provided as elemental metals (e.g., in a grid or other pattern), or they may be provided as an alloy.

TABLE 2

| Composition of First Target | Composition of Second Target | Composition of Third Target |
| --- | --- | --- |
| Nickel and tungsten | Tantalum | — |
| Nickel and tantalum | Tungsten | — |
| Nickel | Tantalum | Tungsten |

Table 3 provides various examples of sets of targets that may be used together to form nickel tungsten niobium oxide according to certain embodiments. Any of these materials may be provided in oxide form. Where two metals are provided together, they may be provided as elemental metals (e.g., in a grid or other pattern), or they may be provided as an alloy.

TABLE 3

| Composition of First Target | Composition of Second Target | Composition of Third Target |
| --- | --- | --- |
| Nickel and tungsten | Niobium | — |
| Nickel and niobium | Tungsten | — |
| Nickel | Niobium | Tungsten |

Table 4 provides various examples of sets of targets that may be used together to form nickel tungsten tin oxide according to certain embodiments. Any of these materials may be provided in oxide form. Where two metals are provided together, they may be provided as elemental metals (e.g., in a grid or other pattern), or they may be provided as an alloy.

TABLE 4

| Composition of First Target | Composition of Second Target | Composition of Third Target |
| --- | --- | --- |
| Nickel and tungsten | Tin | — |
| Nickel and tin | Tungsten | — |
| Nickel | Tin | Tungsten |

Tables 1-4 describe various examples related to formation of tungsten titanium molybdenum oxide, nickel tungsten tantalum oxide, nickel tungsten niobium oxide, and nickel tungsten tin oxide. These are merely examples, and are not intended to be limiting. In other examples, different electrochromic and/or counter electrode materials may be used.

Various sputter target designs, orientations, and implementations are further discussed in U.S. Pat. No. 9,261,751, which is herein incorporated by reference in its entirety.

The density and orientation/shape of material that sputters off of a sputter target depends on various factors including, for example, the magnetic field shape and strength, pressure, and power density used to generate the sputter plasma. The distance between adjacent targets, as well as the distance between each target and substrate, can also affect how the sputter plasmas will mix and how the resulting material is deposited on the substrate.

In certain embodiments, two different types of sputter targets are provided to deposit a single layer in an electrochromic stack: (a) primary sputter targets, which sputter material onto a substrate, and (b) secondary sputter targets, which sputter material onto the primary sputter targets. The primary and secondary sputter targets may include any combination of metal, metal alloys, and metal oxides that achieve a desired composition in a deposited layer (including, but not limited to, any of the combinations described in Tables 1-4, with the "first target" listed in the tables corresponding to either the primary target or the secondary target). In one particular example where the targets are used to form tungsten titanium molybdenum oxide, a primary sputter target includes an alloy of tungsten and titanium, and a secondary sputter target includes molybdenum. In a similar example a primary sputter target includes titanium and a secondary sputter target includes an alloy of molybdenum and tungsten. These sputter targets may be used together to deposit an electrochromic layer comprising tungsten titanium molybdenum oxide. Other combinations of elemental metals and alloys can also be used, as desired.

Figure 5A:
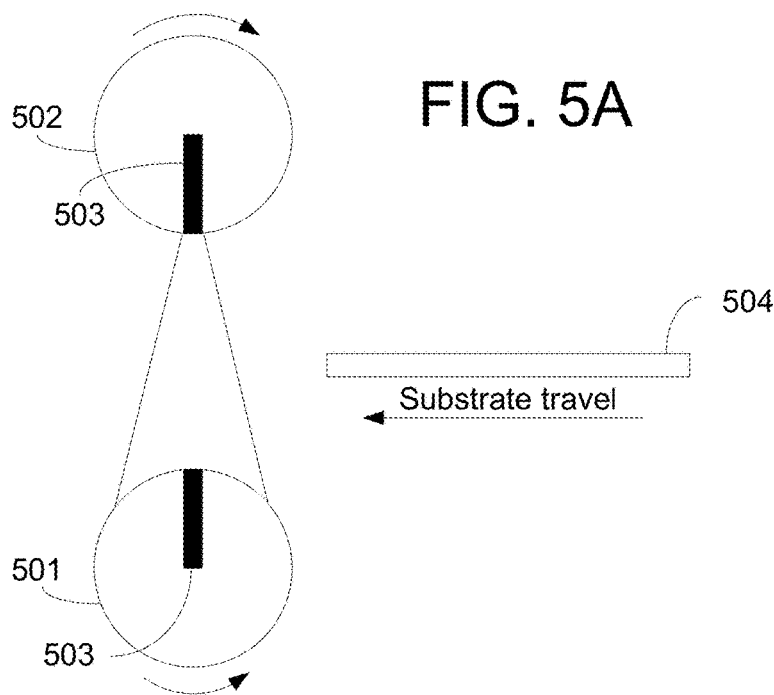
FIGS. 5A-5C relate to embodiments where a secondary sputter target is used to deposit material onto a primary sputter target, which then deposits on a substrate according to certain embodiments.
Figure 5B:
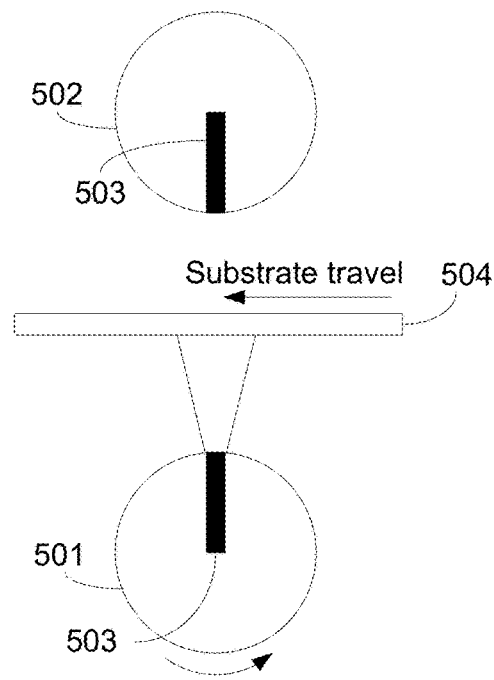

A number of different setups are possible when using both primary and secondary sputter targets. FIGS. 5A and 5B presents top-down views of one embodiment of a deposition station for depositing a layer of the electrochromic device (e.g., the electrochromic layer and/or counter electrode layer). The sputter target configurations discussed herein may be used to deposit any material in the electrochromic stack, provided that the targets are of appropriate compositions to deposit the desired material in the stack. A primary sputter target 501 and a secondary sputter target 502 are provided, each with an internal magnet 503. Each sputter target in this example is a rotating sputter target, though planar or other shaped targets may be used as well. The targets may rotate in the same direction or in opposite directions. The secondary sputter target 502 sputters material onto the primary sputter target 501 when no substrate 504 is present between the two targets, as shown in FIG. 5A. This deposits material from the secondary sputter target 502 onto the primary sputter target 501. Then, as the substrate 504 moves into position between the two targets, sputtering from the secondary sputter target 502 ceases and sputtering from the primary sputter target 501 onto the substrate 504 begins, as shown in FIG. 5B.

When material is sputtered off of the primary sputter target 501 and deposited onto the substrate 504, the deposited material includes material that originated from both the primary and secondary sputter targets 501 and 502, respectively. In effect, this method involves in-situ formation of an intermixed sputter target surface on the primary sputter target 501. One advantage of this method is that a fresh coating of material from the secondary sputter target 502 is periodically deposited on the surface of the primary sputter target 501. The intermixed materials are then delivered together to the substrate 504.

Figure 5C:
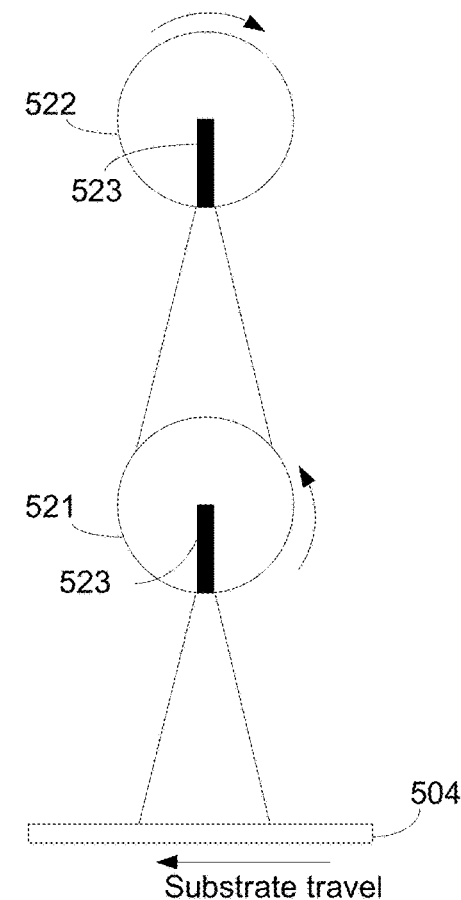

In a related embodiment shown in FIG. 5C, a secondary sputter target 522 is positioned behind a primary sputter target 521, and a substrate 504 passes in front of the primary sputter target 521 such that it does not block the line of sight between the two targets 521 and 522. Each of the sputter targets may include a magnet 523. In this embodiment, there is no need to periodically stop sputtering from the secondary sputter target 521 onto the primary sputter target 522. Instead, such sputtering can occur continuously. Where the primary sputter target 521 is located in between the substrate 504 and the secondary sputter target 522 (e.g., there is no line of sight between the secondary sputter target 522 and the substrate 504), the primary sputter target 521 should rotate such that material that is deposited onto the primary sputter target 521 can be sputtered onto the substrate 504. There is more flexibility in the design of the secondary sputter target 522. In a related embodiment, the secondary sputter target may be a planar or other non-rotating target. Where two rotating targets are used, the targets may rotate in the same direction or in opposite directions.

In similar embodiments, the secondary sputter target (e.g., the secondary target in FIGS. 5A-5C) may be replaced with another secondary material source. The secondary material source may provide material to the primary sputter target through means other than sputtering. In one example, the secondary material source provides evaporated material to the primary sputter target. The evaporated material may be any component of a layer being deposited. In various examples the evaporated material is an elemental metal or metal oxide. Particular examples of evaporated material include nickel, tungsten, tantalum, niobium, tin, titanium, and molybdenum, which may be used to form various materials described herein. In one embodiment, elemental molybdenum is evaporated onto a primary sputter target including a mixture and/or alloy of tungsten and titanium to form tungsten titanium molybdenum oxide. In another embodiment, elemental tantalum is evaporated onto a primary sputter target including a mixture and/or alloy of nickel and tungsten to form nickel tungsten tantalum oxide. Where a secondary material source provides evaporated material, the secondary material source may be provided at any location relative to the primary sputter target and substrate. In some embodiments the secondary material source is provided such that it is behind and deposits primarily on the primary sputter target, much like the setup shown in FIG. 5C.

Where both a primary and a secondary sputter target are used, the secondary sputter target may be operated at a potential that is cathodic compared to the potential of the primary sputter target (which is already cathodic). Alternatively, the targets may be operated independently. Still further, regardless of relative target potentials, neutral species ejected from the secondary target will deposit on the primary target. Neutral atoms will be part of the flux, and they will deposit on a cathodic primary target regardless of relative potentials.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

Unless otherwise defined for a particular parameter, the terms "about" and "approximately" as used herein are intended to mean±10% with respect to a relevant value.

What is claimed is:

1. An integrated deposition system for fabricating an electrochromic stack, the integrated deposition system comprising:
   a plurality of deposition stations aligned in series and interconnected and operable to pass a substrate from one station to the next without exposing the substrate to an external environment,
   wherein the plurality of deposition stations comprise
   a first deposition station containing a first one or more material sources for depositing an electrochromic layer comprising an electrochromic material comprising tungsten titanium molybdenum oxide having the composition $W_{1-x-y}Ti_xMo_yO_z$, where x is between about 0.05-0.25, y is between about 0.01-0.15, and z is between about 3.5-4.5, the electrochromic layer having a thickness between about 200-700 nm;
   a second deposition station containing a second one or more material sources for depositing a counter electrode layer comprising nickel tungsten oxide, the counter electrode layer having a thickness between about 100-400 nm; and a controller containing program instructions for passing the substrate through the plurality of deposition stations in a manner that deposits on the substrate
(i) the electrochromic layer, and
(ii) the counter electrode layer to form a stack comprising at least the electrochromic layer and the counter electrode layer, wherein the controller further contains program instructions for forming the stack without a homogenous layer of ion conducting, electronically insulating material between the electrochromic layer and the counter electrode layer.

2. The integrated deposition system of claim 1, wherein the plurality of deposition stations comprise a third deposition station containing a third one or more material sources for depositing a first electrically conductive layer having a thickness between about 10-500 nm.

3. The integrated deposition system of claim 2, wherein the plurality of deposition stations comprise a fourth deposition station containing a third one or more material sources for depositing a second electrically conductive layer having a thickness between about 100-400 nm.

4. The integrated deposition system of claim 1, wherein at least one of the second one or more material sources for depositing the counter electrode layer comprise an elemental metal selected from the group consisting of: nickel, tungsten, and tantalum.

5. The integrated deposition system of claim 1, wherein at least one of the second one or more material sources for depositing the counter electrode layer comprise an elemental metal selected from the group consisting of: nickel, tungsten, and niobium.

6. The integrated deposition system of claim 1, wherein at least one of the second one or more material sources for depositing the counter electrode layer comprise an elemental metal selected from the group consisting of: nickel, tungsten, and tin.

7. The integrated deposition system of claim 1, wherein at least one of the second one or more material sources for depositing the counter electrode layer comprise an oxide.

8. The integrated deposition system of claim 1, wherein the controller further contains program instructions for depositing the electrochromic layer an counter electrode layer in a stack such that the electrochromic layer is in physical contact with the counter electrode layer.

9. The integrated deposition system of claim 1, wherein at least one of the electrochromic layer and the counter electrode layer comprise two or more layers or portions, and wherein one of the layers or portions is superstoichiometric with respect to oxygen.

10. The integrated deposition system of claim 9, wherein either:
(a) the electrochromic layer comprises the two or more layers, the layer that is superstoichiometric with respect to oxygen being in contact with the counter electrode layer, or
(b) the counter electrode layer comprises the two or more layers, the layer that is superstoichiometric with respect to oxygen being in contact with the electrochromic layer.

11. The integrated deposition system of claim 9, wherein either:
(a) the electrochromic layer comprises the two or more layers or portions, the two or more layers or portions together forming the electrochromic layer as a graded layer, the layer or portion of the electrochromic layer that is superstoichiometric with respect to oxygen being in contact with the counter electrode layer, or
(b) the counter electrode layer comprises the two or more layers or portions, the two or more layers or portions together forming the counter electrode layer as a graded layer, the layer or portion of the counter electrode layer that is superstoichiometric with respect to oxygen being in contact with the electrochromic layer.

12. The integrated deposition system of claim 1, further comprising a fifth deposition station containing a fifth one or more material sources for depositing an ion conducting and substantially electronically insulating layer that is formed in situ at an interface between the electrochromic layer and the counter electrode layer.

13. The integrated deposition system of claim 12, wherein the ion conducting and substantially electronically insulating layer comprises a material selected from the group consisting of: lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and combinations thereof.

14. The integrated deposition system of claim 12, wherein the ion conducting and substantially electronically insulating layer has a thickness between about 5-100 nm.

15. The integrated deposition system of claim 12, wherein the ion conducting and substantially electronically insulating layer comprises a material selected from the group consisting of: lithium silicate, lithium aluminum silicate, lithium zirconium silicate, lithium borosilicate, lithium phosphosilicate, lithium phosphorus oxynitride (LiPON), lithium silicon carbon oxynitride (LiSiCON), and combinations thereof.

16. The integrated deposition system of claim 3, wherein the substrate is positioned in a vertical orientation during formation of at least one of the electrochromic layer, the counter electrode layer, and the second electrically conductive layer in at least one of the plurality of deposition stations.

17. The integrated deposition system of claim 1, wherein the electrochromic layer comprises a single graded layer, and wherein the controller further contains the program instructions for varying oxygen concentrations in the single graded layer.

* * * * *